(12) United States Patent
Choi et al.

(10) Patent No.: US 8,139,432 B2
(45) Date of Patent: Mar. 20, 2012

(54) VARIABLE RESISTANCE MEMORY DEVICE AND SYSTEM THEREOF

(75) Inventors: Byung-gil Choi, Yongin-si (KR);
Beak-hyung Cho, Hwaseong-si (KR);
Jun-Soo Bae, Hwaseong-si (KR);
Kwang-Jin Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/901,168

(22) Filed: Oct. 8, 2010

(65) Prior Publication Data

US 2011/0026303 A1 Feb. 3, 2011

Related U.S. Application Data

(63) Continuation-in-part of application No. 12/003,442, filed on Dec. 26, 2007, now Pat. No. 7,821,865.

(30) Foreign Application Priority Data

Dec. 27, 2006 (KR) .................. 10-2006-0135587

(51) Int. Cl.
*G11C 7/04* (2006.01)
(52) U.S. Cl. ........................... 365/211; 365/163
(58) Field of Classification Search .................. 365/136, 365/211, 222
See application file for complete search history.

(56) References Cited

U.S. PATENT DOCUMENTS

| | | | |
|---|---|---|---|
| 6,982,913 B2 | 1/2006 | Oh et al. | |
| 7,215,592 B2 | 5/2007 | Cho et al. | |
| 7,245,605 B2 | 7/2007 | Benveniste | |
| 7,248,526 B2 * | 7/2007 | Ito et al. | 365/222 |
| 2003/0103398 A1 | 6/2003 | Van Tran | |
| 2005/0185445 A1 | 8/2005 | Osada et al. | |
| 2005/0243628 A1 | 11/2005 | Kasai et al. | |
| 2006/0034141 A1 | 2/2006 | Iioka et al. | |
| 2007/0236987 A1 | 10/2007 | Cho et al. | |
| 2008/0123389 A1 | 5/2008 | Cho et al. | |
| 2008/0168304 A1 | 7/2008 | Flynn et al. | |
| 2008/0256183 A1 | 10/2008 | Flynn et al. | |
| 2008/0256292 A1 | 10/2008 | Flynn et al. | |
| 2010/0027326 A1 | 2/2010 | Kim et al. | |

FOREIGN PATENT DOCUMENTS

| | | |
|---|---|---|
| JP | 11-110964 | 4/1999 |
| JP | 2004-164766 | 6/2004 |
| JP | 2006-4479 | 1/2006 |
| JP | 2006-19009 | 1/2006 |
| JP | 2006-79756 | 3/2006 |
| KR | 10-2006-0047467 | 5/2006 |

* cited by examiner

*Primary Examiner* — Jason Lappas
(74) *Attorney, Agent, or Firm* — Harness, Dickey & Pierce

(57) ABSTRACT

A nonvolatile memory device comprising: a plurality of memory banks, each of which operates independently and includes a plurality of resistance memory cells, each cell including a variable resistive element having a resistance varying depending on stored data; a plurality of global bit lines, each global bit line being shared by the plurality of memory banks; a temperature compensation circuit including one or more reference cells; and a data read circuit which is electrically connected to the plurality of global bit lines and performs a read operation by supplying at least one of the resistance memory cells with a current varying according to resistances of the reference cells.

19 Claims, 49 Drawing Sheets

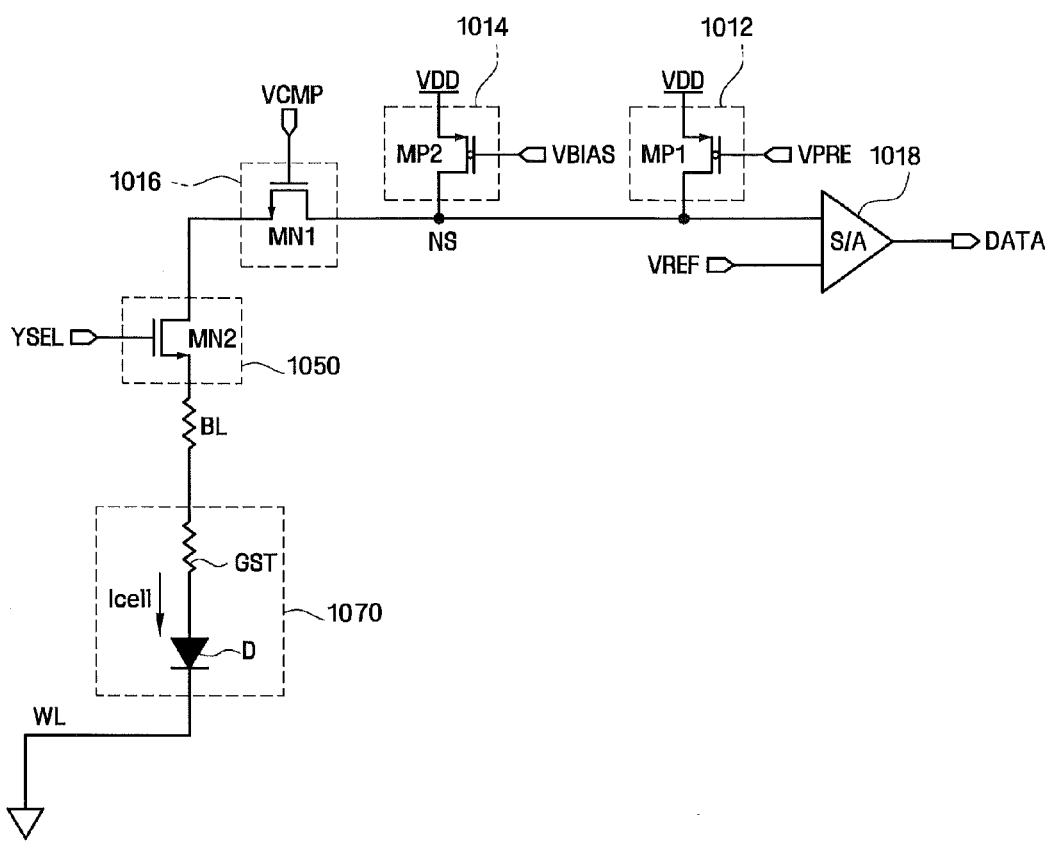

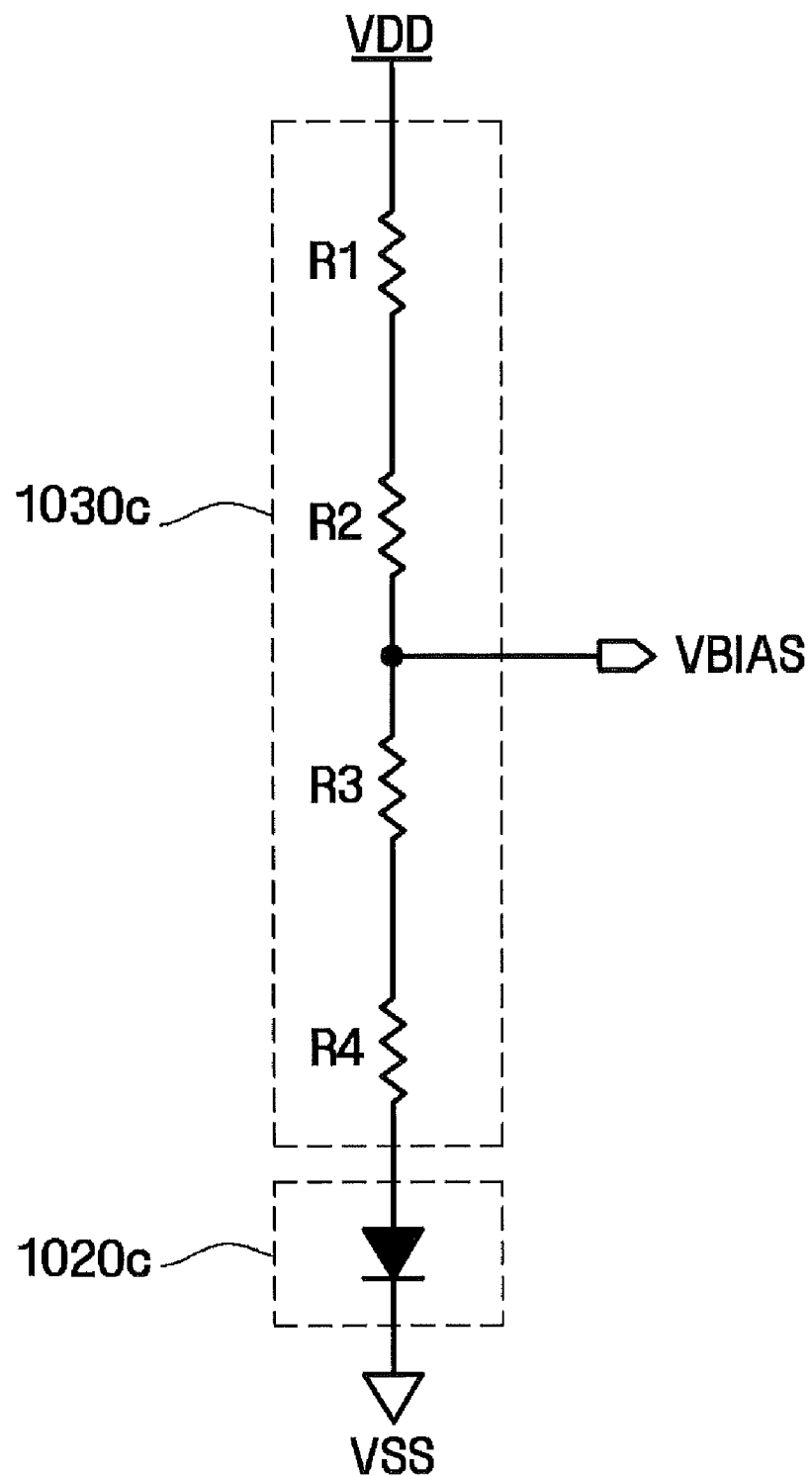

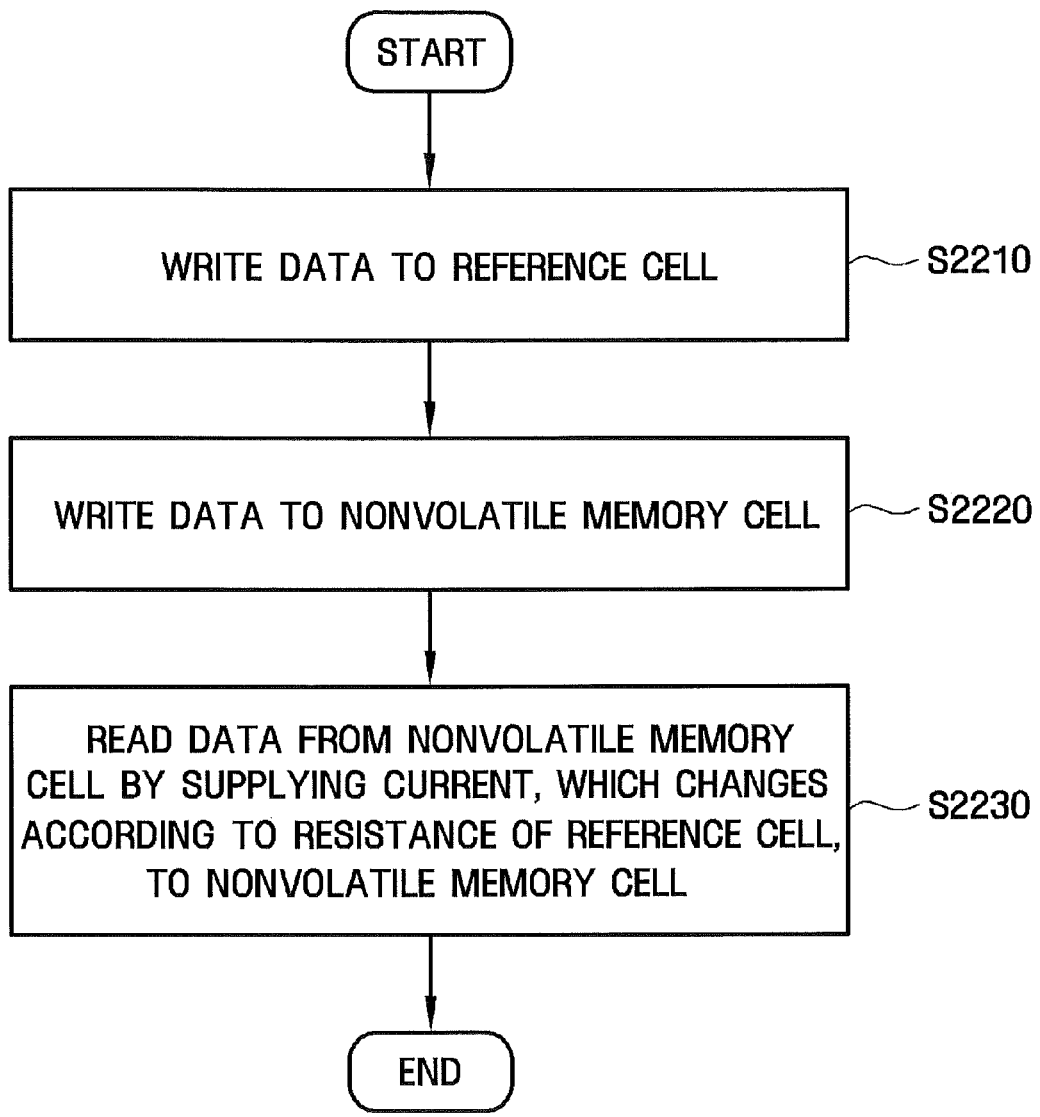

VARIABLE RESISTANCE MEMORY DEVICE AND SYSTEM THEREOF

PRIORITY STATEMENT

This application is a continuation-in-part application of U.S. application Ser. No. 12/003,442, filed Dec. 26, 2007 now U.S. Pat. No. 7,821,865, which claims priority from Korean Patent Application No. 10-2006-0135587 filed on Dec. 27, 2006 in the Korean Intellectual Property Office, the disclosure of which is incorporated herein by reference in its entirety.

BACKGROUND OF THE INVENTION

1. Field

Example embodiments of the present invention relate to a nonvolatile memory device using variable resistive elements.

2. Description of the Related Art

Nonvolatile semiconductor memory devices using a resistance material are classified as NOR flash memory devices, NAND flash memory devices, phase change random access memory (PRAM) devices, and others. Whereas, dynamic random access memory (DRAM) devices or flash memory devices write data using charges, phase-change random access memories (PRAMs) store data using a phase-change material, e.g., a chalcogenide alloy, which goes into a crystalline state or an amorphous state due to a change in temperature by cooling followed by heating.

In other words, since the resistance of a phase-change material in the more crystalline state is low and the resistance of an amorphous phase-change material is high, the crystalline state is referred to as a set or "0" state and the amorphous state is referred to as a reset or "1" state. PRAM devices write data by using joule heat, which is generated by applying a set pulse or a reset pulse to a phase change material. In detail, data is written to a PRAM cell either by heating a phase change material of the PRAM cell to higher than its melting point using a reset pulse, and quickly cooling down the phase change material so that the state of the phase change material is changed into an amorphous state, or by heating the phase change material to lower than its crystallization point, maintaining the resulting temperature for a predetermined amount of time, and cooling down the phase change material so that the state of the phase change material is changed into a crystalline phase.

FIGS. 1 and 2 are circuit diagrams for explaining the arrangement of a conventional nonvolatile memory device. For explanatory convenience, FIGS. 1 and 2 show that the conventional nonvolatile memory device includes eight memory banks, but it may contain a different number of memory banks.

Referring to FIG. 1, the conventional nonvolatile memory device includes a plurality of memory banks 10_1 through 10_8, global column select circuits 30_1 through 30_8, global sense amplifier (amp) circuits 40_1 through 40_8, and/or global write driver circuits 50_1 through 50_8. A nonvolatile memory device with higher capacity and higher integration density can be implemented using a hierarchical bit line structure in which a plurality of local bit lines are connected to each of the global bit lines and a hierarchical word line structure in which a plurality of sub word lines are coupled to each of main word lines. As illustrated in FIG. 1, a global bit line GBL is arranged corresponding to each of the plurality of memory banks 10_1 through 10_8. A main word line direction is arranged corresponding to the plurality of memory banks 10_1 through 10_8.

When the global bit line GBL is arranged corresponding to each of the plurality of memory banks 10_1 through 10_8, the conventional nonvolatile memory device has a core architecture as illustrated in FIG. 2. Referring to FIG. 2, a plurality of main word line decoders 20_1 through 20_8 and a plurality of redundancy memory cell arrays 12_1 through 12_8 are arranged corresponding to the plurality of memory banks 10_1 through 10_8.

The conventional nonvolatile memory device having the core architecture illustrated in FIG. 2 requires a considerable increase in the number of sense amps within the global sense amp circuits 40_1 through 40_8 depending on the number of words being pre-fetched during a synchronous burst read operation. For example, if the number of words to be read and pre-fetched from one memory bank (e.g., 10_1) is 4, the number of sense amps needed within one global sense amp circuit (e.g., 40_1) is 64 (1 word (16 bits).times.4). Thus, 512 (64.times.8) sense amps are needed within the 8 global sense amp circuits 40_1 through 40_8. If 8 words are pre-fetched from one memory bank, 1,024 sense amps are needed. If 16 words are pre-fetched from one memory bank, 2,048 sense amps are needed. That is, as the number of words to be pre-fetched increases, the area of the core architecture increases.

It is also difficult to write a large number of bits of data within one memory bank (e.g., 10_1) during a test operation. Assuming that the reset current flowing through one nonvolatile memory cell is about 1 mA when reset data is written to one nonvolatile memory cell, a reset current of about 16 mA may be required to write 16-bits of data into the memory bank 10_1 at a time. That is, because an excessively high level of reset current flows within the memory bank 10_1 (the narrow space), a large number of bits of data are difficult to write at a time. Thus, a large amount of test time is required because a small number of bits of data should be written at a time during a test operation Still further, the area of the core architecture increases because the plurality of main word line decoders 20_1 through 20_8 are arranged corresponding to the plurality of memory banks 10_1 through 10_8. The area of the core architecture can be further increased because the plurality of redundancy memory cell arrays 12_1 through 12_8 are arranged corresponding to the plurality of memory banks 10_1 through 10_8 because nonvolatile memory cells in the memory banks 10_1 through 10_8 and redundancy memory cells within the redundancy memory cell arrays 12_1 through 12_8 share the same word line WL.

SUMMARY

The present invention relates to a nonvolatile memory device and a method of forming the same.

The nonvolatile memory device includes a plurality of memory banks, each of which operates independently and includes resistance memory cells. Each cell includes a variable resistive element having a resistance varying depending on stored data. A plurality of global bit lines are included, and each global bit line is shared by the plurality of memory banks. A temperature compensation circuit including one or more reference cells is included. A data read circuit which is electrically connected to the plurality of global bit lines and performs a read operation by supplying at least one of the resistance memory cells with a current varying according to resistances of the reference cells is included.

BRIEF DESCRIPTION OF THE DRAWINGS

The above and other features and advantages of the present invention will become more apparent by describing in detail example embodiments thereof with reference to the attached drawings in which:

FIG. 9A through 9K is diagrams of the phase-change random access memory device according to the embodiments of the present invention.

FIG. 26B is a flowchart illustrating a method of driving the nonvolatile memory devices according to the fifth and seventh embodiments of the present invention.

DETAILED DESCRIPTION OF THE INVENTION

Figure 1:
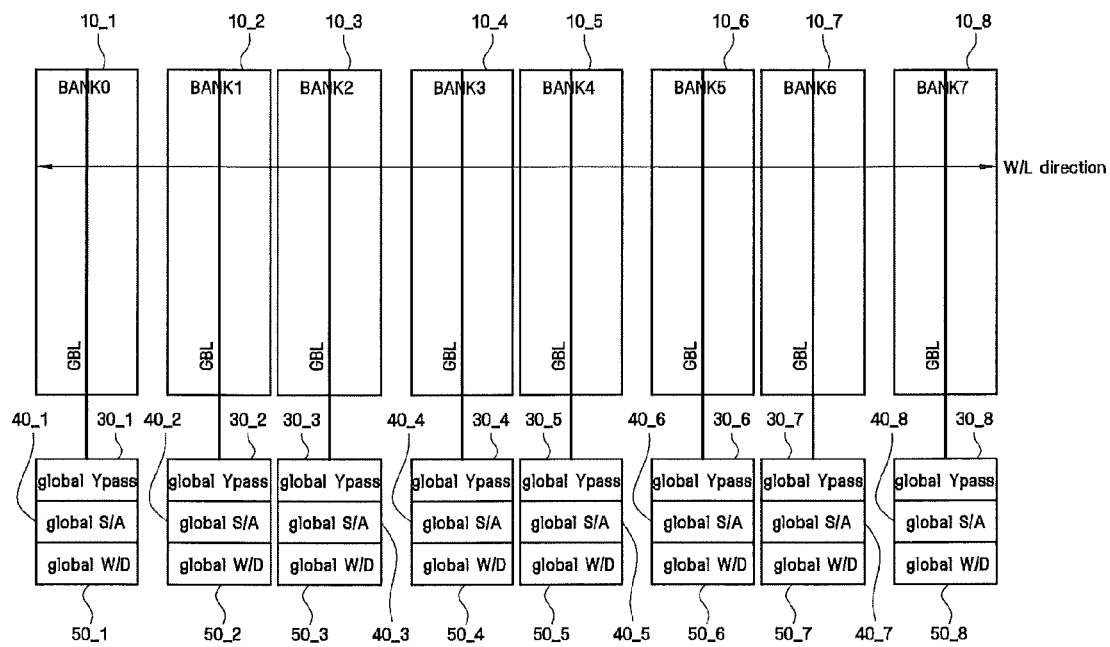
FIGS. 1 and 2 are circuit diagrams for explaining the arrangement of a conventional nonvolatile memory device.
Figure 2:
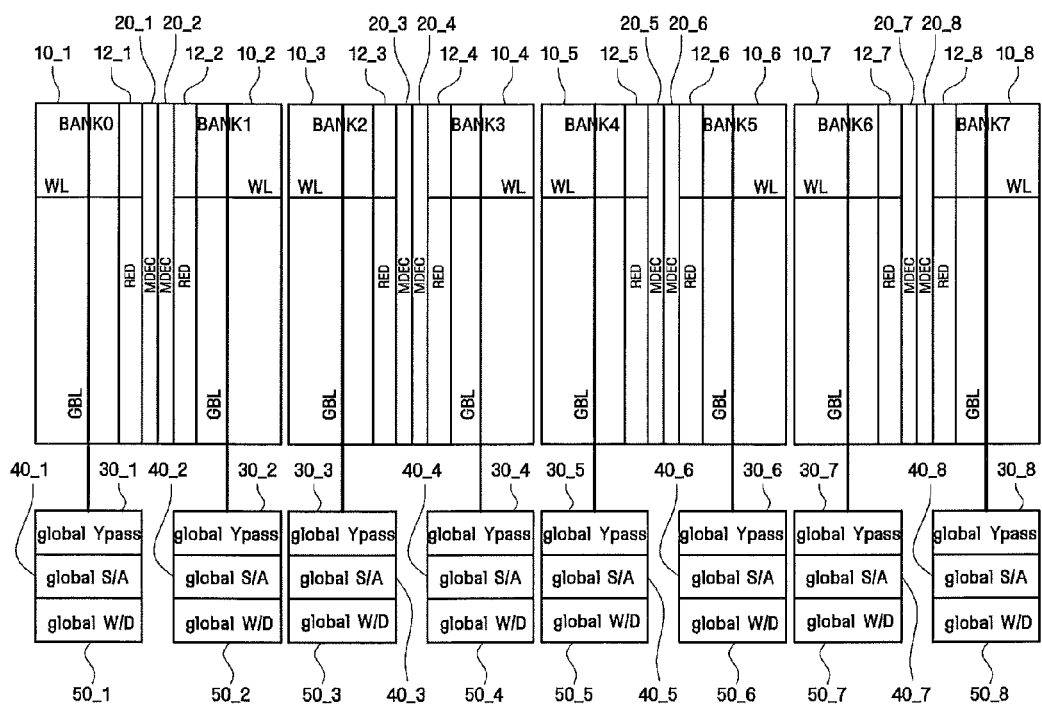

Advantages and features of the present invention and methods of accomplishing the same may be understood more readily by reference to the following detailed description of example embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

It will be understood that when an element or layer, is referred to as being "connected to" or "coupled to" another element, it can be directly connected or coupled to the other element or layer, or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

Although example embodiments will be described below in different sections or separately on an embodiment-by-embodiment basis, the descriptions are not irrelevant to each other unless otherwise specified. They are, in whole or in part, variations of each other and sometimes one description is a detailed or supplementary form of another. In the example embodiments described below, even when a specific numerical figure (quantity, numerical value, amount, range, etc.) is indicated for an element, it is not limited to the indicated specific numerical figure unless otherwise specified or theoretically limited to the specific numerical figure; it should be understood that it may be larger or smaller than the specific numerical figure. In the embodiments described below, elements (including element steps) are not always essential unless otherwise specified or clearly considered essential. Likewise, when a shape or position of an element is indicated in the embodiments described below, it is considered that a shape or position which is virtually equal or similar to it is also included, unless otherwise specified or clearly considered not so. This holds true of numerical figures and ranges as mentioned above. In all the drawings that illustrate example embodiments, elements with like functions are designated by like reference numerals; and descriptions of these elements are not repeated.

It will be understood that, although the terms first, second, and others may be used herein to describe various elements, these elements should not be limited by these terms. These terms are only used to distinguish one element from another element. Thus, a first element discussed below could be termed a second element without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Hereinafter, exemplary embodiments of the present invention will be described with regard to a PRAM. However, it will be apparent to those skilled in the art that the invention can also be applied to nonvolatile semiconductor memory devices using a resistance material such as a phase-change RAM (PRAM), a magnetic RAM (MRAM), or the like.

Figure 3:
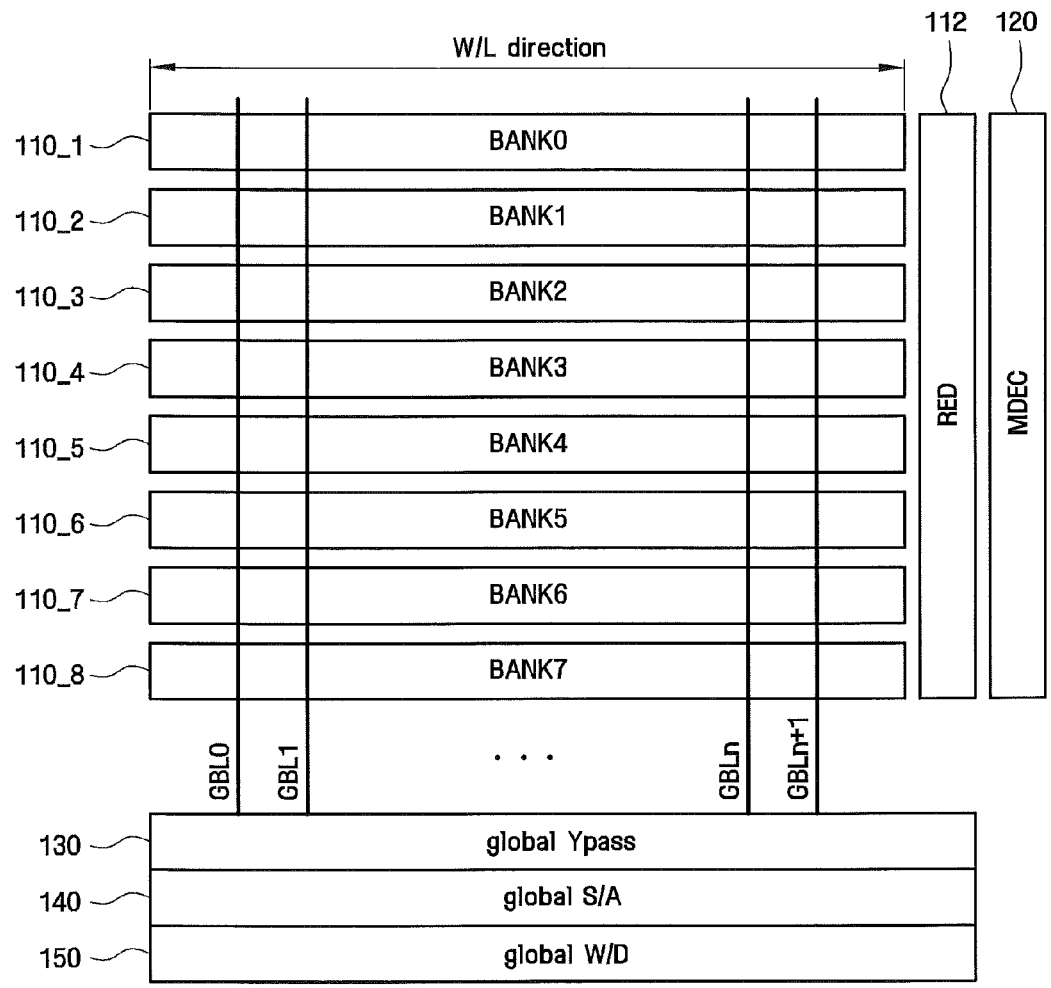
FIG. 3 is a block diagram for explaining nonvolatile memory devices according to embodiments of the present invention.

FIG. 3 is a block diagram for explaining nonvolatile memory devices according to embodiments of the present invention. For explanatory convenience, FIG. 3 shows that the nonvolatile memory device has eight memory banks, but it may contain a different number of memory banks.

Referring to FIG. 3, the nonvolatile memory device includes a plurality of memory banks 110_1 through 110_8, a global column select circuit 130, a global sense amplifier (amp) circuit 140 and/or global write driver circuit 150, a redundancy memory cell array 112, and a main word line decoder 120.

Although not shown in FIG. 3, each of the memory banks 110_1 through 110_8 includes a plurality of nonvolatile memory cells, each of which includes a variable resistive element having a resistance varying depending on stored data and an access element controlling current flowing through the variable resistive element. The nonvolatile memory cell may be called the resistance memory cell. The variable resistive element may be composed of various kinds of materials such as a binary (two-element) compound (e.g., GaSb, InSb or InSe), a ternary (three-element) compound (e.g., GeSbTe, GaSeTe, InSbTe, SnSb.sub.2Te.sub.4 or InSbGe), or a quaternary (four-element) compound (e.g., AgInSbTe, (GeSn) SbTe, GeSb (SeTe) or Te.sub.81Ge.sub.15Sb.sub.2S.sub.2). The most commonly used material is GeSbTe. The access element may include a diode, a field-effect (FET) transistor, an NPN bipolar transistor, a PNP bipolar transistor or another semiconductor device.

The memory banks may operate independently of each other. As described above, the structure in which the global bit lines share the plurality of memory banks is referred to as a stack bank structure.

A higher capacity, higher integration density nonvolatile memory device can be implemented using a hierarchical bit line structure in which a plurality of local bit lines are connected to each of the global bit lines and a hierarchical word line structure in which a plurality of sub word lines are coupled to each of the main word lines. Referring to FIG. 3, each of a plurality of global bit lines GBL0 through GBLn+1 is arranged corresponding to the plurality of memory banks 110_1 through 110_8. Each of a plurality of main word lines is provided corresponding to one of the plurality of memory banks 110_1 through 110_8.

The global sense amp circuit 140 is coupled with the plurality of global bit lines GBL0 through GBLn+1 and reads data from nonvolatile memory cells within the plurality of memory banks 110_1 through 110_8 through the plurality of global bit lines GBL0 through GBLn+1. The global write driver circuit 150 is coupled with the plurality of global bit lines GBL0 through GBLn+1 and writes data to the nonvolatile memory cells within the plurality of memory banks 110_1 through 110_8 through the plurality of global bit lines GBL0 through GBLn+1.

The main word line decoder 120 is coupled with the plurality of main word lines and selectively selects the plurality of main word lines, each provided corresponding to one of the plurality of memory banks 110_1 through 110_8. In this way, because the plurality of memory banks 110_1 through 110_8 share the main word line decoder 120 and the redundancy memory cell array 112, the area of the core architecture can be reduced.

The global sense amp circuit 140 is a data read circuit. In some embodiments of the present invention, a read operation is performed by using a temperature compensation circuit (see FIGS. 13 through 25) including at least one reference cell. The read operation using the temperature compensation circuit will be described in detail later.

Figure 4:
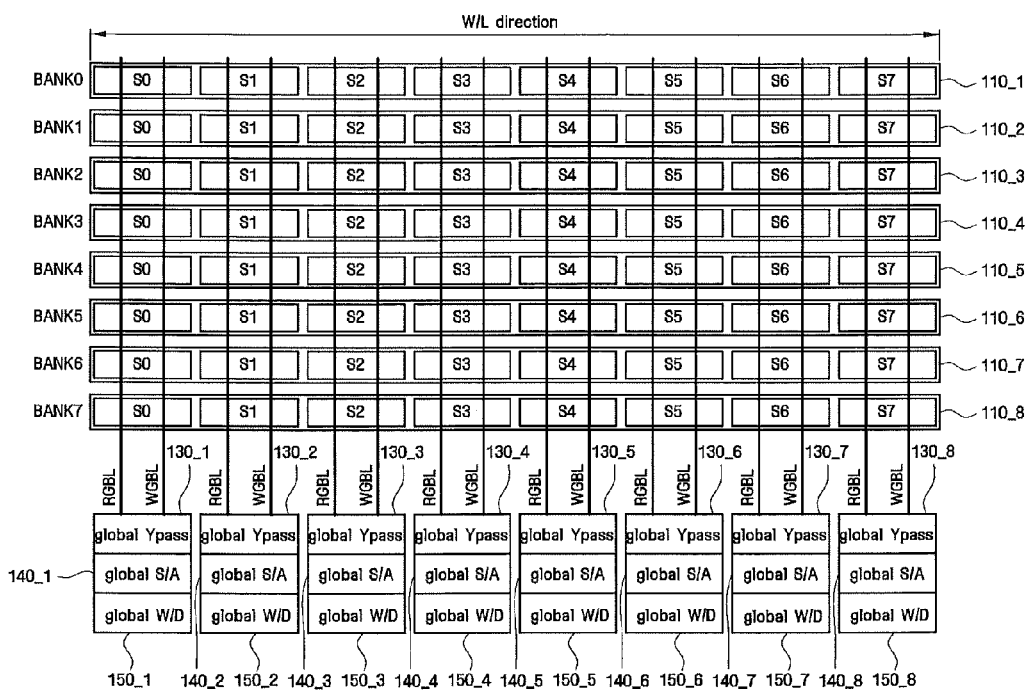
FIG. 4 is a block diagram of a nonvolatile memory device according to an embodiment of the present invention.

FIG. 4 is a block diagram of a nonvolatile memory device according to an embodiment of the present invention.

Referring to FIG. 4, each global bit line includes write global bit lines (WGBL) used to write data into the plurality of memory banks 110_1 through 110_8 and a read global bit line (RGBL) used to read data from the plurality of memory banks 110_1 through 110_8. The nonvolatile memory device having this configuration can easily perform a read operation during a write operation, i.e., read while write (hereinafter, referred to as "RWW operation"). For example, write current is supplied to the memory cells of a first memory bank via the write global bit lines WGBL to perform a write operation. While the write operation is performed in the first memory bank, read current may be supplied to the memory cells of a second memory bank via the read global bit lines RGBL to perform a read operation. Because the time required for the write operation is long, if the read operation is performed while performing the write operation, a total operation time (sum of the write operation time and the read operation time) can be reduced.

In the nonvolatile memory device according to the present embodiment, each of the plurality of memory banks 110_1 through 110_8 is divided into a plurality of sub-blocks S0 through S7. The global sense amp circuit (e.g., 140 of FIG. 3) includes first through eighth sense amp circuits 140_1 through 140_8 respectively corresponding to the plurality of sub-blocks S0 through S7. The global write driver circuit (e.g., 150 of FIG. 3) includes first through eighth global write driver circuits 150_1 through 150_8 respectively corresponding to the plurality of sub-blocks S0 through S7. The global column select circuit (e.g., 130 of FIG. 3) includes first through eighth global column select circuits 130_1 through 130_8 respectively corresponding to the plurality of sub-blocks S0 through S7.

Figure 5:
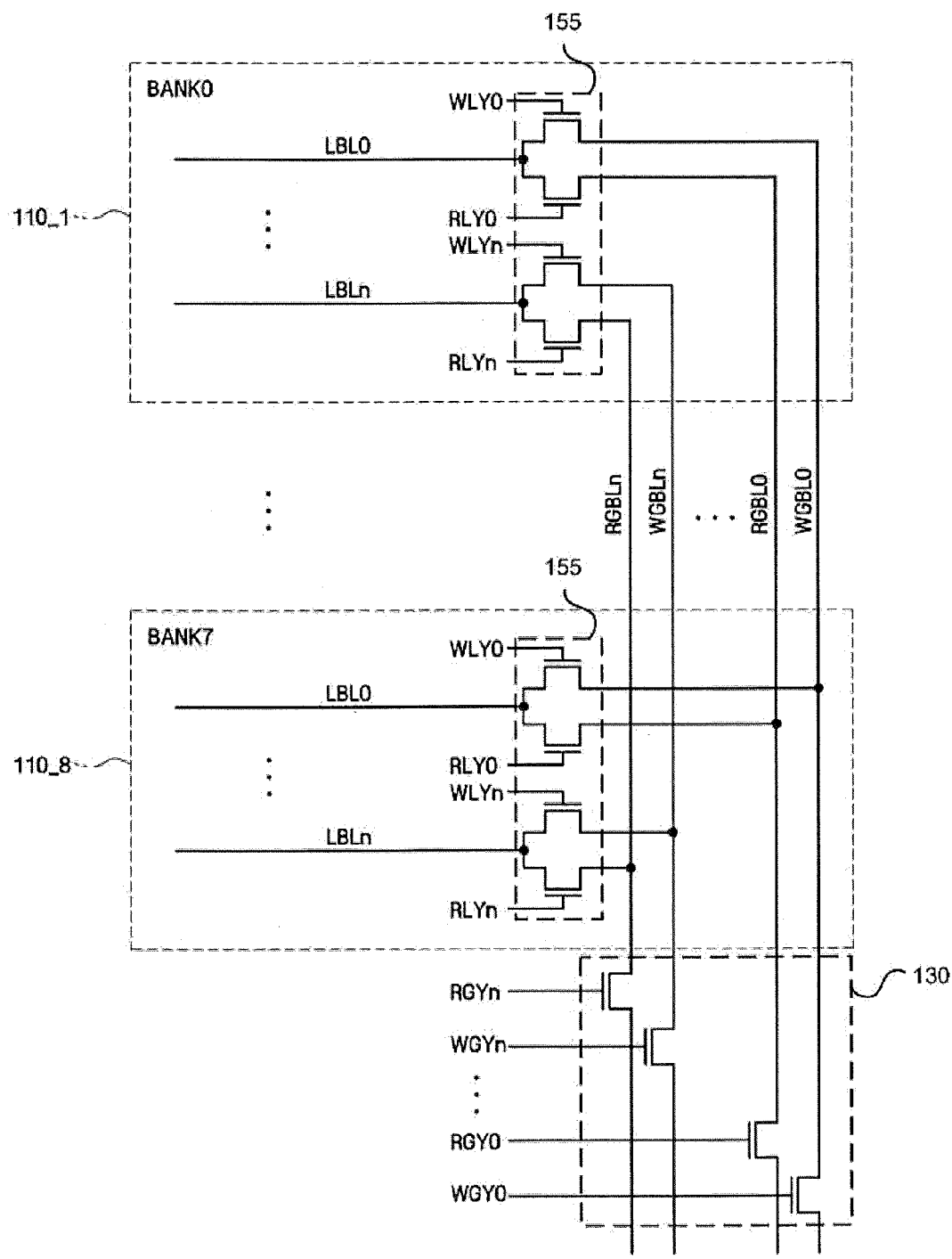
FIG. 5 is a conceptual circuit diagram for explaining in more detail the nonvolatile memory device of FIG. 4.

FIG. 5 is a conceptual circuit diagram for explaining in more detail the nonvolatile memory device of FIG. 4.

Referring to FIG. 5, the nonvolatile memory device includes a plurality of separate write global bit lines WGBL0 through WGBLn that are used during a write operation and a plurality of separate read global bit lines RGBL0 through RGBLn that are used during a read operation.

Thus, the global column select circuit 130 respectively selects the plurality of write global bit lines WGBL0 through WGBLn and the plurality of read global bit lines RGBL0 through RGBLn in response to write global column select signals WGY0 through WGYn and read global select signals RGY0 through RGYn. Namely, a selection transistor is disposed in each read global bit line RGBL0 through RGBLn and in each write global bit line WGBL0 through WGBLn. The selection transistors in the read global bit lines RGBL0 through RBGLn receive a respective one of the read global select signals RGY0 through RGYn at their gates, and the selection transistors in the write global bit lines WGBL0 through WGBLn receive a respective one of the write global column select signals WGY0 through WGYn at their gates.

A local column select circuit 155 selectively couples a plurality of local bit lines LBL0 through LBLn with the corresponding write global bit lines WGBL0 through WGBLn in response to write local column select signals WLY0 through WLYn. The local column select circuit 155 selectively couples the plurality of local bit lines LBL0 through LBLn with the corresponding read global bit lines RGBL0 through RGBLn in response to the read local column select signals RLY0 through RLYn. An exemplary configuration of the local column select circuit 155 will be described in detail later with reference to FIGS. 7A through 7D.

Figure 6:
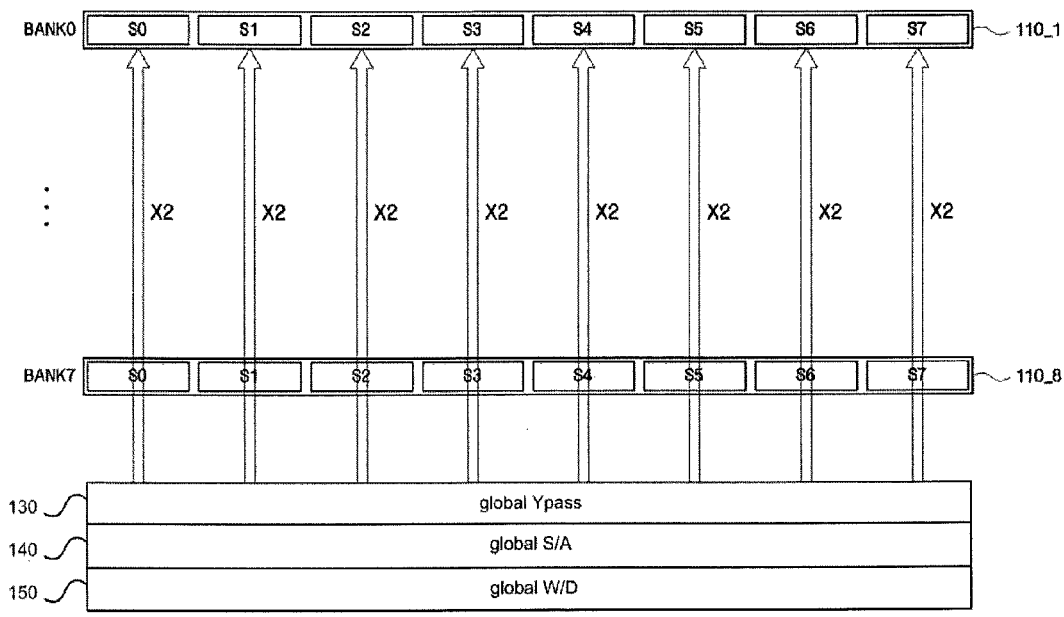
FIG. 6 is a conceptual diagram for explaining read and write operations of a nonvolatile memory device according to an embodiment of the present invention.

FIG. 6 is a conceptual diagram for explaining read and write operations of a nonvolatile memory device according to an embodiment of the present invention.

Referring to FIG. 6, the number of sense amps varies with the number of words to be pre-fetched during a synchronous burst read operation. For example, if the number of words to be read and pre-fetched from one memory bank is 4, the global sense amp circuit 140 requires 64 (1 word (16 bits).times.4) sense amps. If 8 and 16 words are pre-fetched from one memory bank, the global sense amp circuit 140 may respectively contain 128 and 256 sense amps.

Further, in order to write n.times.m sets of data (n and m are integers greater than 1), the nonvolatile memory device according to the present embodiment can simultaneously write m sets of data into the n sub-blocks during a test operation.

For example, in order to write 16 (i.e. 8.times.2) sets of data into one memory bank (e.g., 110_1), two sets of data can be written into 8 sub-blocks simultaneously during the test operation, as illustrated in FIG. 6. During the normal operation, two sets of data can be repeatedly written 8 times in one sub-block (e.g., S0). That is, 16 sets of data can be written simultaneously during the test operation because write current is applied through a tester. The nonvolatile memory device repeatedly writes data into one sub-block during the normal operation due to a limitation on current driving ability, instead of simultaneously writing data into the plurality of sub-blocks S0 through S7. A nonvolatile memory device having sufficient current driving ability, however, may simultaneously write data into the plurality of sub-blocks during the normal operation. Because set/reset current can flow in the plurality of sub-blocks S0 through S7 (i.e., in a wide area), 16 sets of data can be written at a time during test operation. That is, because a large number of data can be written simultaneously during a test operation, the test time can be significantly reduced.

FIGS. 7A-7D are exemplary circuit diagrams of the local column select circuit 155.

Figure 7A:
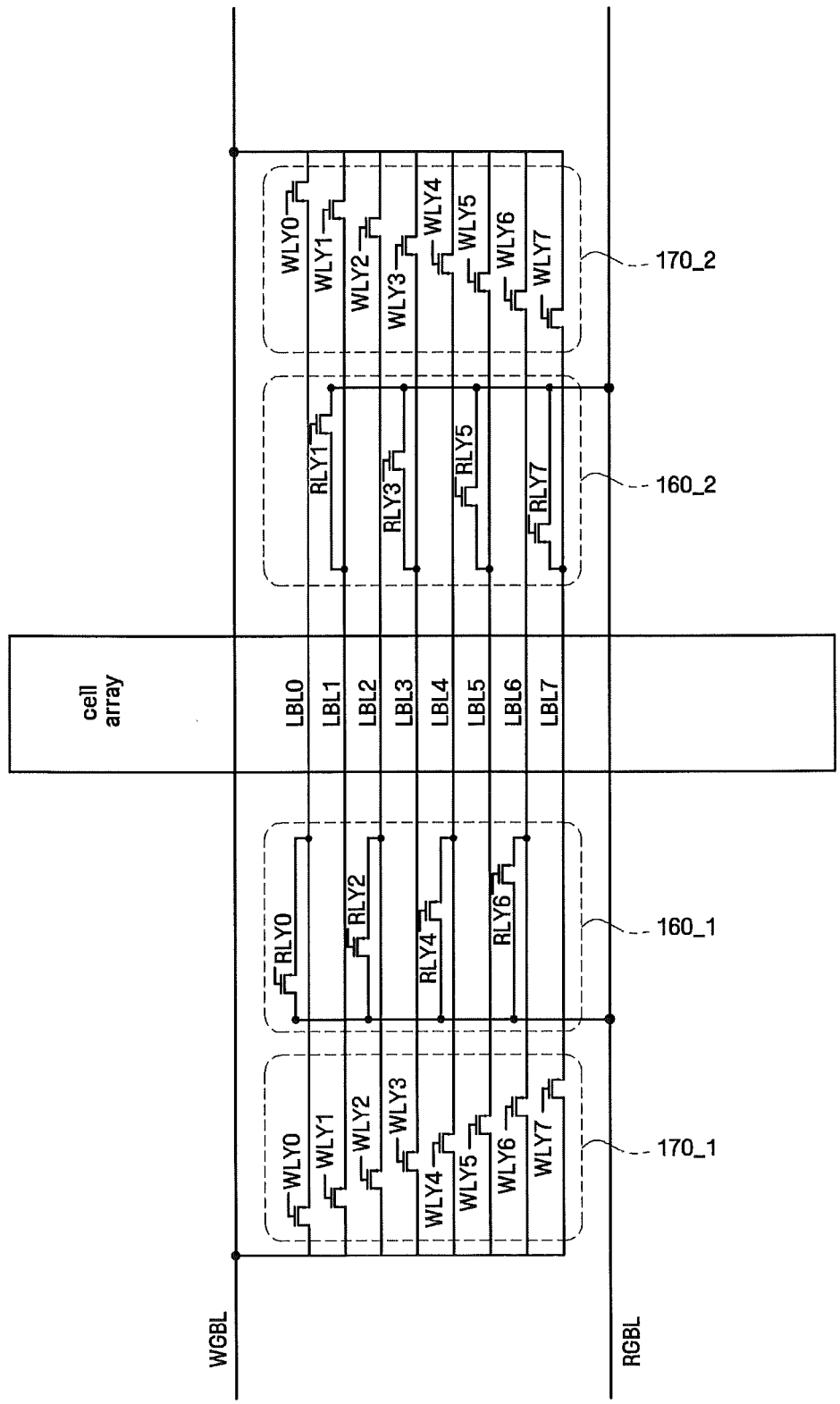
FIGS. 7A-7D are exemplary diagrams of the local column select circuit.
Figure 7B:
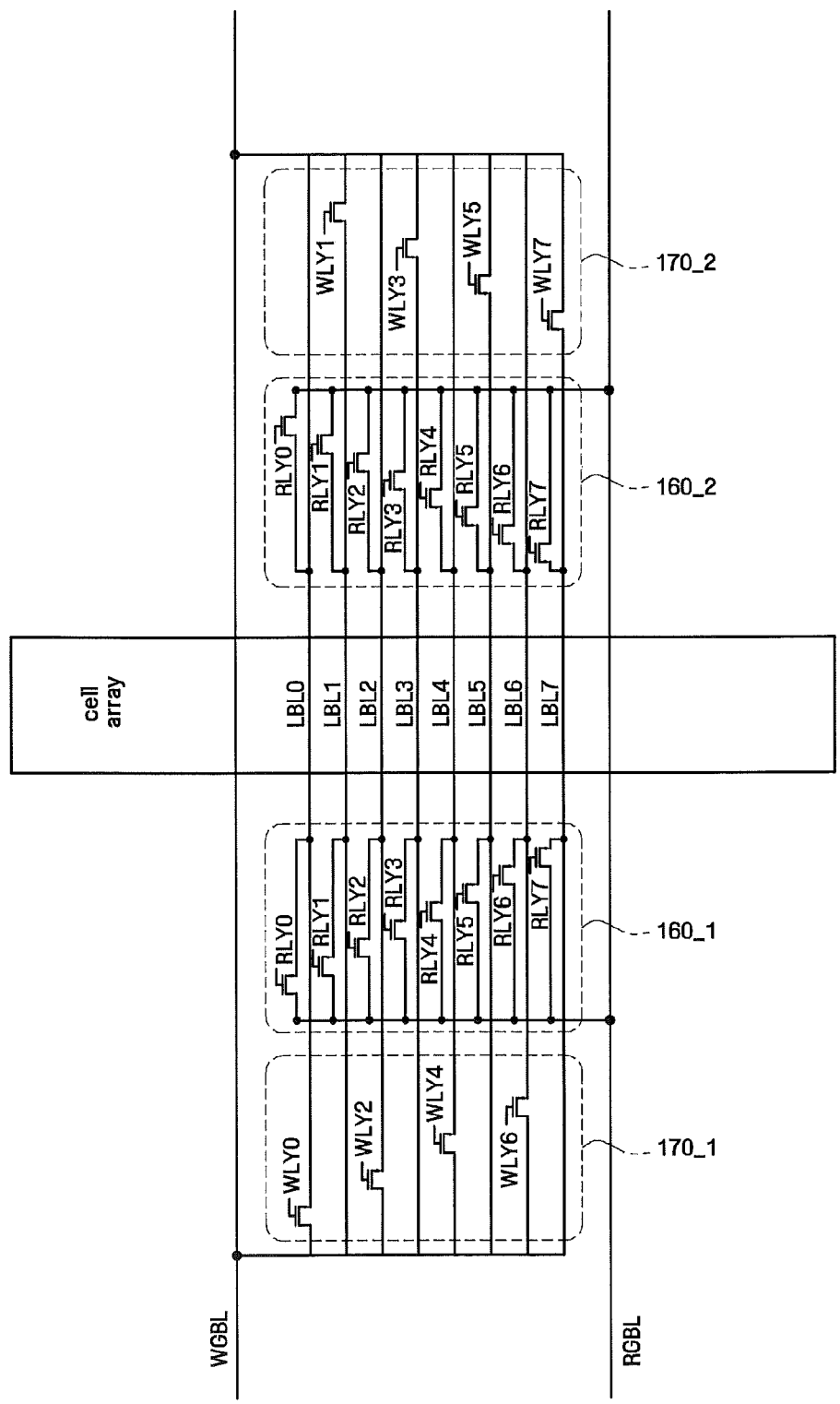
Figure 7C:
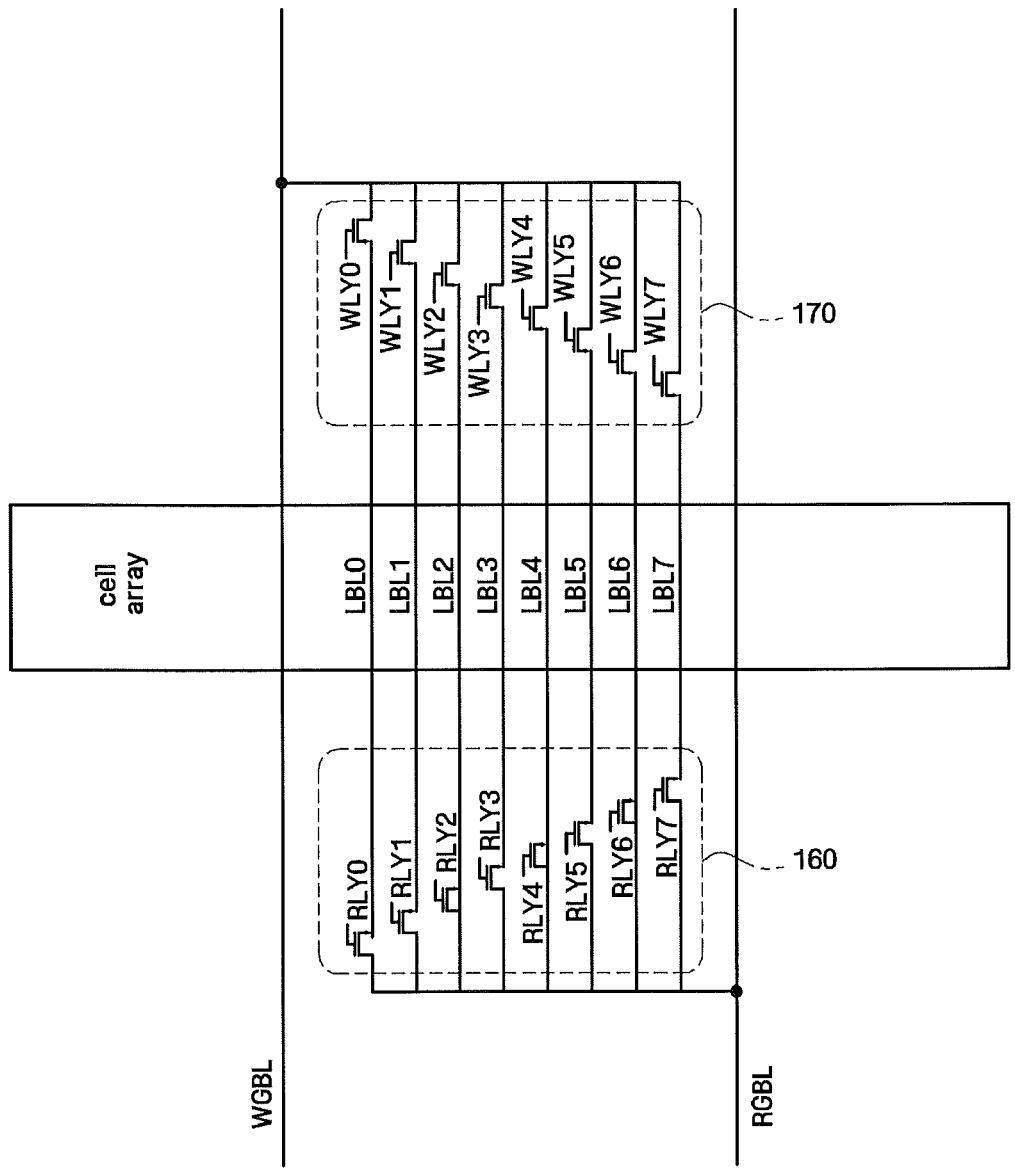
Figure 7D:
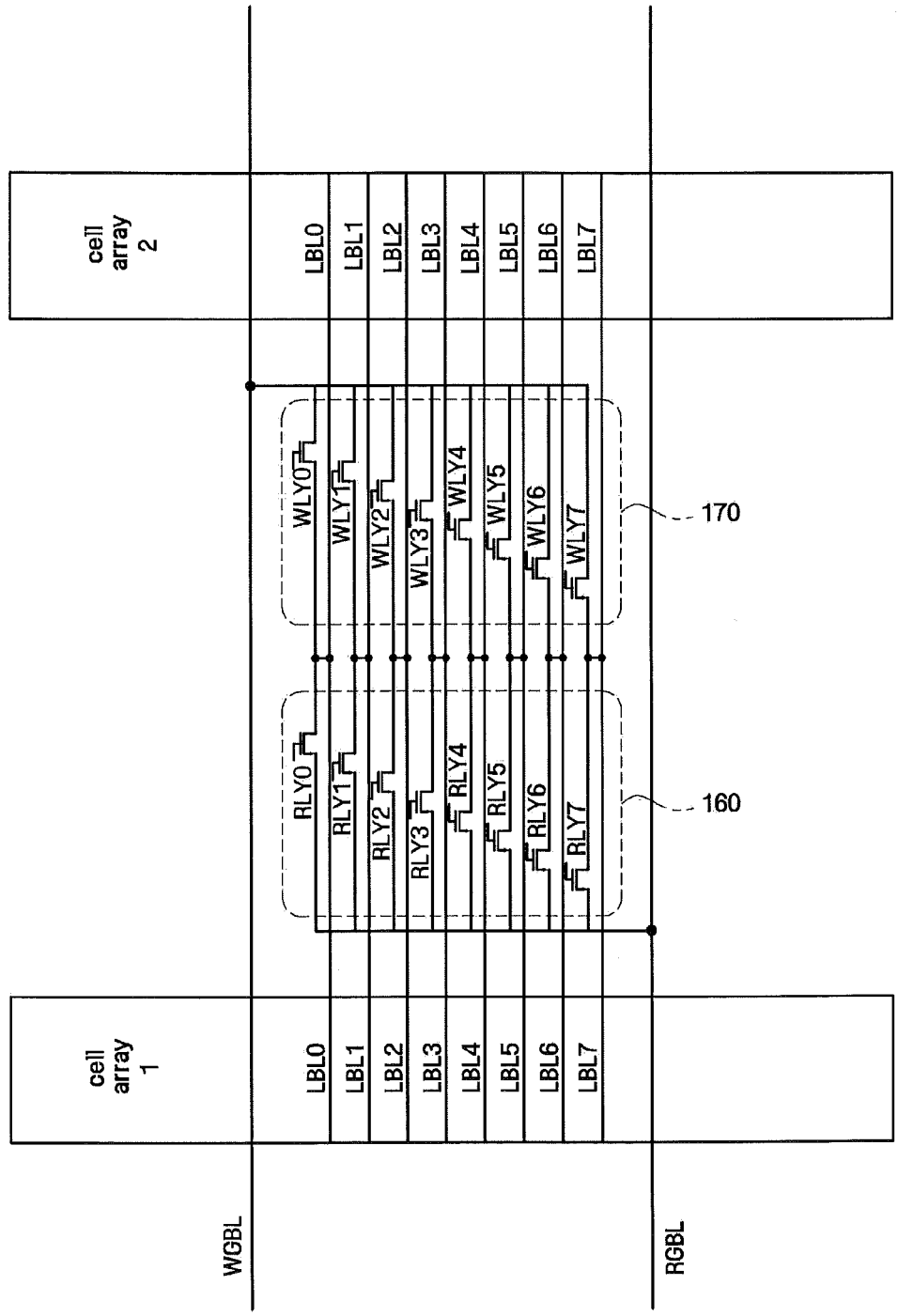

Referring to FIGS. 7A-7D, the local column select circuit 155 of FIG. 5 includes write local column select circuit(s) (170_1 and 170_2 in FIG. 7A or 7B, or 170 in FIG. 7C or 7D) and read local column select circuit(s) (160_1 and 160_2 in FIG. 7A or 7B, or 160 in FIG. 7C or 7D). The write local column select circuit(s) couple(s) local bit lines LBL0 through LBL7 with a write global bit line WGBL in response to write local select signals WLY0 through WLY7 during a write operation. The read local column select circuit(s) couple(s) the local bit lines LBL0 through LBL7 with a read global bit line RGBL in response to read local select signals RLY0 through RLY7 during read operation. A memory cell array includes a plurality of nonvolatile memory cells located within the sub-blocks (S0 through S7 in FIG. 4) and coupled with the local bit lines LBL0 through LBL7.

As shown in the embodiment of FIG. 7A, the write local column select circuits 170_1 and 170_2 are disposed on either side of a cell array. Each of the write local column select circuits 170_1 and 170_2 includes a plurality of selection transistors corresponding in number to the local bit lines of the cell array. Each selection transistor is connected between the write global bit line WGBL and a respective one of the local bit lines LBL0 through LBL7; and receives a respective one of the write local select signals WLY0 through WLY7. The read local column select circuits 160_1 and 160_2 are also disposed on either side of the cell array. However the read local column select circuit 160_1 only includes selection transistors corresponding to even numbered ones of the local bit lines, while the read bit column select circuit 160_2 includes selection transistors corresponding the odd numbered local bit lines. In particular, the selection transistors of the read local column select circuit 160_1 are connected between the read global bit line RGBL and a respective one of the local bit lines LBL0, LBL2, LBL4, and LBL6; and receive the read local select signals RLY0, RLY2, RLY4, RLY6 respectively at their gates. The read local column select circuit 160_2 includes selection transistors connected between the read global bit line RGBL and the local bit lines LBL1, LBL3, LBL5, and LBL7 and receive the read local select signals RLY1, RLY3, RLY5, and RLY7 at their gates.

In the embodiment of FIG. 7B, the write local column select circuits 170_1 and 170_2 are disposed on either side of the cell array. Each of these write local column select circuits includes selection transistors for half of the local bit lines in the cell array. In particular, the write local column select circuit 170_1 includes selection transistors connected between the write global bit line WGBL and the local bit lines LBL0, LBL2, LBL4, and LBL6; and these selection transistors receive the write local select signals WLY0, WLY2, WLY4, and WLY6 respectively at their gates. The write local column select circuit 170_2 includes selection transistors connected between the write global bit line WGBL and the local bit lines LBL1, LBL3, LBL5, and LBL7; and the selection transistors receive the write local select signals WLY1, WLY3, WLY5, and WLY7 respectively at their gates. In this embodiment the read local column select circuits 160_1 and 160_2 are disposed on either side of the cell array. Both of the read local column select circuits 160_1 and 160_2 include selection transistors associated with each local bit line. In particular, these read local column select circuits include selection transistors connected between the read global bit line RGBL and a respective one of the local bit lines LBL0 through LBL7. The selection transistors also respectfully receive the read local selection signals RLY0 through RLY7 at their gates.

In the embodiment of FIG. 7C, a single read local column select circuit 160 is disposed on one side of the cell array, while a single write local column select circuit 170 is disposed on the other side of the cell array. The write local column select circuit 170 is the same as the write local column select circuit 170_2 in FIG. 7A, and the read column select circuit 160 is the same as the read column select circuit 160_1 in FIG. 7B.

As will be appreciated from the above discussion, the arrangements discussed above with respect to FIGS. 7A-7C are repeated for each cell array. With respect to the embodiment of FIG. 7D, this embodiment is repeated for each pair of cell arrays. In FIG. 7D, examples cell arrays 1 and 2 are illustrated. These cell arrays share local bit lines LBL0-LBL7. A write local column select circuit 170 and a read local column select circuit 160 are disposed between the cell arrays 1 and 2. Each of the write local column select circuit 170 and the read local column select circuit 160 includes selection transistors equal in number to the local bit lines in the associated portion of the cell arrays 1 and 2. In particular, the read local column select circuit 160 includes selection transistors connected between the read global bit line RGBL and the local bit lines LBL0 through LBL7, and the selection transistors receive the read local select signals RL0 through RL7 respectively at their gates. Similarly, the selection transistors in the write local select circuit 170 are connected between the write global bit line WGBL and the local bit lines LBL0 through LBL7, and the selection transistors respectfully receive the write local select signals WLY0 through WLY7.

The write and read local column select circuits may have various other configurations than those illustrated in FIGS. 7A-7D.

Figure 8A:
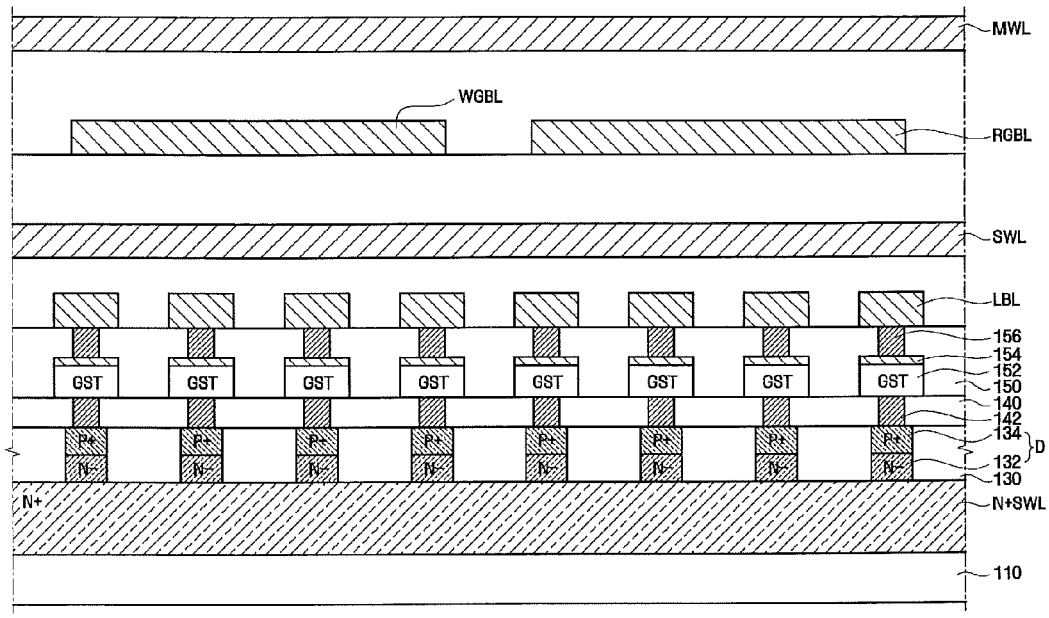
FIGS. 8A and 8B are exemplary cross-sections of a nonvolatile memory device according to an embodiment of the present invention.
Figure 8B:
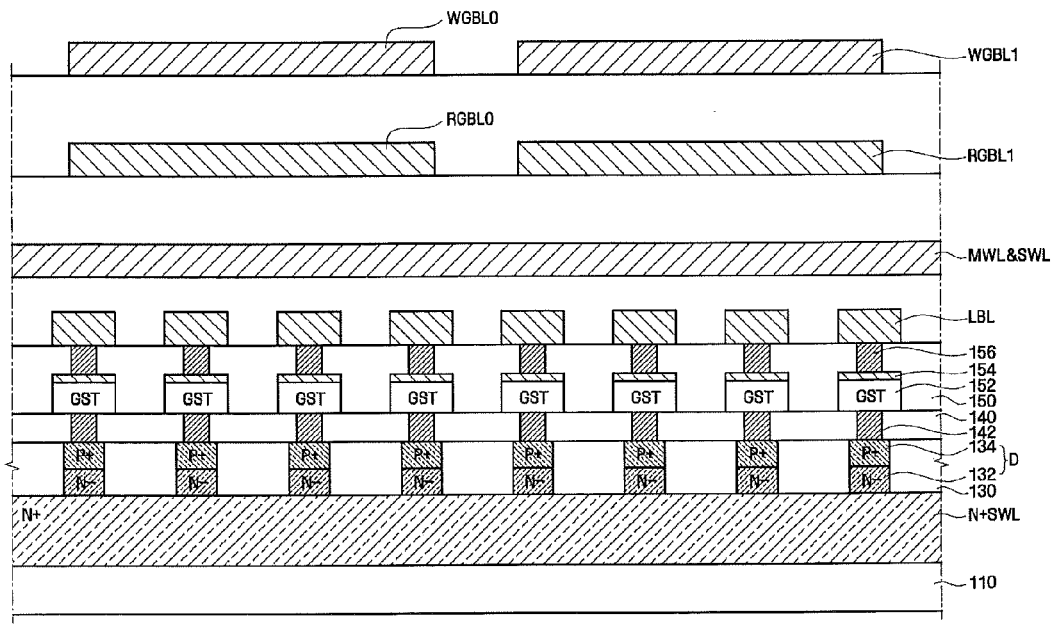

FIGS. 8A and 8B are exemplary cross-sections of nonvolatile memory devices according to embodiments of the present invention.

Referring to FIGS. 8A and 8B, the nonvolatile memory device according to the present embodiment includes a P-type semiconductor substrate 110 having an active region defined by forming a device isolation region thereon.

An N+ type sub word line N+SWL is formed within the semiconductor substrate 110.

A first insulating layer 130 is formed on the semiconductor substrate 110. A plurality of cell diodes D consisting of N+ and P+ type semiconductor patterns 132 and 134 are formed in the first insulating layers 130 in contact with the N+ type sub word line N+SWL.

A second insulating layer 140 is formed over the first insulating layer 130 and a plurality of bottom electrode contacts (BECs) 142 are formed in the second insulating layer 140. Each BEC 142 contacts a respective one of the cell diodes D.

A plurality of variable resistive materials 152 are formed on the second insulating layer 140 so as to be coupled with the plurality of BECs 142, and a plurality of top electrode contacts (TECs) 154 are formed on the plurality of variable resistive materials 152.

The nonvolatile memory device further includes a third insulating layer 150 formed on the second insulating layer 140 and having a plurality of bit line contacts 156 respectively coupled with the plurality of TECs 154. A plurality of local bit lines LBLs are formed above the third insulating layer 150 and are respectively coupled with the plurality of bit line contacts 156. An insulating layer 160 is formed over the plurality of both lines LBL.

With reference to FIG. 8A, a sub word line SWL is formed over the plurality of local bit lines LBLs on the insulating layers 160. An insulating layer 170 is formed over the sub word line SWL. A write global bit line WGBL and a read global bit line RGBL are formed over the sub word line SWL on the insulating layer 170. An insulating layer 180 is formed over the read global bit line RGBL and the write global bit line WGBL. A main word line MWL is formed over the write global bit line WGBL and the read global bit line RGBL on the insulating laser 180. Although not shown in FIG. 8A, the sub word line SWL is coupled with the N+-type sub word line N+SWL formed within the semiconductor substrate 110.

Further, the write global bit line WGBL and the read global bit line RGBL are selectively coupled with the plurality of local bit lines LBLs (8 LBLs in FIG. 8A). In particular, FIG. 8A shows an example in which the write global bit line WGBL and the read global bit line RGBL are located at the same level. Furthermore, although not shown in FIG. 8A, the main word line MWL is selectively coupled with the sub word line SWL.

FIG. 8B shows an example of a nonvolatile memory device in which write global bit lines WGBL0 and WGBL1 are located at a different level than read global bit lines RGBL0 and RGBL1. Referring to FIG. 8B, the main and sub word lines MWL and SWL are formed on the insulating layer 160. An insulating layer 170' is formed over the main and sub word lines MWL and SWL. Respective first and second read global bit lines RGBL0 and RGBL1 are formed on the insulating layer 170', and another insulating layer 180' is formed over the first and second read global bit lines RBGL1 and RGBL2. The write global bit lines WGBL0 and WGBL1 may be formed above the read global bit lines RGBL0 and RGBL1 on the insulating layer 180'. Although not shown in FIG. 8B, the read and write global bit lines RGBL0 and WGBL0 are selectively coupled with a plurality of local bit lines LBLs (the left four LBLs in FIG. 8B) while the read and write global bit lines RGBL1 and WGBL1 are selectively coupled with a remaining plurality of local bit lines LBLs (the right four LBLs in FIG. 8B). The read and write global bit lines RGBL0 and RGBL1 and WGBL0 and WGBL1 may be coupled with the plurality of local bit lines LBLs in various other ways. Furthermore, while FIG. 8B shows the main word line MML and the sub word line SWL are formed at the same level, they may be arranged in other ways. For example, the main word line MWL may be formed above the write global bit lines WGBL0 and WGBL1.

Figure 9A:
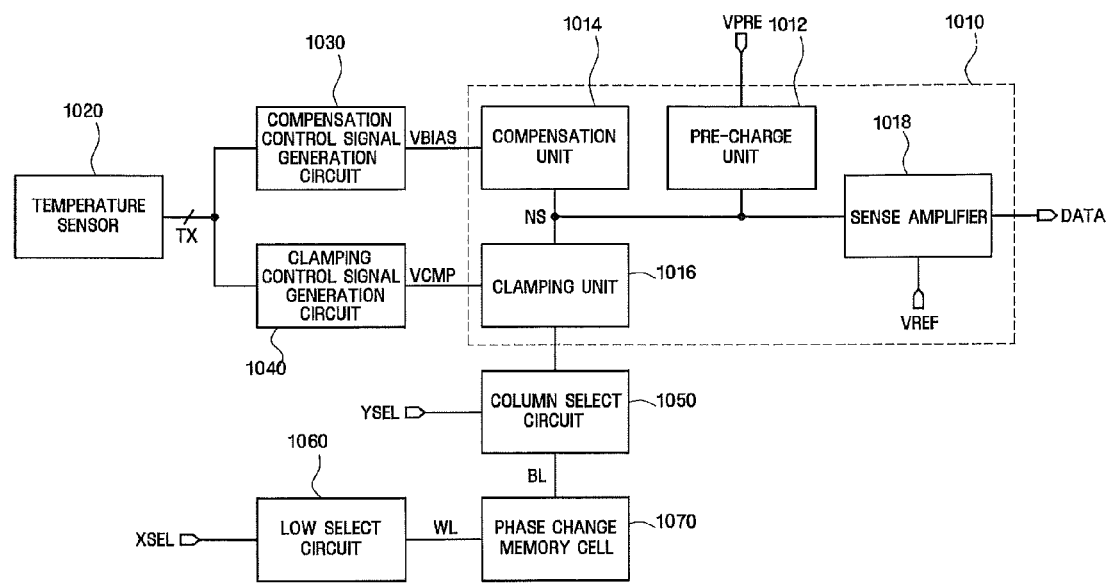
Figure 9C:
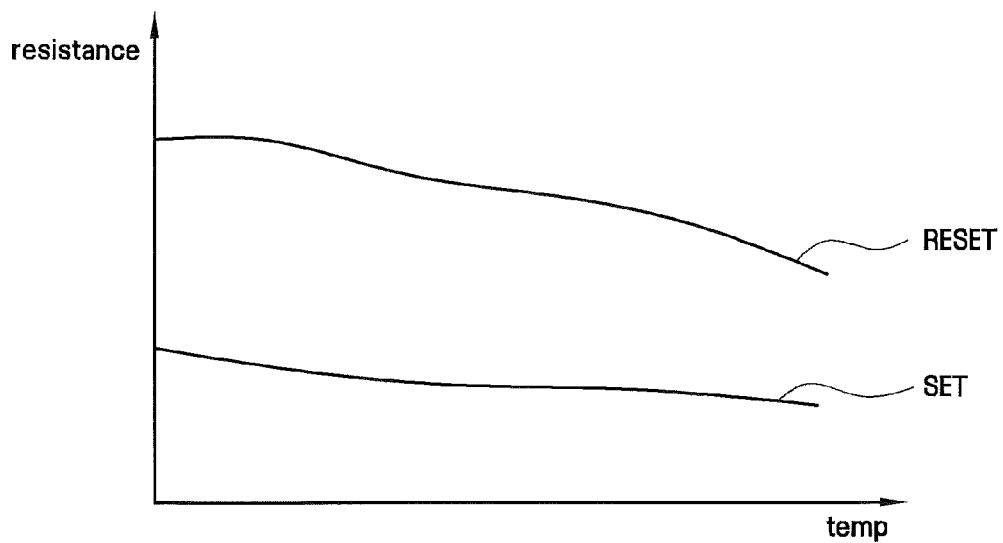
Figure 9D:
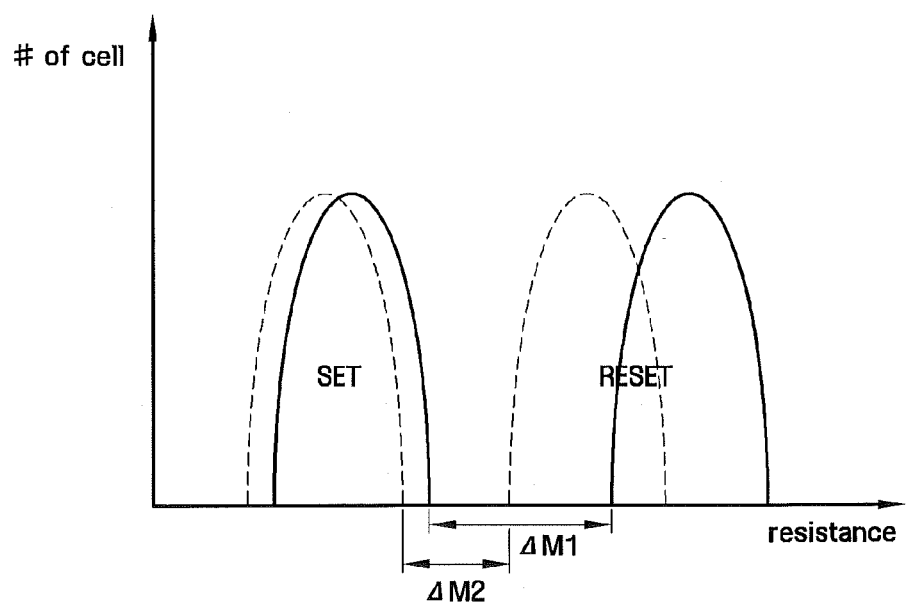
Figure 9E:
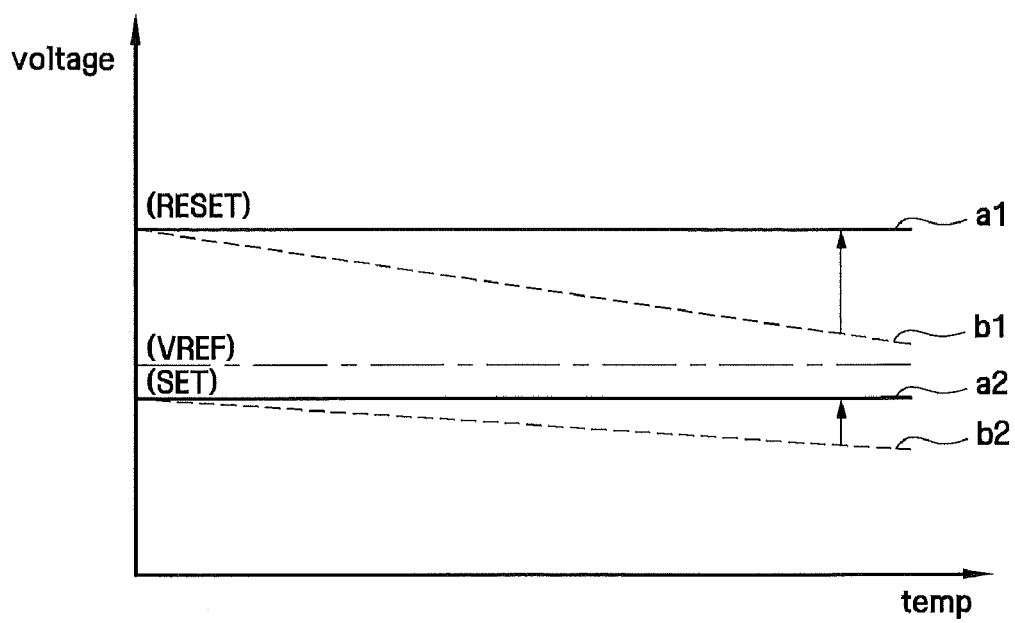

Referring to FIGS. 9A and 9B, a PRAM according to an example embodiment may include a temperature sensor 1020 that may react to ambient temperature and provide a temperature signal Tx. A compensation control signal generation circuit 1030 and a clamping control signal generation circuit 1040 may each receive the temperature signal Tx, and respectively generate a compensation control signal VBIAS and a clamping control signal VCMP, reflecting the temperature characteristics. In detail, when the temperature rises, the compensation control signal generation circuit 1030 and the clamping control signal generation circuit 1040 may decrease the voltage level of the compensation control signal VBIAS and the voltage level of the clamping control signal VCMP, respectively.

When the voltage level of the compensation control signal VBIAS decreases, the PMOS transistor of the compensation unit 1014 may decrease the amount of compensation current. In contrast, when the voltage level of the clamping control signal VCMP decreases, the NMOS transistor MN1 of the clamping unit 1016 may decrease the amount of clamping current.

Figure 9F:
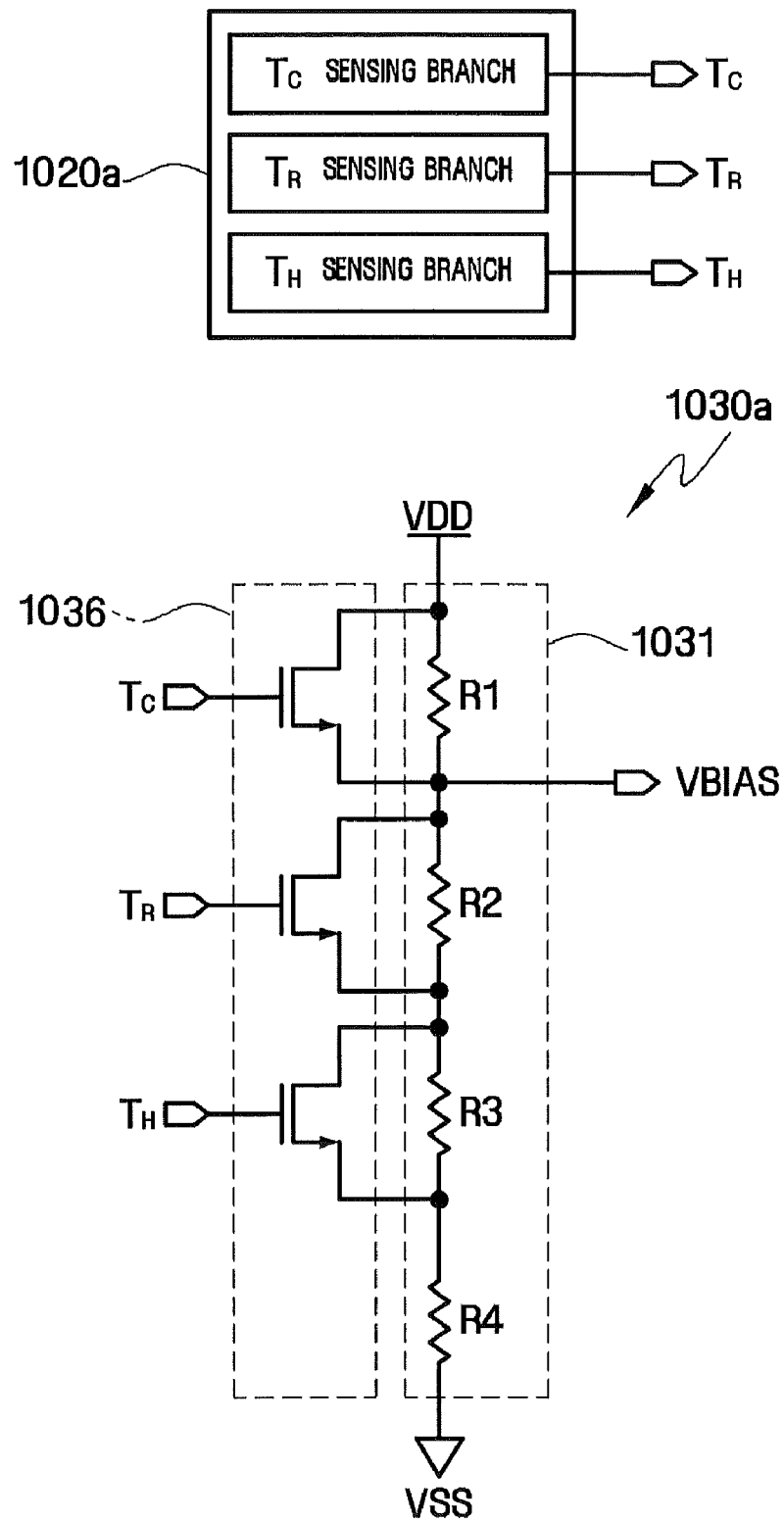
Figure 9G:
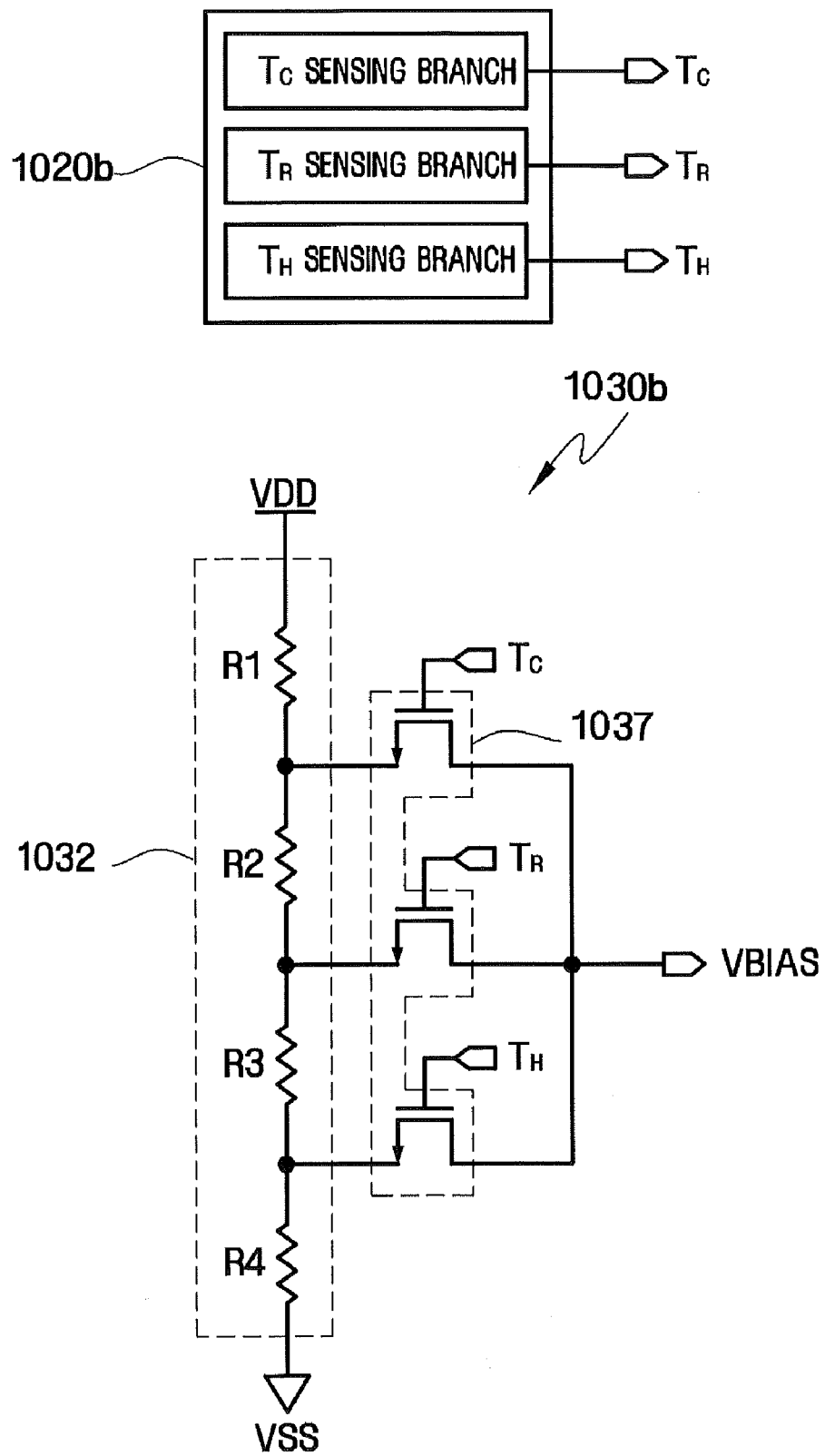

Examples of the temperature sensor 1020, the compensation control signal generation circuit 1030, and the clamping control signal generation circuit 1040 are illustrated in FIGS. 9F to 9H. Although FIGS. 9F to 9H only show the compensation control signal generation circuit 1030, the circuit illustrated in FIGS. 9F to 9H may also be applied to the clamping control signal generation circuit 1040. The circuits shown in FIGS. 9F to 9H are only for illustrative purposes.

Referring to FIG. 9F, the temperature sensor 1020a may include a plurality of temperature sensing branches which react to different temperatures and output temperature signals TR, TH and TC. For example, the temperature sensor 1020a may include a sensing branch TR for sensing ambient temperature, a sensing branch TH for sensing a temperature higher than ambient temperature, and a sensing branch TC for sensing a temperature lower than ambient temperature. When temperature of the PRAM becomes higher than ambient temperature, the temperature signal TH also becomes high, and the temperature signal TH becomes low.

The compensation control signal generation circuit 1030a may include a resistor array 1031 configured to have a plurality of resistors R1 to R4, and a plurality of NMOS transistors 1036 connected between a plurality of nodes of the resistor array 1031, and configured to be turned on in response to the temperature signals, TR, TH and TC. Values of the plurality of resistors R1 to R4 may be, for example, R1<R2<R3<R4. The level of the compensation control signal VBIAS output in response to the temperature signal TH may be lower than that of compensation control signals VBIAS output in response to the other temperature signals TR and TC.

Referring to FIG. 9G, the temperature sensor 1020b may include a plurality of temperature sensing branches TR, TR and TC, which may output temperature signals TR, TH and TC, respectively, in response to different temperatures.

The compensation control signal generation circuit 1030b may include a resistor array 1032 configured to include a plurality of resistors R1 to R4, and a plurality of NMOS transistors 1037 may be connected between a plurality of nodes of the resistor array 1032 and a voltage output node and configured to be turned on in response to the temperature signals TR, TH and TC.

Referring to FIG. 9H, the temperature sensor 1020c may include a diode, and the compensation control signal generation circuit 1030c may include a resistor array in which a plurality of resistors R1 to R4 may be connected in a series. The diode and the plurality of resistors may be connected in a series with respect to each other. Since the resistance of the diode may become high when temperature rises, the level of the compensation control signal VBIAS may decrease when temperature rises.

Figure 9I:
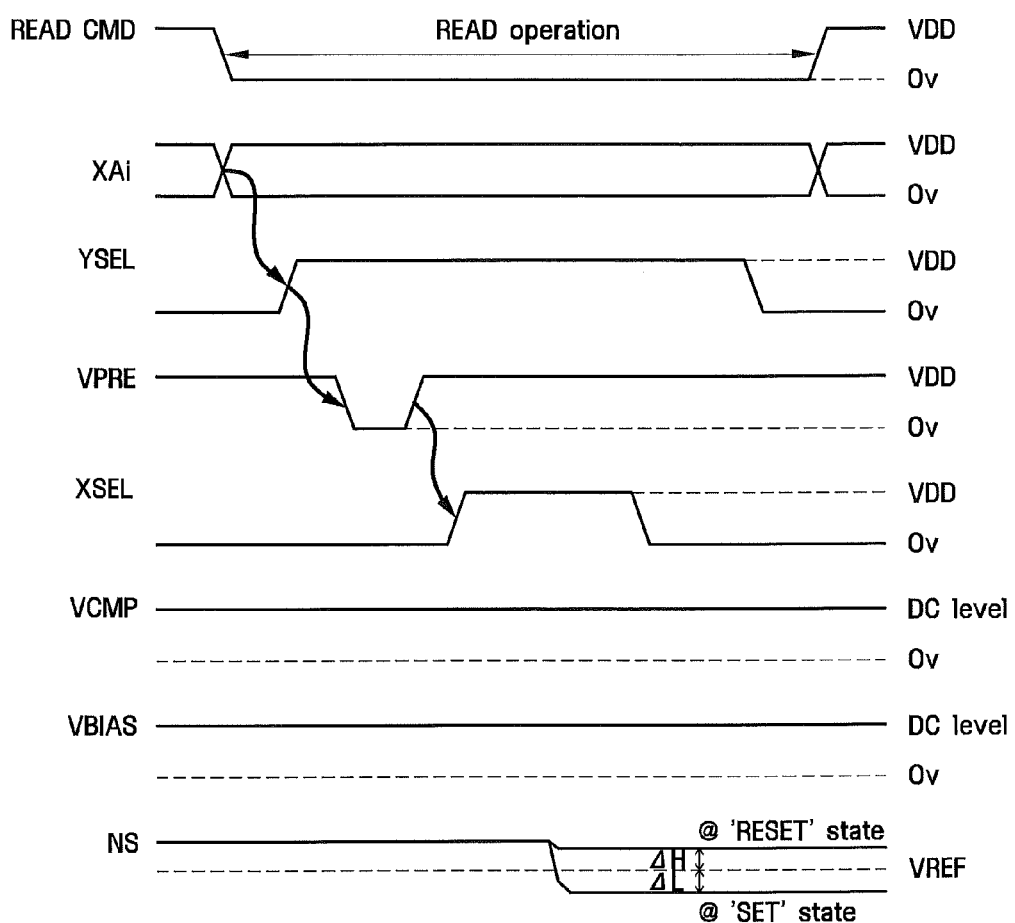

FIG. 9I is a timing diagram illustrating a read operation of a PRAM according to an example embodiment.

A read operation may be performed when temperature of the PRAM is higher than ambient temperature.

First, a read operation may start in response to an input of a read command, a column select signal YSEL may become high in synchronization with an input address XAi, and a hit line BL may be selected.

Subsequently, a pre-charge control signal VPRE may become low in synchronization with the column select signal YSEL. Accordingly, the transistor MP1 of the pre-charge unit 1012 may pre-charge the sensing node SN to the level of the power supply voltage VDD.

Thereafter, when the pre-charge control signal VPRE becomes high, the low select signal XSEL may become high in synchronization with the pre-charge control signal so that a word line WL may be selected.

Further, when the pre-charge operation is terminated and a sensing operation starts, the clamping unit 1016 may clamp the level of the bit line BL within a region appropriate for reading data. In detail, the clamping unit 1016 may clamp the level of the bit line BL to a desired level below the threshold voltage Vth of the phase change material. For example, when the threshold voltage of the phase change material is about 1.2 V, the level of the bit line BL may be clamped at about 0.5 V to 1.0 V. The clamping unit 16 may provide a clamping current lower than that provided at ambient temperature. Although a clamping control signal VCMP may have the form of a constant voltage, as illustrated in FIG. 9I, the clamping control signal VCMP may have the form of a pulse which may be activated only during a read operation.

Furthermore, the compensation unit 1014 may provide the sensing node SN with a compensation current in order to compensate for a decrease in the level of the sensing node SN caused by the pass through current Icell flowing through the selected phase change memory cell 1070. In particular, the compensation unit 1014 may provide an amount of compensation current which may be larger than that provided at ambient temperature. Although the compensation control signal VBIAS may have the form of a constant voltage, as illustrated in FIG. 9I, the compensation control signal VBIAS may have the form of a pulse type which may be activated only during the read operation.

In such a state, a pass through current Icell depending on the resistance of the selected phase change memory cell 1070 may be generated. When the phase change memory cell 1070 is in a set state, the amount of pass through current Icell may be large because the resistance of the phase change material is low. In contrast, when the phase change memory cell 1070 is in a reset state, the amount of the pass through current Icell may be small because the resistance of the phase change material is high. However, since the compensation unit 1014 may uniformly provide the compensation current, the level of the sensing node SN may be uniformly maintained in a reset state, and may decrease in a set state. Accordingly, the sense amplifier 1018 may sense the difference $\Delta H$ between the level of the sensing node SN in a reset state and a reference level VREF, or the difference $\Delta L$ between the level of the sensing node SN in a set state and the reference level VREF.

According to an example embodiment, it may be noted that as temperature rises, the compensation unit 1014 may increase the amount of compensation current and the clamping unit 1016 may decrease the amount of clamping current so that the level of the sensing node SN in a reset state may be uniformly maintained.

Figure 9J:
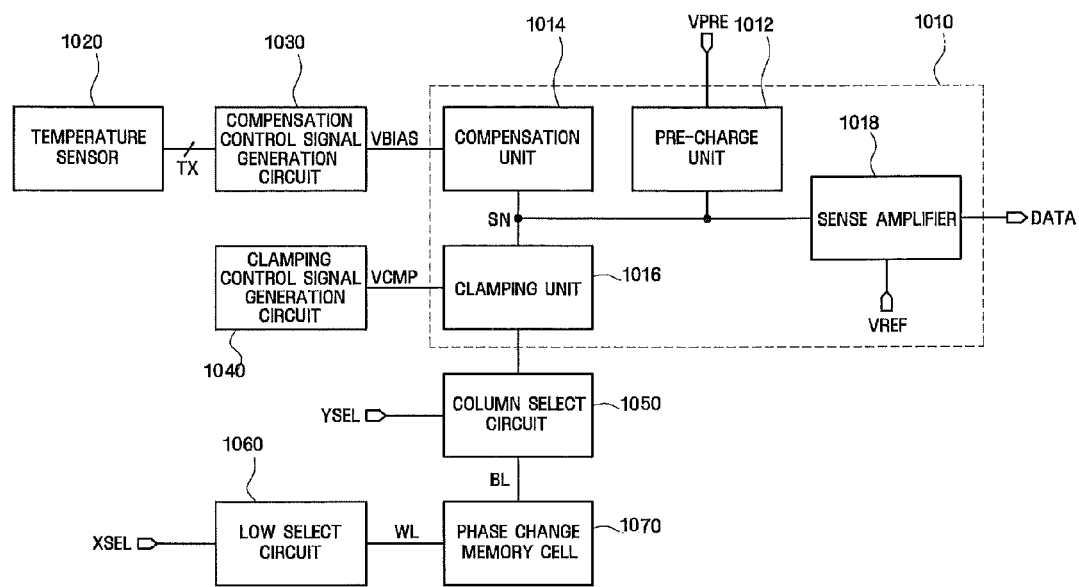
Figure 9K:
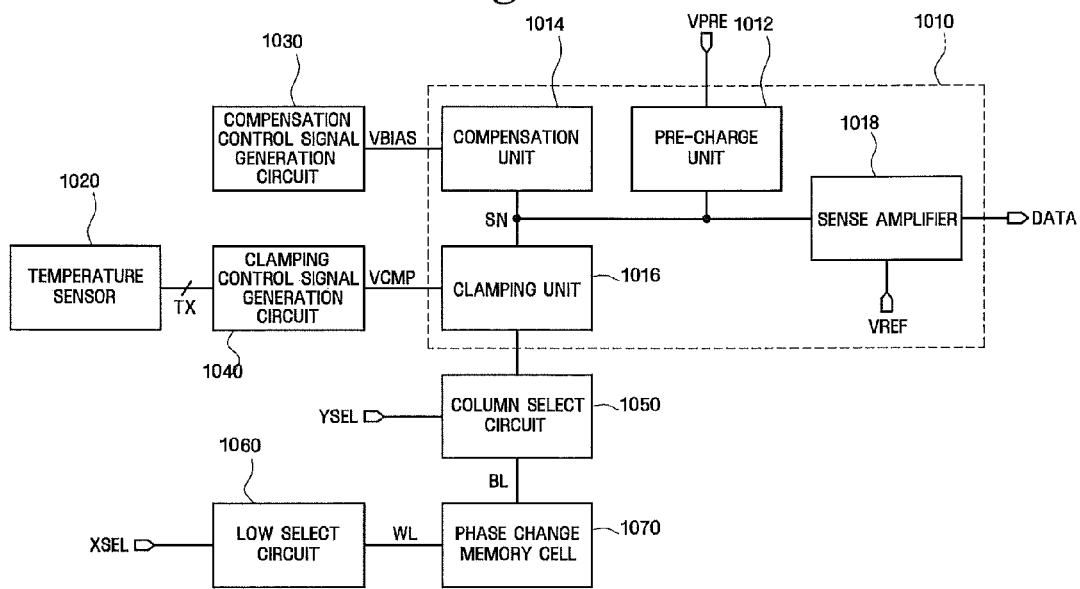

FIG. 9J is a block diagram illustrating a PRAM according to another example embodiment. FIG. 9K is a block diagram illustrating a PRAM according to yet another example embodiment.

In the PRAM according to example embodiment illustrated in FIG. 9J, because only the compensation control signal generation circuit 1030 may be provided with the temperature signal Tx of the temperature sensor 1020, only the compensation unit 1014 may control the amount of compensation current according to the change in temperature. On the hand, in the PRAM according to yet another example illustrated in FIG. 9K, because only the clamping control signal generation circuit 1040 may be provided with the temperature signal Tx of the temperature sensor, only the clamping unit 1016 may control the amount of clamping current according to the change in temperature.

Example embodiments relate to a PRAM having a more reliable read operation. If the temperature of the PRAM increases, a set resistance and reset resistance may change. Accordingly, the resistance margin between the set resistance and reset resistance may be small. In some example embodiments, the PRAM may include a compensation unit, a clamping unit, a compensation-control-signal-generation circuit, a clamping-control-signal-generation circuit, a temperature sensor, and/or a sense amplifier.

The compensation unit may control the amount of compensation current according to the temperature of the PRAM in response to a compensation-control signal. The compensation-control-signal-generation circuit controls the voltage level of the compensation-control signal by receiving the temperature signal from the temperature sensor.

The clamping unit may control the amount of clamping current according to the temperature of the PRAM in response to a clamping-control signal. The clamping-control-signal-generation circuit may control the voltage level of the clamping control signal by receiving the temperature signal from the temperature sensor.

Figure 10A:
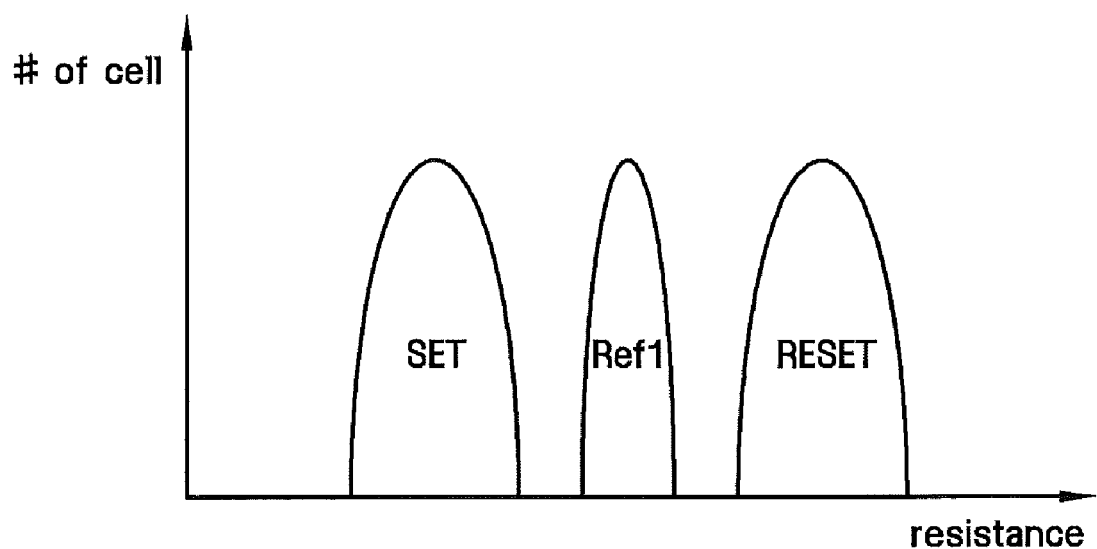
FIGS. 10A through 12 are diagrams for explaining a nonvolatile memory device according to a fifth embodiment of the present invention.
Figure 10B:
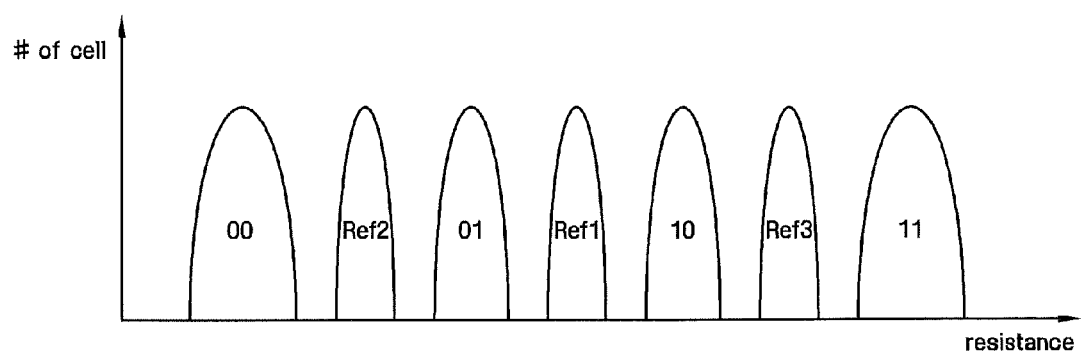
Figure 11:
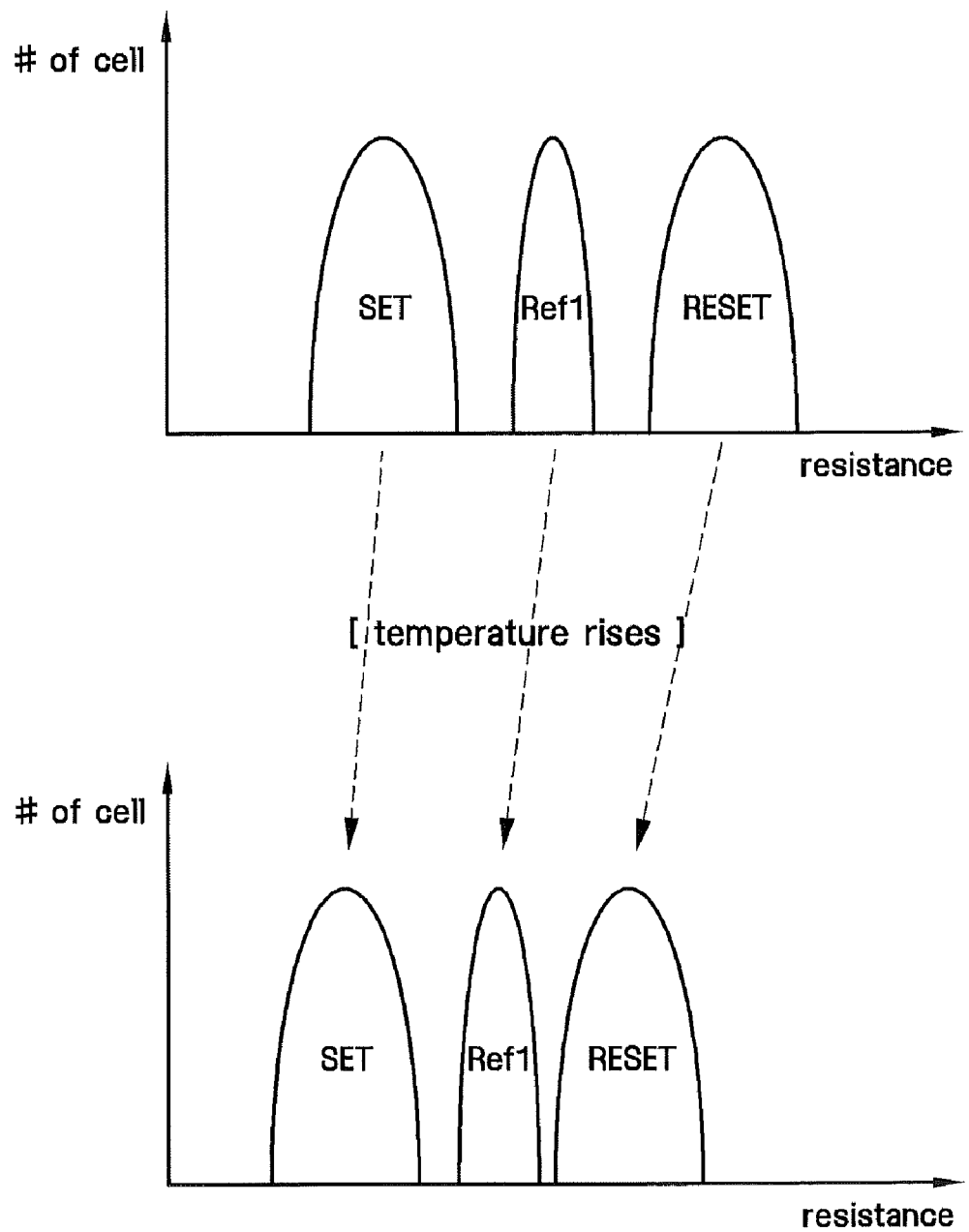
Figure 12:
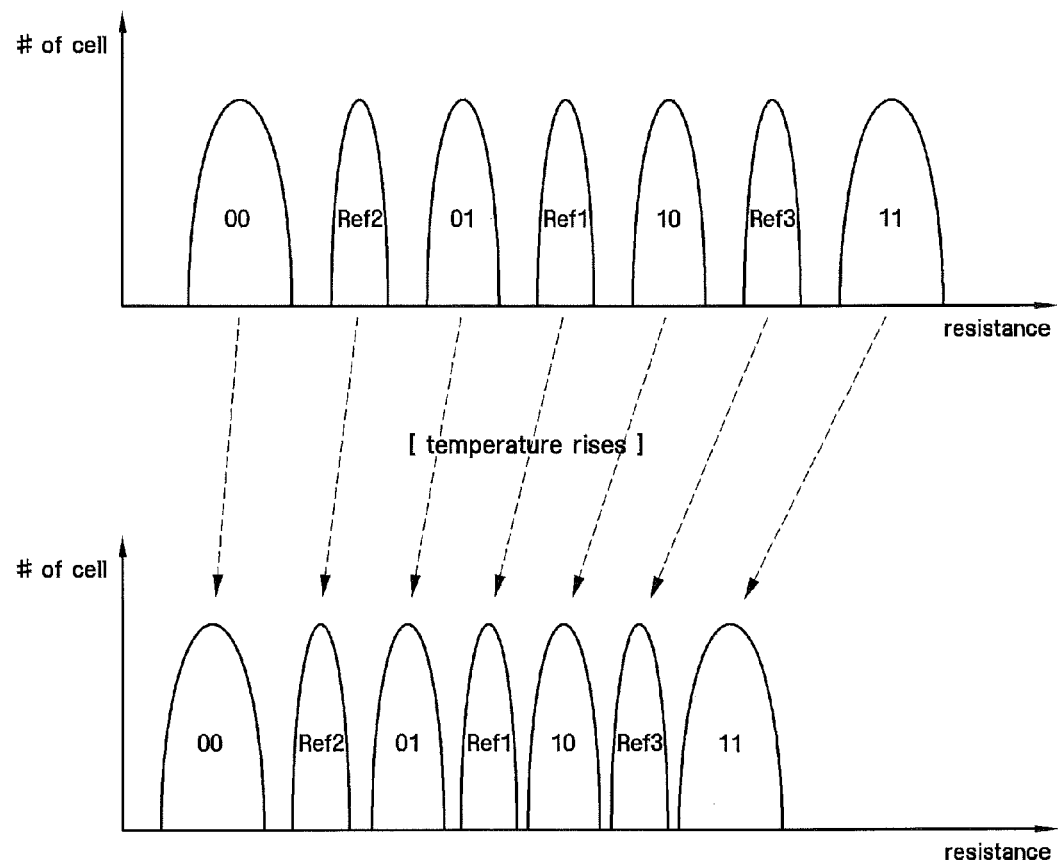

FIGS. 10A through 12 are diagrams for explaining a nonvolatile memory device according to a fifth embodiment of the present invention. Specifically, FIGS. 10A and 11 are diagrams related to single-level cells (i.e., 1 bit-level cells), and FIGS. 10B and 12 are diagrams related to multi-level cells (i.e., n bit-level cells where "n" is a natural number equal to or greater than two).

In the nonvolatile memory device according to the fifth embodiment of the present invention, each nonvolatile memory cell has any one of a plurality of first resistance distributions. Here, the first resistance distributions do not overlap each other, that is, are separated from each other to secure a margin.

For example, when the nonvolatile memory cells are single-level cells, the first resistance distributions may include two (=$2^1$) kinds of resistance distributions, i.e., a set resistance distribution SET and a reset resistance distribution RESET, as illustrated in FIG. 10A. Here, each of the nonvolatile memory cells may have resistance corresponding to any one of the first resistance distributions.

When the nonvolatile memory cells are multi-level cells, each of the nonvolatile memory cells may have any one of $2^n$ different kinds of resistance distributions. For example, when the nonvolatile memory cells are 2 bit multi-level cells, the first resistance distributions may include four (=$2^2$) kinds of resistance distributions, i.e., 00, 01, 10, and 11, as illustrated in FIG. 10B. Here, each of the nonvolatile memory cells may have resistance corresponding to any one of the first resistance distributions. In addition, each of the resistance distributions 00, 01, 10, and 11 may be determined by the amount of amorphous material contained in a phase-change material. For example, the resistance distribution 00 may be determined when the phase-change material is crystalline, and the amount of amorphous material contained in the phase-change material may increase in the order of the resistance distributions 01, 10, and 11.

The nonvolatile memory device according to the fifth embodiment of the present invention may also include one or more reference cells for adjusting the amount of compensation current or clamping current to enhance the reliability of a read operation. The reference cells may be identical to the nonvolatile memory cells. That is, like the nonvolatile memory cells, each of the reference cells may include a variable resistance element and an access element, and the variable resistance element may be a phase-change material.

Each of the reference cells has any one of a plurality of second resistance distributions. The second resistance distributions may not overlap the first resistance distributions of the nonvolatile memory cells.

When the nonvolatile memory cells are single-level cells, the reference cells have one resistance distribution Ref1, as illustrated in FIG. 10A. On the other hand, when the nonvolatile memory cells are multi-level cells (i.e., n bit-level cells), the reference cells have $2^n-1$ resistance distributions. For example, when the nonvolatile memory cells are 2 bit multi-level cells, three different resistance distributions Ref1, Ref2, and Ref3 may be generated as illustrated in FIG. 10B. Consequentially, when the nonvolatile memory cells are m bit-level cells ("m" is a natural number), the reference cells have $2^m-1$ resistance distributions.

Referring to FIGS. 10A and 10B, any one of the second resistance distributions may be located between two adjacent ones of the first resistance distributions. For example, referring to FIG. 10B, the resistance distribution Ref2 is located between the resistance distributions 00 and 01, the resistance distribution Ref1 is located between the resistance distributions 01 and 10, and the resistance distribution Ref3 is located between the resistance distributions 10 and 11.

Referring to FIG. 11, the resistance distributions of the nonvolatile memory cells and the resistance distributions of the reference cells change as temperature rises. That is, as temperature rises, the reset resistance distribution RESET is reduced more significantly than the set resistance distribution SET. Therefore, as temperature rises, a margin between the set resistance distribution SET and the reset resistance distribution RESET is reduced.

However, the arrangement of the set resistance distribution SET, the resistance distribution Ref1 of the reference cells, and the reset resistance distribution RESET remains unchanged before and after temperature rises. In addition, the set resistance distribution SET, the resistance distribution Ref1 of the reference cells, and the reset resistance distribution RESET still do not overlap each other. Therefore, the resistance of the reference cells may be used to clearly discriminate between set resistance and reset resistance.

Referring to FIG. 12, the resistance distributions of the nonvolatile memory cells and the resistance distributions of the reference cells change as temperature rises. That is, as temperature rises, the degree by which the resistance distribution is reduced increases in the order of the resistance distributions 00, 01, 10, and 11. Therefore, as temperature rises, margins between the resistance distributions 00, 01, 10, and 11 are reduced.

However, the arrangement of the resistance distributions 00, 01, 10, and 11, and the resistance distributions Ref1, Ref2, and Ref3 of the reference cells remains unchanged before and after temperature rises. In addition, the resistance distributions 00, 01, 10, and 11, and the resistance distributions Ref1, Ref2, and Ref3 of the reference cells still do not overlap each other. Therefore, the resistances of the reference cells may be used to clearly discriminate among resistances corresponding to the resistance distributions 00, 01, 10, and 11.

In some embodiments of the present invention, the resistances of the reference cells are used to adjust the amount of compensation current or clamping current. As described above with reference to FIGS. 11 and 12, the resistance change of the reference cells according to temperature may fully reflect the resistance change of the nonvolatile memory cells according to temperature. That is, a change in the resistance of the reference cells according to temperature may be equal to a change in the resistance of the nonvolatile memory cells according to temperature. Therefore, the amount of compensation current or clamping current may fully reflect temperature changes.

The amount of compensation current or clamping current can be adjusted more accurately by using the resistance change of the reference cells. This is because the resistance change of the reference cells can accurately reflect the resistance change of the nonvolatile memory cells since the reference cells and the nonvolatile memory cells are the same type of memory cells.

A specific configuration (block or circuit) for adjusting the amount of compensation current or clamping current using the reference cells will now be described.

Figure 13:
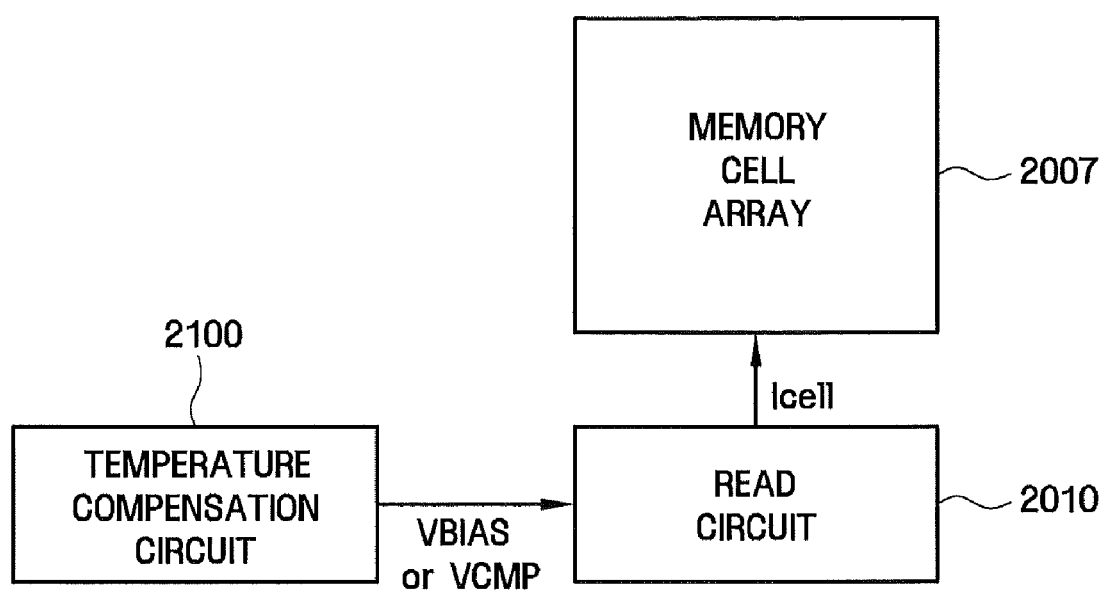
FIG. 13 is a block diagram of the nonvolatile memory device according to the fifth embodiment of the present invention.

FIG. 13 is a block diagram of the nonvolatile memory device according to the fifth embodiment of the present invention. In FIG. 13, a case where a read operation is performed using the resistance of the reference cells will be described based on the description made with reference to FIGS. 10A through 12.

Referring to FIG. 13, the nonvolatile memory device according to the fifth embodiment of the present invention includes a memory cell array 2007, a read circuit 2010, and a temperature compensation circuit 2100.

The memory cell array 2007 includes a plurality of nonvolatile memory cells. Each of the nonvolatile memory cells has resistance corresponding to any one of the first resistance distributions. That is, when the nonvolatile memory cells are single-level cells, each of the nonvolatile memory cells has the set resistance or the reset resistance. When the nonvolatile memory cells are multi-level cells, each of the nonvolatile memory cells has resistance corresponding to any one of the resistance distributions 00, 01, 10, and 11.

The temperature compensation circuit 2100 includes one or more reference cells. Each of the reference cells has resistance corresponding to any one of the second resistance distributions. That is, each of the reference cells may have the resistance distribution Ref1 as illustrated in FIG. 10A or may have any one of the resistance distributions Ref1 through Ref3 as illustrated in FIG. 10B.

Meanwhile, one or more reference cells may form a reference set. For example, the number of resistance distributions that the reference cells can have may be equal to the number of reference cells included in a reference set. When the nonvolatile memory cells are single-level cells, the reference cells may have one reference level Ref1. When the nonvolatile memory cells are multi-level cells (n bit-level cells), the reference cells may have $2^n-1$ resistance levels. Therefore, when the nonvolatile memory cells are single-level cells, one reference cell is included in a reference set. When the nonvolatile memory cells are multi-level cells (n bit-level cells), $2^n-1$ reference cells are included in the reference set. For example, referring to FIG. 10B, three ($=2^2-1$) reference cells may be included in a reference set. Consequently, when the nonvolatile memory cells are m bit-level cells ("m" is a natural number), $2^m-1$ reference cells are included in the same reference set.

The $2^m-1$ reference cells included in the same reference set may respectively have resistances corresponding to different resistance distributions. For example, when the nonvolatile memory cells are 2 bit-level cells, three reference cells may be included in the same reference set. Here, the three reference cells may respectively have resistances corresponding to different resistance distributions, i.e., Ref1 through Ref3.

The temperature compensation circuit 2100 may generate a compensation control signal VBIAS or a clamp control signal VCMP that changes according to the resistance of the reference cells. As described above with reference to FIGS. 11 and 12, the resistance of the reference cells changes according to temperature. Accordingly, the compensation control signal VBIAS or the clamp control signal VCMP also changes according to temperature. The detailed configuration and operation of the temperature compensation circuit 2100 will be described later with reference to FIGS. 14 through 18.

Figure 14:
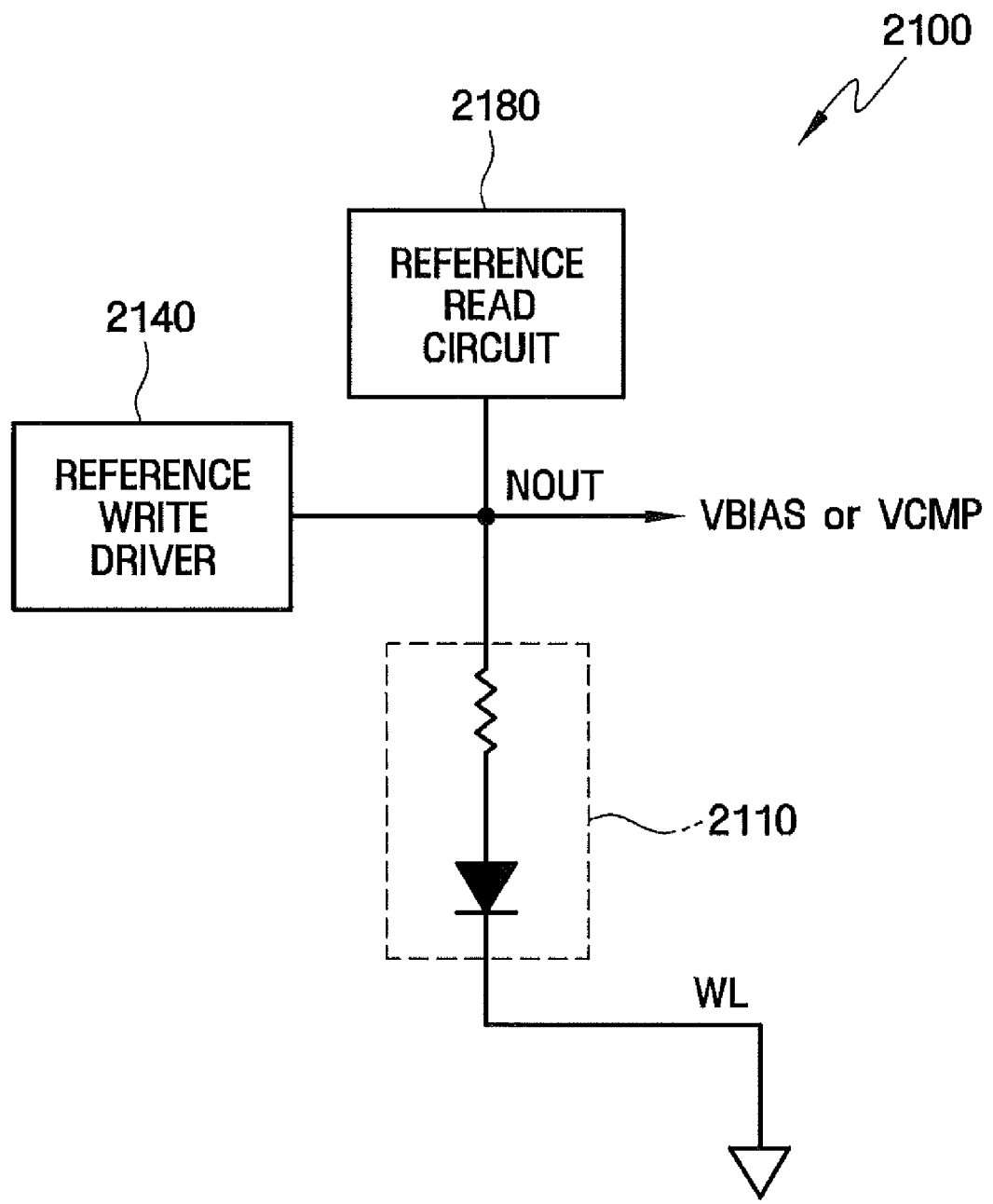
FIG. 14 is an exemplary block diagram of the temperature compensation circuit 2100 illustrated in FIG. 13.

FIG. 14 is an exemplary block diagram of the temperature compensation circuit 2100 illustrated in FIG. 13.

Referring to FIG. 14, the temperature compensation circuit 2100 includes a reference cell 2110, a reference write driver 2140, a reference read circuit 2180, and an output node NOUT.

The reference write driver 2140 is connected to the output node NOUT, supplies a write current to the reference cell 2110, and determines the resistance distribution of the reference cell 2110. The detailed structure of the reference write driver 2140 will be described later with reference to FIG. 15.

The reference read circuit 180 is connected to the output node NOUT, supplies a read current to the reference cell 2110, and reads the resistance distribution of the reference cell 2110. That is, the reference read circuit 2180 identifies whether the resistance (i.e., resistance distribution) of the reference cell 2110 is located at a desired position.

When the resistance distribution of the reference cell 2110 is not located at the desired position, the reference write driver 2140 supplies a write current again to the reference cell 2110 and determines the resistance distribution of the reference cell 2110. When the resistance distribution of the reference cell 2110 is located at the desired position, the compensation control signal VBIAS or the clamp control signal VCMP, which changes according to the resistance level of the reference cell 2110, is output through the output node NOUT.

The detailed structure of the reference read circuit 2180 will be described later with reference to FIGS. 16 through 18.

The reference write driver 2140 may be a replica circuit of a write driver which determines resistance distributions of the nonvolatile memory cells by supplying a write current to the nonvolatile memory cells. The reference read circuit 2180 may be a replica circuit of a read circuit (see FIG. 3) which reads the resistance distributions of the nonvolatile memory cells by supplying a read circuit to the nonvolatile memory cells. Since the reference cell 2110 is identical to each nonvolatile memory cell as described above, a change in the resistance of the reference cell 2110 according to temperature can fully reflect a change in the resistance of each nonvolatile memory cell according to temperature. Here, if the reference write driver 2140 and the reference read circuit 2180 are replica circuits, the resistance change of the reference cell 2110 according to temperature can more accurately reflect the resistance change of each nonvolatile memory cell according to temperature. However, the reference write driver 2140 and the reference read circuit 2180 are not limited to the replica circuits.

Figure 15:
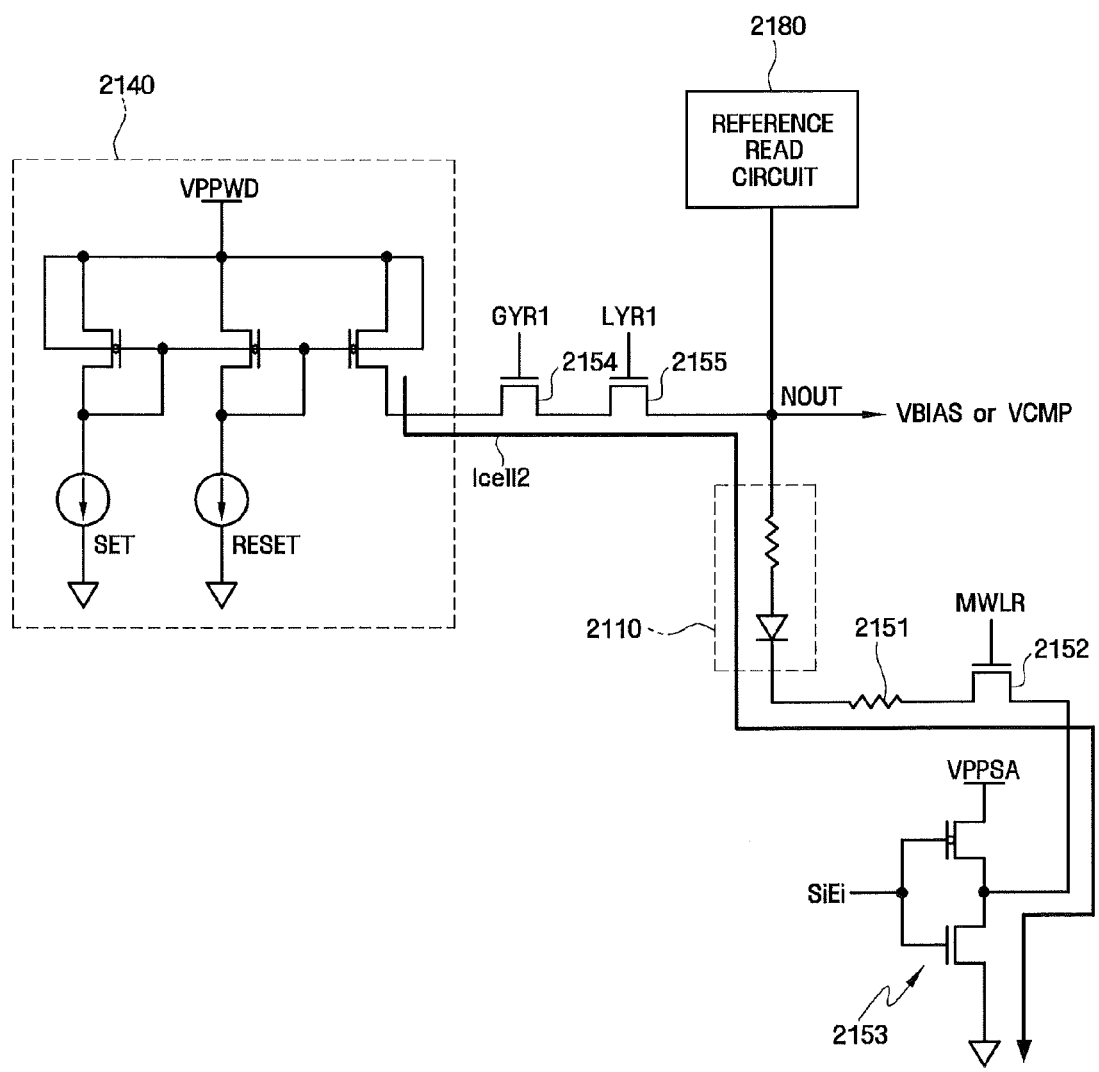
FIG. 15 is an exemplary circuit diagram of the reference write driver 2140 illustrated in FIG. 14 and a portion related to a write operation.

FIG. 15 is an exemplary circuit diagram of the reference write driver 2140 illustrated in FIG. 14 and a portion related to a write operation.

Referring to FIG. 15, the reference write driver 2140 supplies a write current Icell2 to write set data or reset data.

As illustrated in FIG. 15, the write current Icell2 is output to a ground voltage source via a first transistor 2154, a second transistor 2155, the reference cell 2110, a first resistor 2151, a third transistor 2152, and then an inverter 2153.

Here, a global column select replica signal GYR1 is transmitted to the first transistor 2154, a row column select replica signal LYR1 is transmitted to the second transistor 2155, and a main word line replica signal MWLR is transmitted to the third transistor 2152. That is, the first transistor 2154 is a replica of a global column select circuit, the second transistor 2155 is a replica of a row column select circuit, and the third transistor 2152 is a replica of a main word line select circuit. In addition, the first resistor 2151 is a replica of a resistor in an active region of a substrate. A path of the write current Icell2 used to write the reference cell 2110 may be made identical to a path of a write current used to write a nonvolatile memory cell by configuring the first transistor 2154, the second transistor 2155, the first resistor 2151, the third transistor 2152, and the inverter 2153 as described above.

Figure 16:
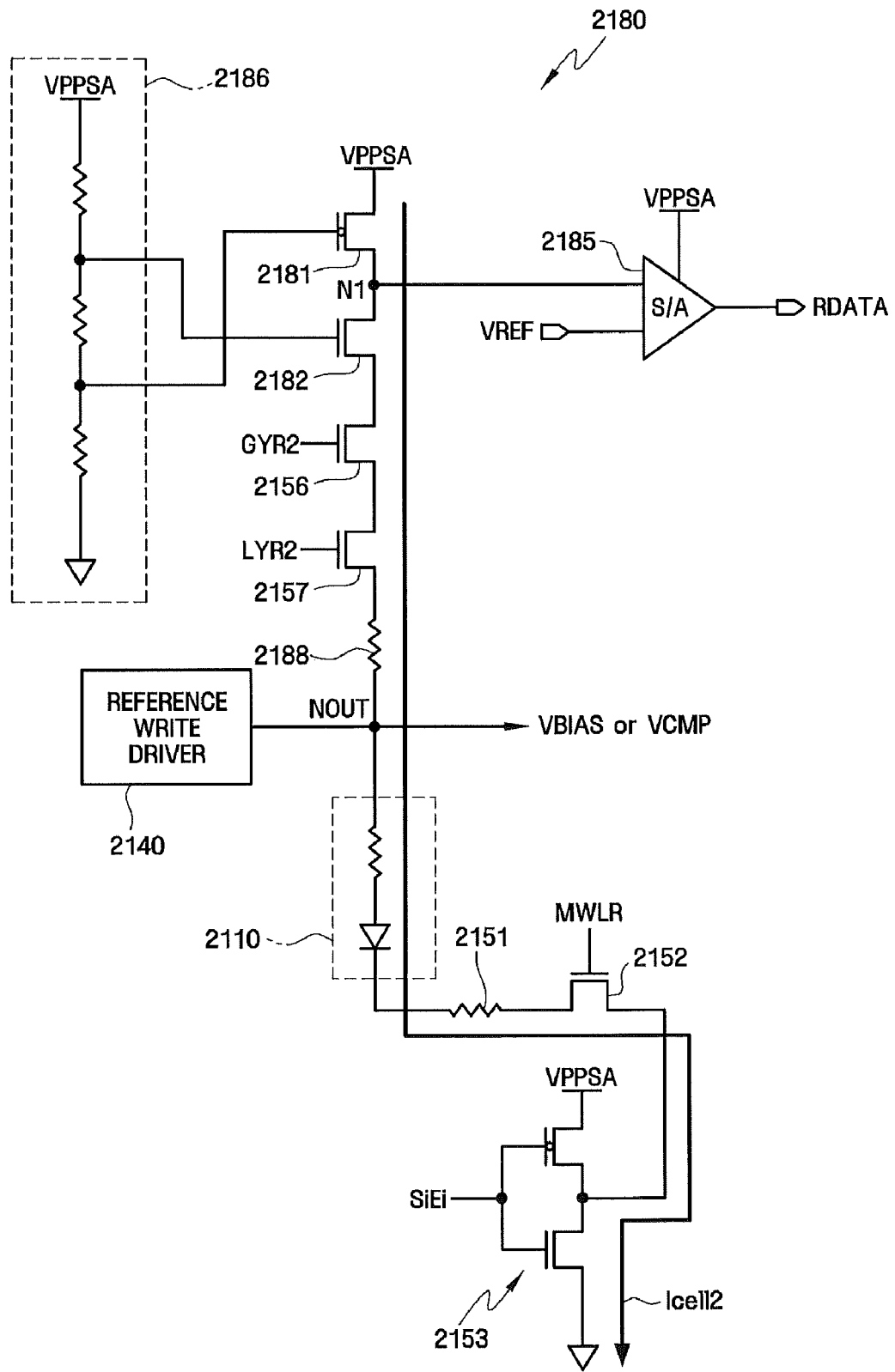
FIG. 16 is an exemplary circuit diagram of the reference read circuit 2180 illustrated in FIG. 14 and a portion related to a read operation.

FIG. 16 is an exemplary circuit diagram of the reference read circuit 2180 illustrated in FIG. 14 and a portion related to a read operation.

Referring to FIG. 16, the reference read circuit 2180 includes a fourth transistor 2181, a fifth transistor 2182, a sense amplifier 2185, a resistor string 2186, and a second resistor 2188.

The fourth transistor 2181 and the fifth transistor 2182 are connected in series between a step-up voltage source VPPSA and an output node NOUT. A plurality of resistors in the resistor string 2186 are connected in series between the step-up voltage source VPPSA and a ground voltage source and provides a first voltage and a second voltage. The first voltage is applied to a gate of the fourth transistor 2181, and the second voltage is applied to a gate of the fifth transistor 2182. Here, the fourth transistor 2181 is a replica of the compensation unit 1014 (see FIG. 9B), and the fifth transistor 2182 is a replica of the clamping unit 1016 (see FIG. 9B). The second resistor 2188 is, but not limited to, a replica of a hit line.

As illustrated in FIG. 16, a read current Icell3 is output to the ground voltage source via the step-up voltage source VPPSA, the fourth transistor 2181, the fifth transistor 2182, a sixth transistor 2156, a seventh transistor 2157, the second resistor 2188, the reference cell 2110, the first resistor 2151, the third transistor 2152, and then the inverter 2153.

Here, a global column select replica signal GYR2 is transmitted to the sixth transistor 2156, and a local column select replica signal LYR2 is transmitted to the seventh transistor 2157. That is, the sixth transistor 2156 is a replica of a global column select circuit, and the seventh transistor 2157 is a replica of a local column select circuit. A path of the read current Icell3 used to read the reference cell 2110 may be made identical to a path of a read current used to read a nonvolatile memory cell by configuring the fourth transistor 2181, the fifth transistor 2182, the sixth transistor 2156, the seventh transistor 2157, the first resistor 2151, the third transistor 2152, and the inverter 2153 as described above.

The sense amplifier 2185 outputs reference data RDATA by comparing a node N1 and a reference voltage VREF. The reference data RDATA is read to determine whether the resistance of the reference cell 2110 has a desired value.

When the resistance of the reference cell 2110 does not have the desired value, a write operation is performed again.

When the resistance of the reference cell 2110 has the desired value, the compensation control signal VBIAS or the clamp control signal VCMP may be output through the output node NOUT. For example, the voltage of the output node NOUT may also be output as the compensation control signal VBIAS or the clamp control signal VCMP.

Alternatively, as will be described with reference to FIG. 18, the voltage of the output node NOUT may be adjusted through trimming, and the adjusted voltage of the output node NOUT may be output as the compensation control signal VBIAS or the clamp control signal VCMP.

Alternatively, the resistance of the second resistor 2188 may be controlled to adjust a voltage that is output to the output node NOUT. This is because the voltage output to the output node NOUT may be a voltage divided by the resistance of the second resistor 2188 and that of the reference cell 2110. Here, it is assumed that the resistances of the fourth transistor 2181, the fifth transistor 2182, the sixth transistor 2156, the seventh transistor 2157, and the third transistor 2152 are significantly small. Since the resistance of the reference cell 2110 will be determined by a write operation, if the resistance of the second resistor 2188 is adjusted in a manufacturing process, the voltage output to the output node NOUT can be easily adjusted.

Figure 17:
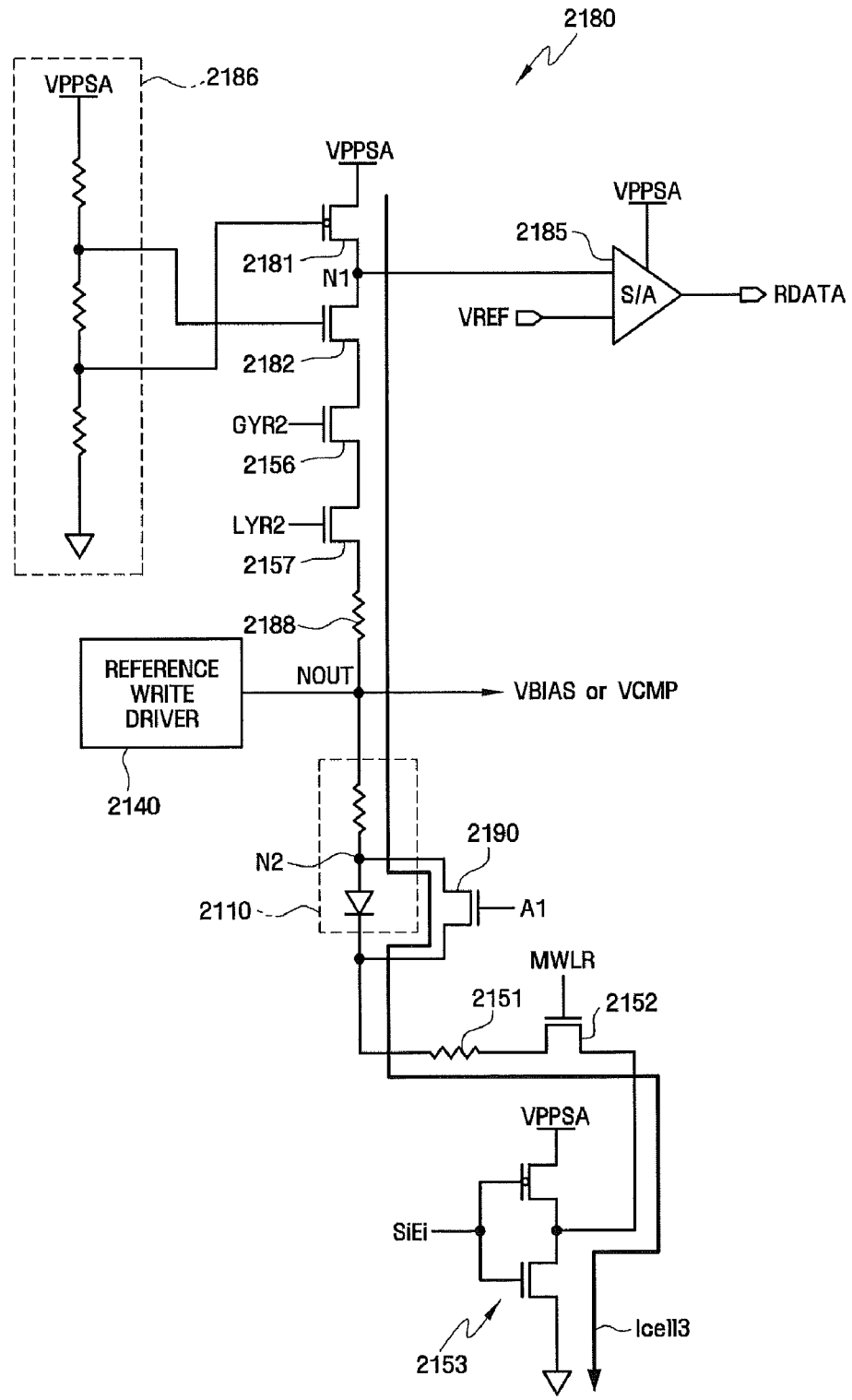
FIG. 17 is another exemplary circuit diagram of the reference read circuit 180 illustrated in FIG. 14 and a portion related to a read operation.

FIG. 17 is another exemplary circuit diagram of the reference read circuit 180 illustrated in FIG. 14 and a portion related to a read operation.

Referring to FIG. 17, the circuit of FIG. 17 is different from that of FIG. 16 in that it further includes a bypass circuit 2190. When a reference cell 2110 is read, the bypass circuit 2190 is turned on in response to a control signal A1. Therefore, while a read current Icell3 passes through a variable resistance element, it bypasses an access element (that is, a diode).

After the reference cell 2110 is read, if it is found out that the resistance of the reference cell 2110 does not have a desired value, the reference cell 2110 must be re-programmed. Thus, it is desirable to minimize the time required to read the reference cell 2110. The bypass circuit 2190 is implemented to reduce a period of time required by the read current Icell3 to pass through an n-type semiconductor of the diode, thereby reducing the total read time.

On the other hand, when a write operation is performed, the bypass circuit 2190 is turned off so that a current flows toward the access element (the diode).

Figure 18:
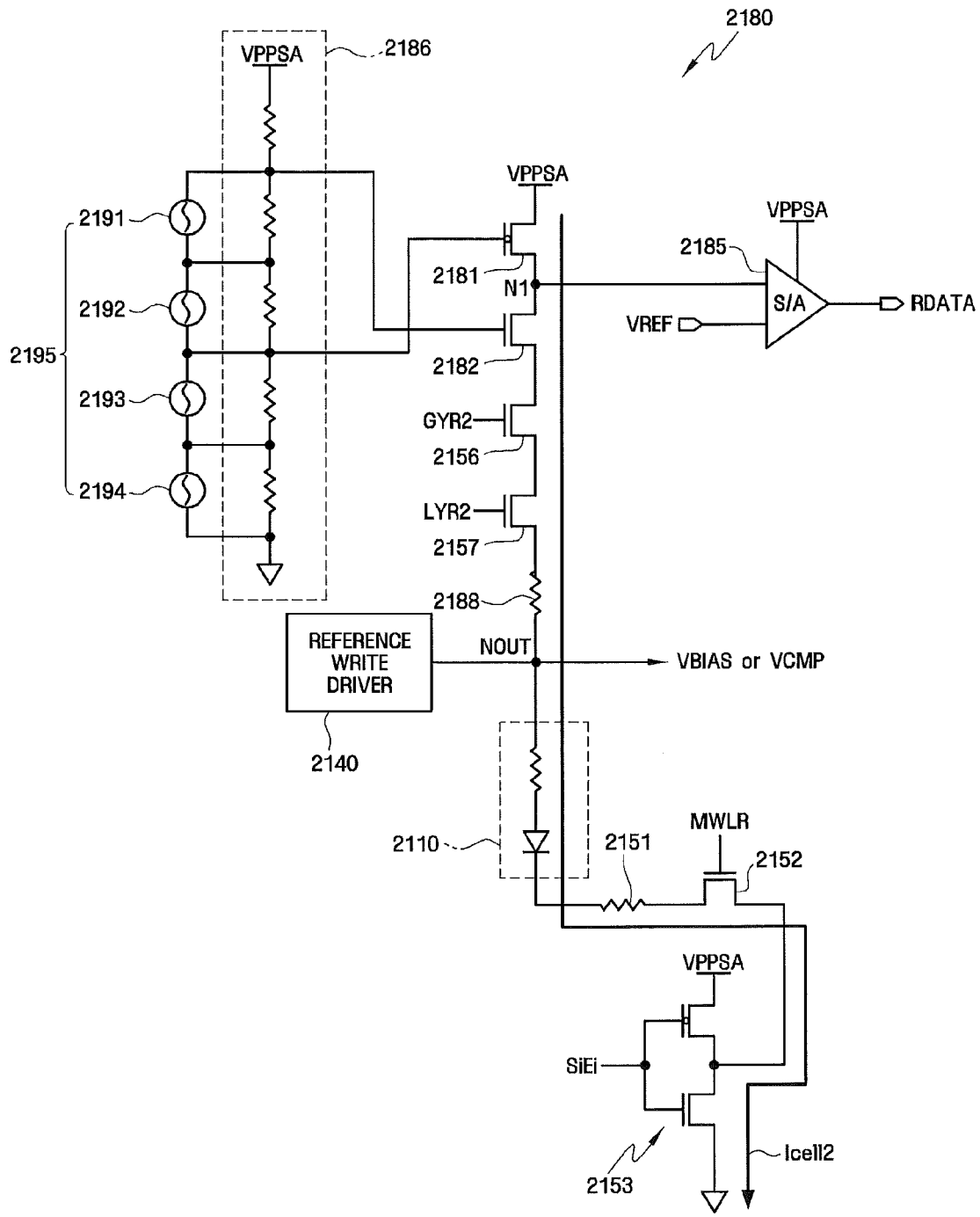
FIG. 18 is another exemplary circuit diagram of the reference read circuit 180 illustrated in FIG. 14 and a portion related to a read operation.

FIG. 18 is another exemplary circuit diagram of the reference read circuit 180 illustrated in FIG. 14 and a portion related to a read operation.

Referring to FIG. 18, the circuit of FIG. 18 is different from that of FIG. 16 in that it further includes a trimming circuit 2195. The trimming circuit 2195 may include a plurality of fuses 2191 through 2194.

At least one of the fuses 2191 through 2194 may be cut using a mode resister set (MRS) to adjust the level of voltage applied to a fourth transistor 2181 and a fifth transistor 2182.

A voltage value of a compensation control signal VBIAS or a clamp control signal VCMP output through an output node NOUT may be adjusted using the trimming circuit 2195. That is, even when the resistance of a reference cell 2110 has a desired value, if the voltage value of the compensation control signal VBIAS or the clamp control signal VCMP needs to be precisely adjusted, the trimming circuit 2195 can be used.

Figure 19:
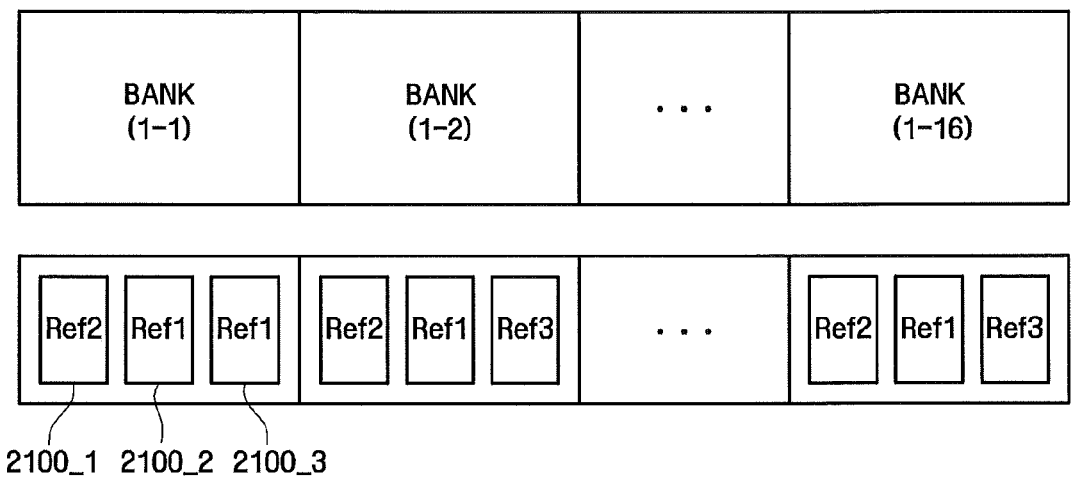
FIG. 19 is a diagram for explaining a nonvolatile memory device according to a sixth embodiment of the present invention.

FIG. 19 is a diagram for explaining a nonvolatile memory device according to a sixth embodiment of the present invention.

Referring to FIG. 19, a circuit of FIG. 19 is different from the circuit of FIG. 16 in that a plurality of reference sets are respectively disposed corresponding to a plurality of memory banks. As described above, when nonvolatile memory cells are 2 bit-level cells, there may be three ($=2^2-1$) reference cells, and each of the three reference cells may store a resistance value corresponding to one of resistance distributions Ref1 through Ref3. Therefore, as illustrated in FIG. 19, three temperature compensation circuits 2100_1 through 2100_3 may corresponds to each of the memory banks. Each of the three temperature compensation circuits 2100_1 through 2100_3 includes a corresponding one of the three reference cells.

Figure 20:
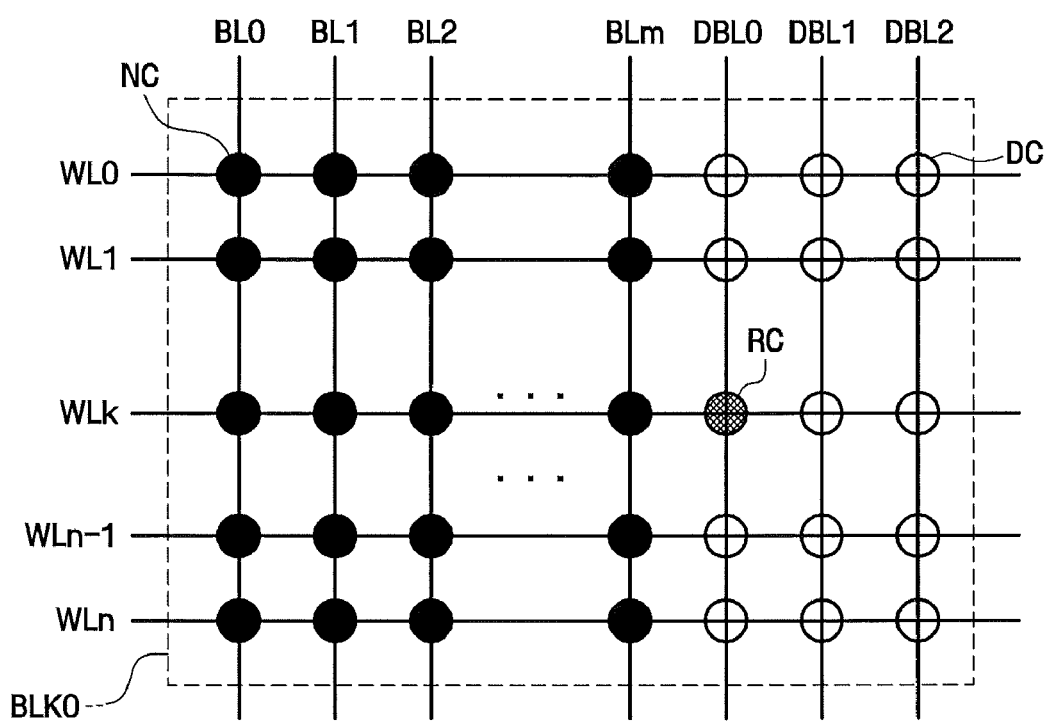
FIGS. 20 and 21 are diagrams for explaining nonvolatile memory devices according to sixth through eighth embodiments of the present invention.
Figure 21:
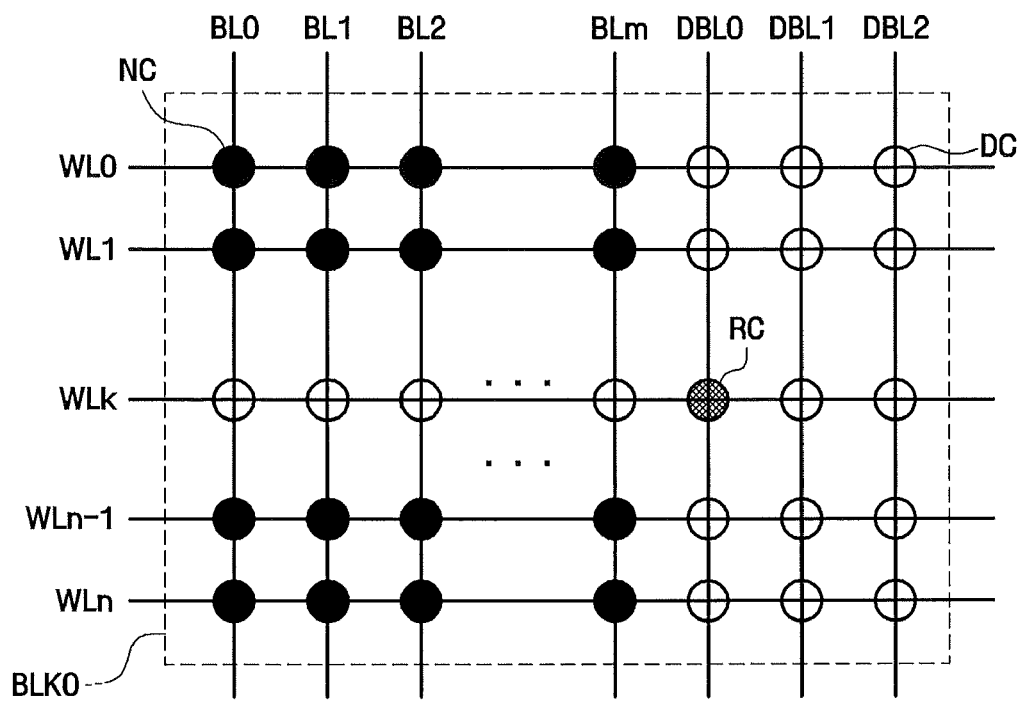

FIGS. 20 and 21 are diagrams for explaining nonvolatile memory devices according to sixth through eighth embodiments of the present invention. In FIGS. 20 and 21, a memory block BLK0 (see FIG. 1) is illustrated as an example, and the above-described reference cell is included in the memory block BLK0.

Referring to FIG. 20, normal memory cells NC are connected between word lines WL0 through WLn and bit lines BL0 through BLm. In addition, dummy memory cells DC are connected between dummy bit lines DBL0 through DBL2 and the word lines WL0 through WLn. A reference cell RC may be connected between the dummy bit line DBL0 and the word line WLk.

The normal memory cells NC are cells in which data is stored. The shape of the dummy memory cells DC may be identical to that of the normal memory cells NC. However, the dummy memory cells DC are cells in which no data is stored.

As described above, the reference cell RC is a cell used to adjust the amount of compensation current or clamping current by reflecting temperature changes.

As illustrated in FIG. 20, the reference cell RC may be located approximately in the middle of the dummy bit line DBL0 to prevent edge loading.

Referring to FIG. 21, the normal memory cells NC may not be connected to the word line WLk that is connected to the reference cell RC. That is, only the dummy memory cells DC in addition to the reference cell RC may be connected to the word line WLk.

Whenever data stored in all normal memory cells. NC in the memory block BLK0 is read, the reference cell RC may also be read. Accordingly, the word line WLk connected to the reference cell RC is very frequently connected to a ground voltage source. Thus, if the normal memory cells NC are connected to the word line WLk, they may be adversely affected. For this reason, the normal memory cells NC may not be connected to the word line WLk that is connected to the reference cell RC.

Figure 22:
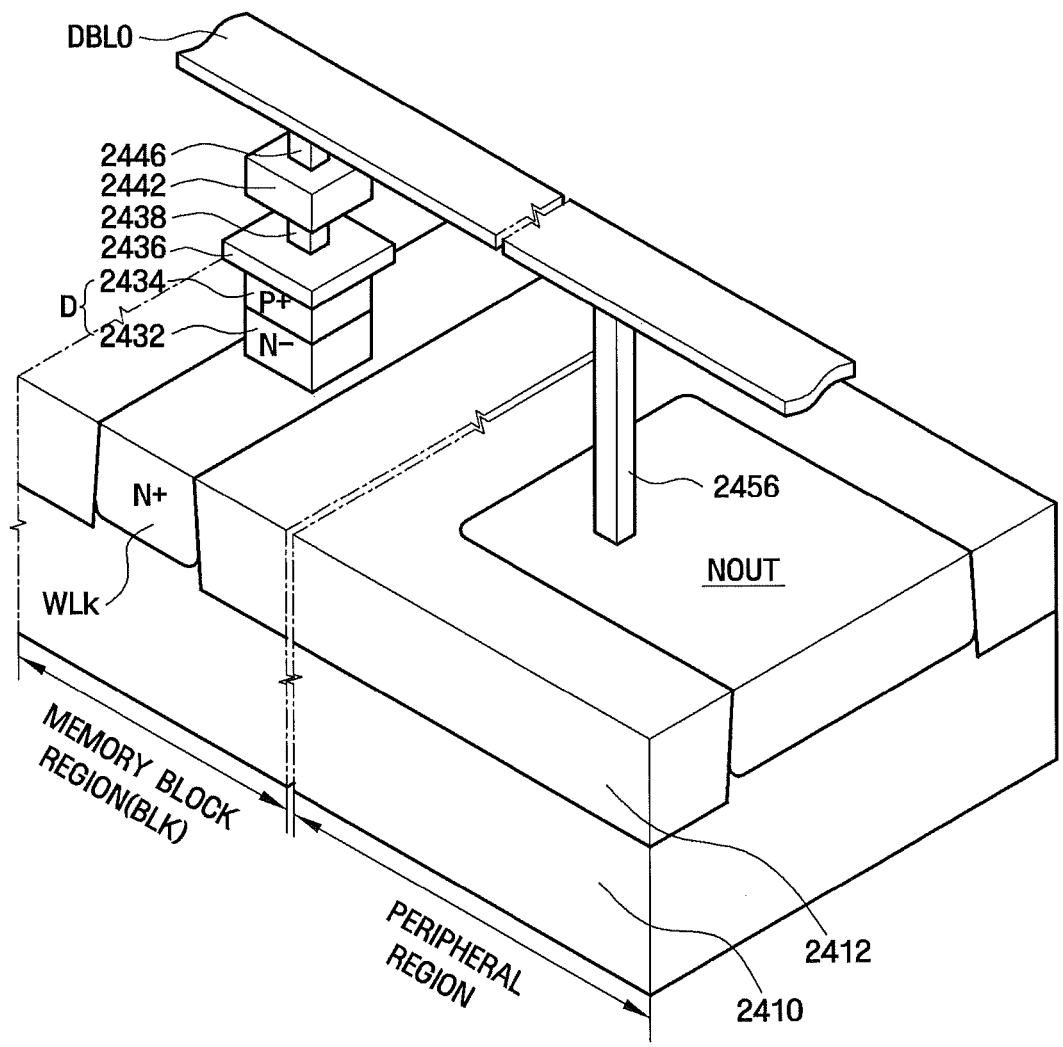
FIG. 22 is a perspective view of a nonvolatile memory device according to a ninth embodiment of the present invention.
Figure 23:
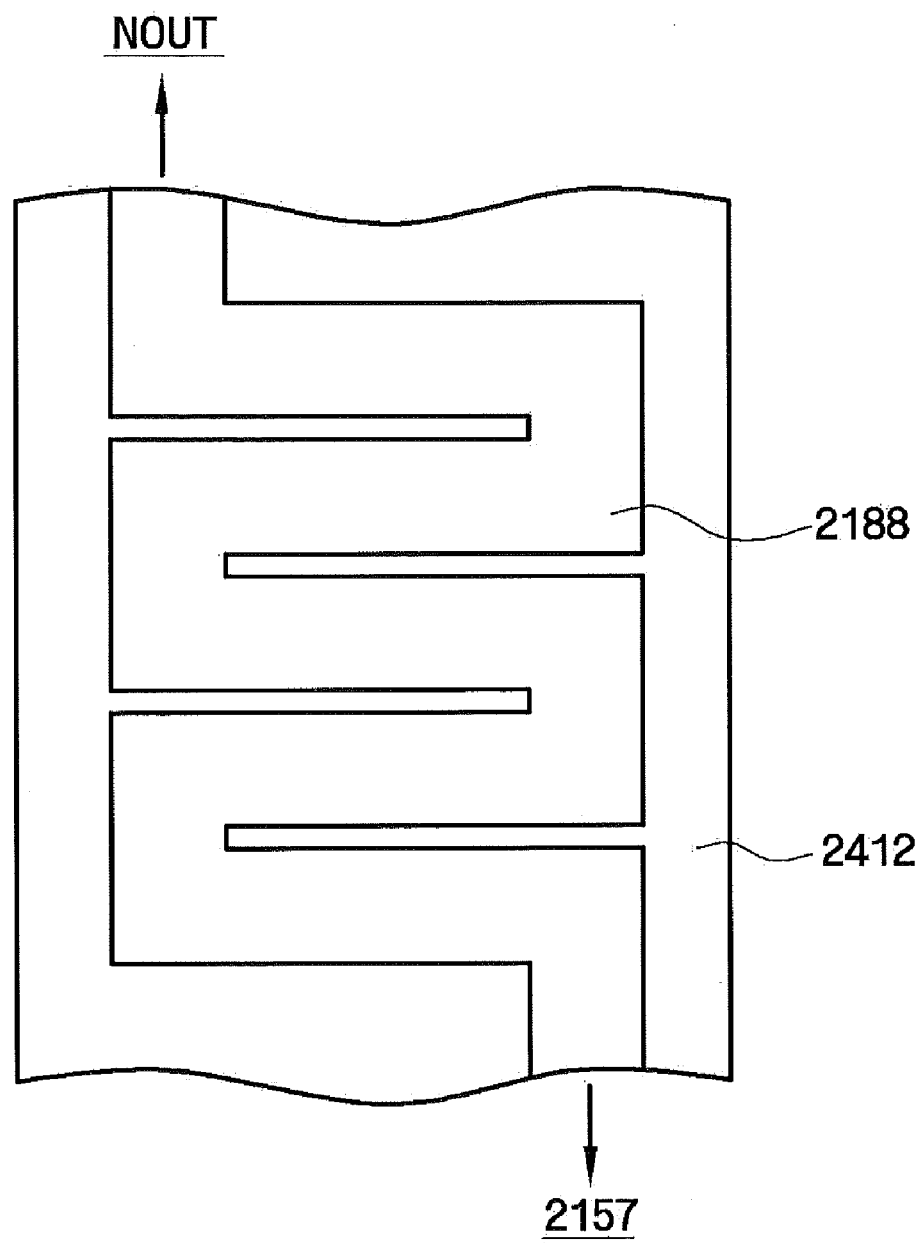
FIG. 23 is a layout diagram of a second resistor 188 included in the nonvolatile memory device according to the ninth embodiment of the present invention.

FIG. 22 is a perspective view of a nonvolatile memory device according to a ninth embodiment of the present invention. FIG. 23 is a layout diagram of a second resistor 188 included in the nonvolatile memory device according to the ninth embodiment of the present invention.

Referring to FIG. 22, when a reference cell RC is disposed within a memory block BLK0 as described above with reference to FIGS. 20 and 21, a reference write driver 140 and a reference read circuit 180 may be disposed in a peripheral region.

Specifically, an element isolation region 2412 is formed on a substrate 2410 of a first conductivity type (e.g., a P type) to define a plurality of active regions. For example, an active region formed in the memory block BLK0 may extend in, a first direction. The active region formed in the memory block BLK0 may be implanted with impurities of a second conductivity type (e.g., an N type) to form a word line WLk. The substrate 2410 may be a silicon substrate, a silicon-on-insulator (SOI) substrate, a gallium arsenic substrate, a silicon germanium substrate, or the like.

A method of forming the word line WLk by implanting the substrate 2410 of the first conductivity type with the impurities of the second conductivity type has been described above. However, the present invention is not limited to this method. For example, the word line WLk may also be formed by epitaxial growth on the substrate 2410.

A first semiconductor pattern 2432 and a second semiconductor pattern 2434 are formed on the word line WLk to form a diode D. To form the first and second semiconductor patterns 2432 and 2434, for example, a mold pattern may be formed on the substrate 2410, and then a semiconductor pattern may be formed along the mold pattern using selective epitaxial growth or solid phase epitaxial (SPE) growth. Then, an ion implantation process may be performed.

An ohmic contact layer 2436 is formed on the diode D. The ohmic contact layer 2436 may be made of metal such as tungsten. In addition, the ohmic contact layer 2436 may be formed by physical vapor deposition (PVD), chemical vapor deposition (CVD), atomic layer deposition (ALD), or the like.

A bottom electrode contact 2438 is formed on the ohmic contact layer 2436. The bottom electrode contact 2438 may be made of a material selected from TiN, TiAlN, TaN, WN, MoN, NbN, TiSiN, TiBN, ZrSiN, WSiN, WBN, ZrAlN, MoAlN, TaSiN, TaAlN, TiW, TiAl, TiON, TiAlON, WON, and TaON.

A phase-change material 2442 is formed on the bottom electrode contact 2438.

A top electrode contact 2446 is formed on the phase-change material 2442. The top electrode contact 2446 may be omitted when necessary.

A dummy hit line DBL0 is formed on the top electrode contact 2446 and extends in a second direction which is different from the first direction. That is, the word line WLk and the dummy bit line DBL0 may intersect each other. The dummy bit line DBL0 may extend up to the peripheral region. The dummy bit line DBL0 may contain aluminum, copper, or the like. For example, the dummy bit line DBL0 may be a lowest metal wiring layer.

A specified active region (a region corresponding to an output node NOUT) in the peripheral region may be connected to the dummy bit line DBL0 by a contact 2456. Unlike the illustration in FIG. 22, the contact 2456 may include a plurality of contacts that are stacked in a vertical direction.

The second resistor 2188 may be implemented in various ways. For example, referring to FIG. 23, the second resistor 2188 may be implemented by forming an active region in a zigzag pattern in the substrate 2410. That is, the second resistor 2188 may be implemented in an active region between a region in which the output node NOUT is implemented and a region in which a seventh transistor 2157 is to be formed. When this zigzag pattern is repeated a number of times, a physical length of the active region can be increased. Thus, the resistance of the second resistor 2188 can be easily adjusted.

Figure 24:
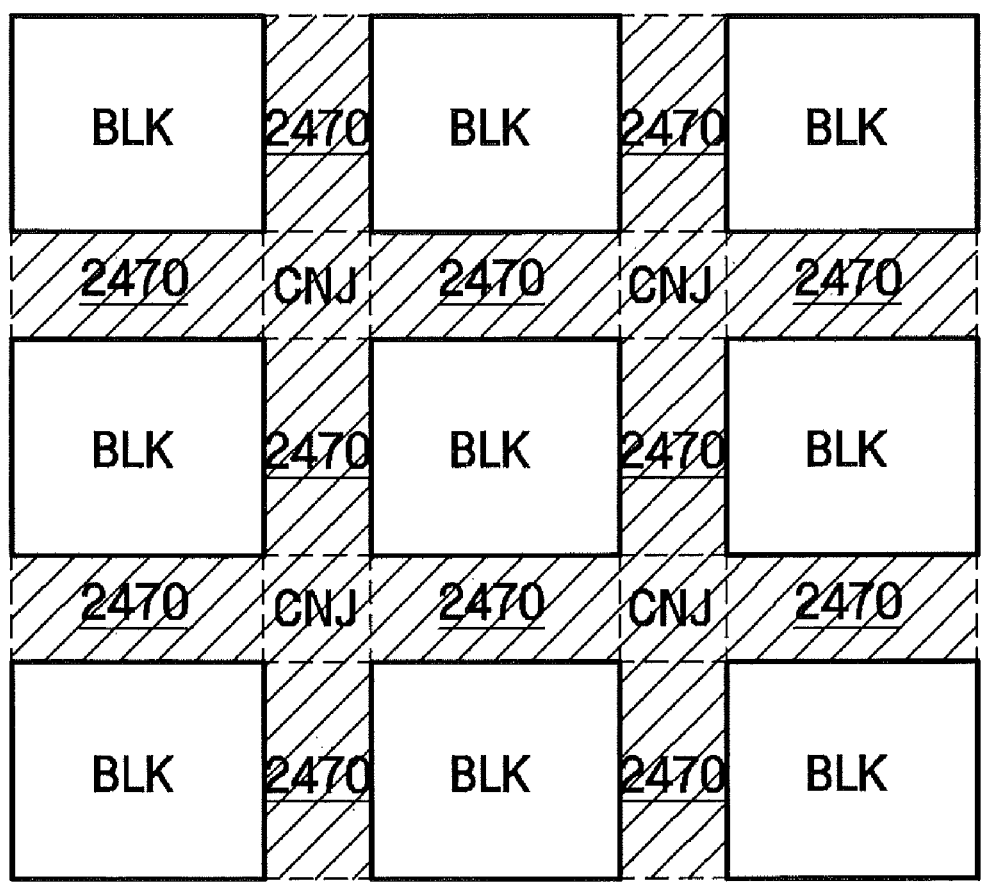
FIG. 24 is a layout diagram of a nonvolatile memory device according to a tenth embodiment of the present invention.
Figure 25:
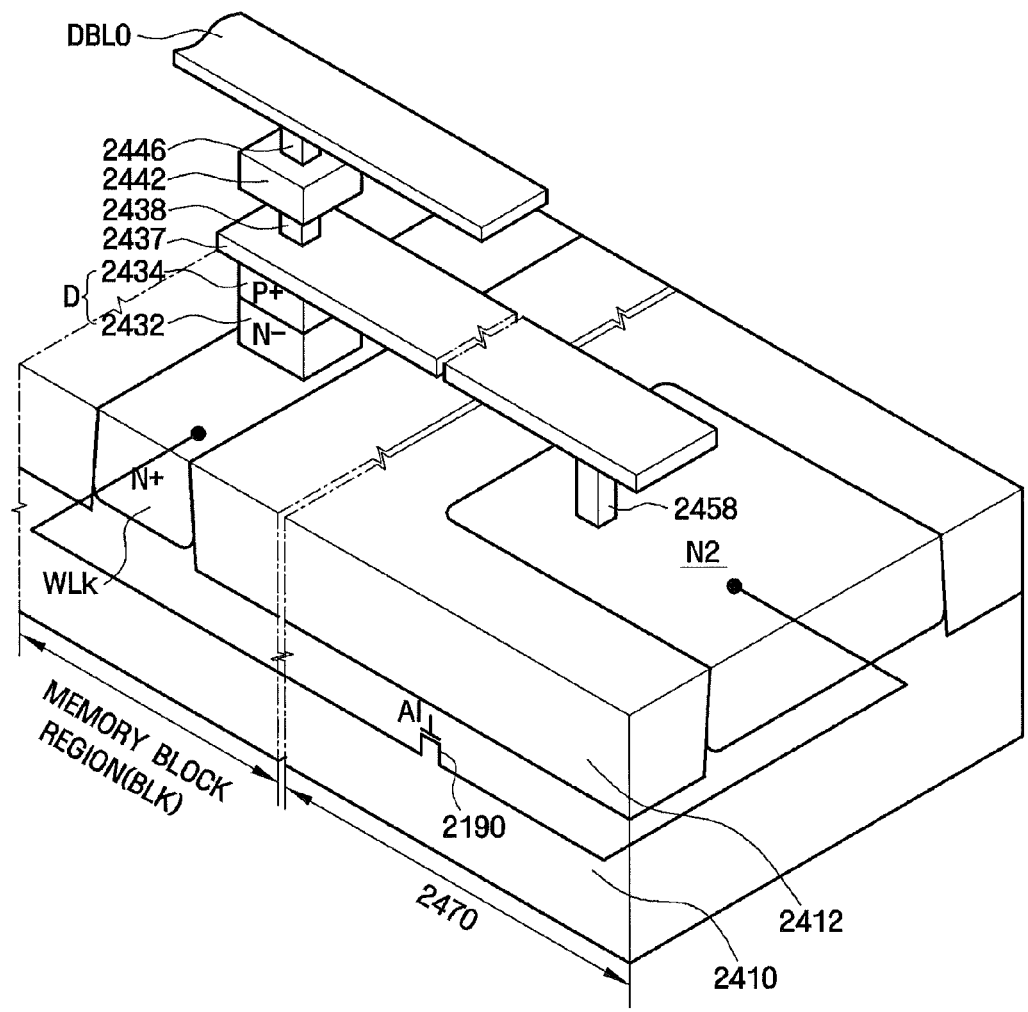
FIG. 25 is a perspective view of the nonvolatile memory device according to the tenth embodiment of the present invention.

FIG. 24 is a layout diagram of a nonvolatile memory device according to a tenth embodiment of the present invention. FIG. 25 is a perspective view of the nonvolatile memory device according to the tenth embodiment of the present invention. The illustrations in FIGS. 24 and 25 may be for implementing the circuit (which further includes the bypass circuit 2190) illustrated in FIG. 14.

Referring to FIG. 24, a plurality of memory blocks BLK are arranged in a 3×3 matrix. Regions 2470, in each of which a local column select circuit is disposed, may be located between the memory blocks BLK, and a conjunction region CNJ may be located between neighboring ones of the regions 2470.

In the tenth embodiment of the present invention, a reference cell RC may be disposed in each memory block BLK, and a bypass circuit 2190 may be disposed in each region 2470 in which the local column select circuit is located or in the conjunction region CNJ.

In FIG. 25, the bypass circuit 2190 is implemented in each region 2470. Referring to FIG. 25, an ohmic contact layer 2437 connected to the reference cell RC may extend from a memory block region to each of the regions 2470. A node N2 implemented in an active region, which is defined in each region 2470, and the ohmic contact layer 2437 are connected to each other by a contact 2458.

The bypass circuit 2190 is formed in each region 2470 and connected between the node N2 and the word line WLk.

Figure 26A:
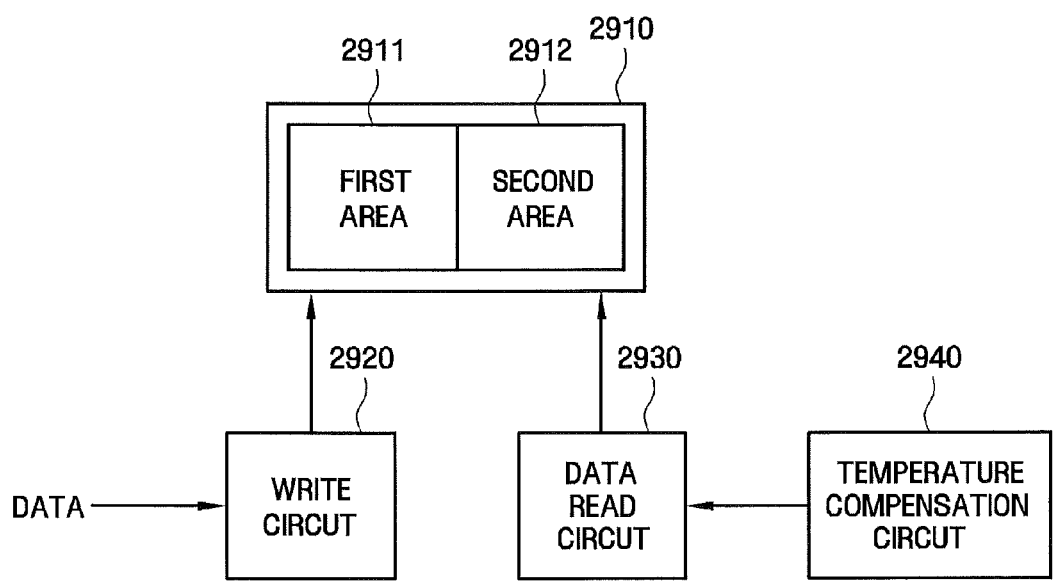
FIG. 26A is a diagram for explaining a variable resistance memory device according to an eleventh embodiment of the present invention.

FIG. 26A is a diagram for explaining a variable resistance memory device according to an eleventh embodiment of the present invention.

Referring to FIG. 26A, the variable resistance memory device may include a cell array 2910, a temperature compensation circuit 2940, a data read circuit 2930, and a write circuit 2920.

The memory cell array 2910 includes a plurality of resistance memory cells and is divided into a first area 2911 and a second area 2912 which are different from each other. That is, the memory cell array 2910 may be divided into a plurality of areas, depending on what it is used for. The first area 2911 may have a shorter response time and a faster access time than the second area 2912. In addition, the first area 2911 may replace a main memory, and the second area 2912 may replace a hard disk drive (HDD).

As described above, the temperature compensation circuit 2940 may include one or more reference cells.

As described above, the data read circuit 2930 may perform a read operation by supplying a current, which changes according to the resistance of the reference cells, to one or more of the resistance memory cells.

The write circuit 2920 examines data provided by an external source and writes the data to the first area 2911 or the second area 2912 based on the examination result. The data provided by the external source may include a code, which indicates whether the data must be stored in the first area 2911 or the second area 2912, in a data header. Therefore, the write circuit 2920 may examine the code and determine whether to write the data to the first area 2911 or the second area 2912.

The second area 2912 may have a hierarchical structure described above in the first through fourth embodiments. The variable resistance memory device may include a global bit line, which is connected to a write circuit and a read circuit, one or more local bit lines, which are coupled to the resistance memory cells disposed in the second area 2912, and a plurality of column select transistors. Here, each of the column select transistors may selectively connect the global bit line to any one of the local bit lines.

The resistance of a column select transistor located far from the write circuit and the read circuit may be smaller than that of a column select transistor located close to the write circuit and the read circuit. Alternatively, the column select transistor located far from the write circuit and the read circuit may be larger than the column select transistor located close to the write circuit and the read circuit. The doping concentration of a channel region of the column select transistor located far from the write circuit and the read circuit may be higher than that of a channel region of a column select transistor located close to the write circuit and/or the read circuit.

The first area 2911 or the second area 2912 may include a temperature compensation circuit which includes a reference cell and which has been described above in the fifth through tenth embodiments. Therefore, a read operation may be performed by supplying a current, which changes according to the resistance of one reference cell, to one or more of the resistance memory cells.

FIG. 26B is a flowchart illustrating a method of driving the nonvolatile memory devices according to the fifth and seventh embodiments of the present invention.

Referring to FIGS. 14 and 26B, a memory cell array, which includes m bit-level cells ("m" is a natural number), and a reference set, which includes $2^m-1$ reference cells, are provided.

The $2^m-1$ reference cells included in one reference set are written such that the $2^m-1$ reference cells respectively have different resistance distributions (operation S2210).

For example, when the m bit-level cells are 2 bit-level cells, there may be three ($=2^2-1$) reference cells, and the three reference cells may respectively store resistance values corresponding to resistance distributions Ref1 through Ref3.

Data is written to the m bit-level cells (operation S2220).

Then, a current, which changes according to the resistance of the $2^m-1$ reference cells, is supplied to the m bit-level cells to read data from the m bit-level cells (operation S2230).

For example, a compensation current, which changes according to a resistance value corresponding to each of the resistance distributions Ref1 through Ref3 sequentially, is supplied to the m bit-level cells in order to read data.

Application Embodiments

FIGS. 27 through 31 are diagrams for explaining storage systems according to first through fifth embodiments of the present invention. Specifically, FIGS. 27 through 31 illustrate storage systems using the nonvolatile memory devices according to the fifth through tenth embodiments of the present invention.

Figure 27:
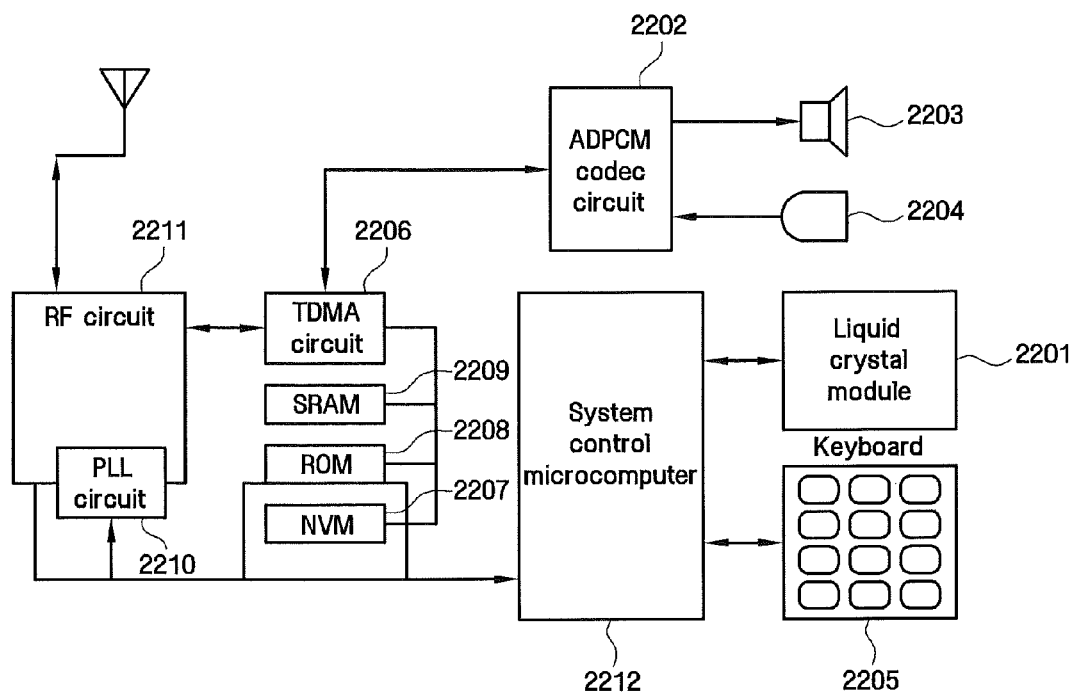
FIGS. 27 through 31 are diagrams for explaining storage systems according to first through fifth embodiments of the present invention.

FIG. 27 is a diagram illustrating a cellular phone system that uses nonvolatile memory devices according to embodiments of the present invention.

Referring to FIG. 27, the cellular phone system may include an adaptive differential pulse code modulation (AD-PCM) codec circuit 2202 which compresses sound or decompresses compressed sound, a speaker 203, a microphone 2204, a time division multiplex access (TDMA) circuit 2206 which time-division multiplexes digital data, a phase-locked loop (PLL) circuit 2210 which sets a carrier frequency of a wireless signal, and a radio frequency (RF) circuit 2211 which transmits or receives a wireless signal.

In addition, the cellular phone system may include various types of memory devices. For example, the cellular phone system may include a nonvolatile memory device 2207, a read only memory (ROM) 2208, and a static random access memory (SRAM) 2209. The nonvolatile memory device 2207 may be any one of the nonvolatile memory devices according to the embodiments of the present invention and may store, for example, an identification (ID) number. The ROM 2208 may store programs, and the SRAM 2209 may serve as a work area for a system control microcomputer 2212 or temporarily store data. The system control microcomputer 2212 is a processor and may control a write operation and a read operation of the nonvolatile memory device 2207.

Figure 28:
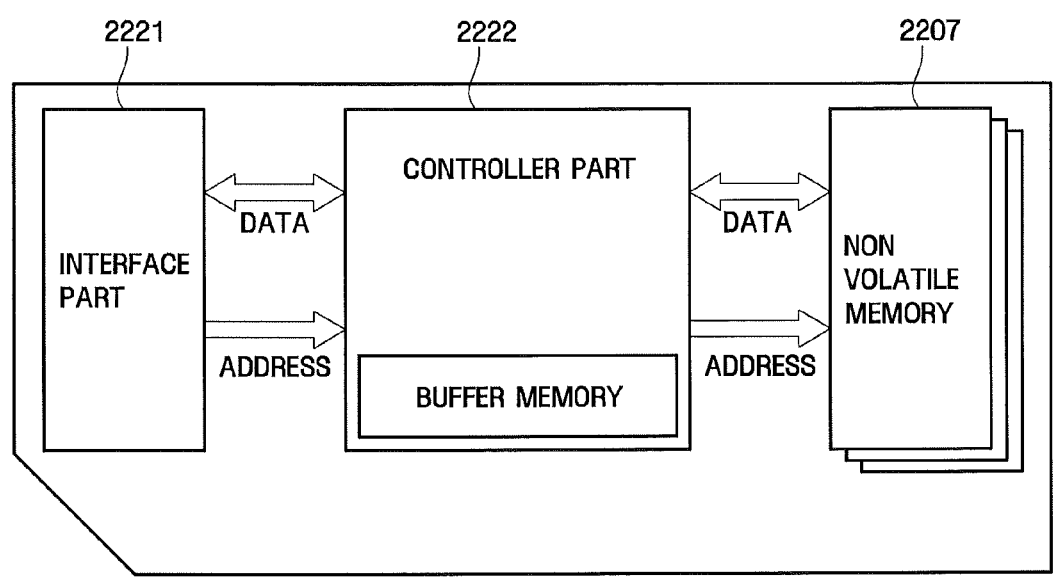

FIG. 28 is a diagram illustrating a memory card which uses nonvolatile memory devices according to embodiments of the present invention. The memory card may be, for example, a multimedia card (MMC), a secure digital (SD) card, a multiuse card, a micro SD card, a memory stick, a compact SD card, an ID card, a personal computer memory card international association (PCMCIA) card, a solid-state drive (SSD) card, a chip card, a smart card, or a universal serial bus (USB) card.

Referring to FIG. 28, the memory card may include an interface part 2221 which interfaces with an external device, a controller part 2222 which includes a buffer memory and controls the operation of the memory card, and one or more nonvolatile memories 2207 according to embodiments of the present invention. The controller part 2222 is a processor and may control the write and read operations of the nonvolatile memories 2207. Specifically, the controller part 2222 is coupled to each of the interface part 2221 and the nonvolatile memory devices 2207 by a data bus DATA and an address bus ADDRESS.

Figure 29:
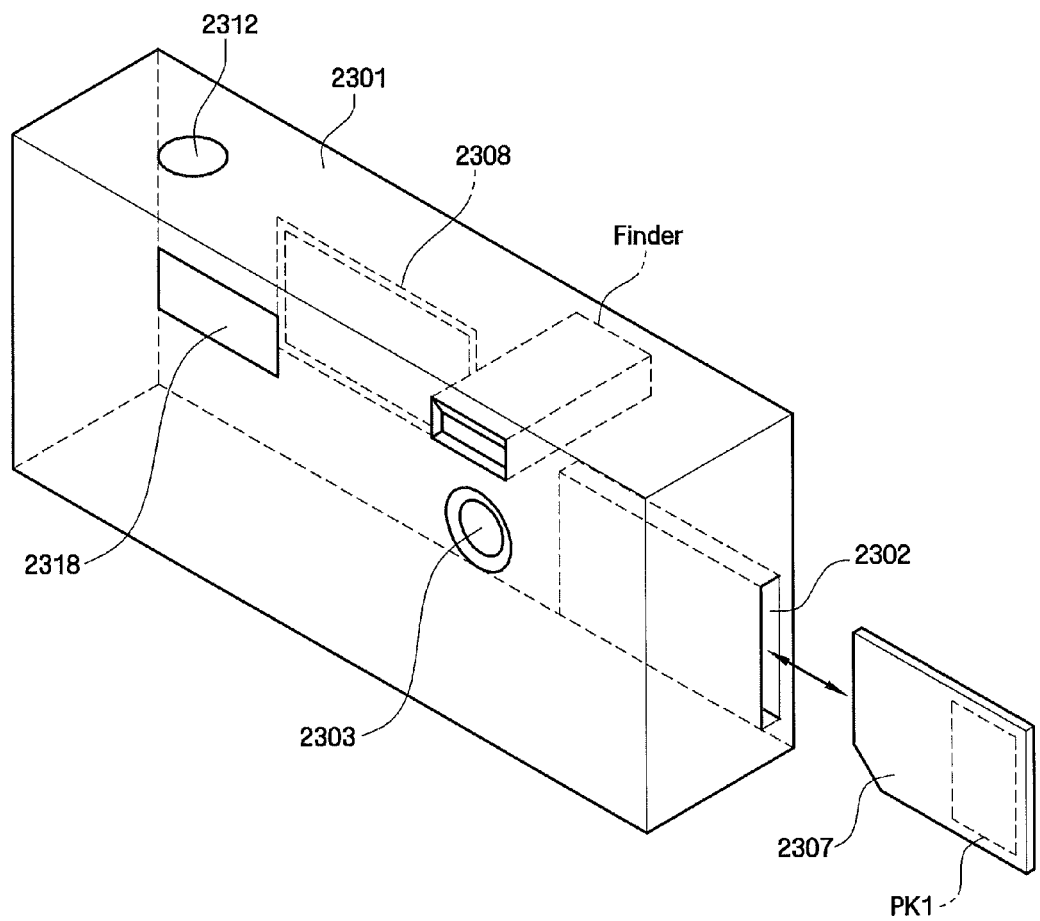

FIG. 29 is a diagram illustrating a digital still camera that uses nonvolatile memory devices according to embodiments of the present invention.

Referring to FIG. 29, the digital still camera includes a body 2301, a slot 2302, a lens 2303, a display 2308, a shutter button 2312, and a strobe 2318. In particular, a memory card 2307 may be inserted into the slot 2302 and include one or more nonvolatile memory devices PK1 according to embodiments of the present invention.

If the memory card 2307 is of a contact type, it electrically contacts a specified electrical circuit on a circuit board when it is inserted into the slot 2302. When the memory card 2331 is of a non-contact type, it communicates with the memory card 2307 using a wireless signal.

Figure 30:
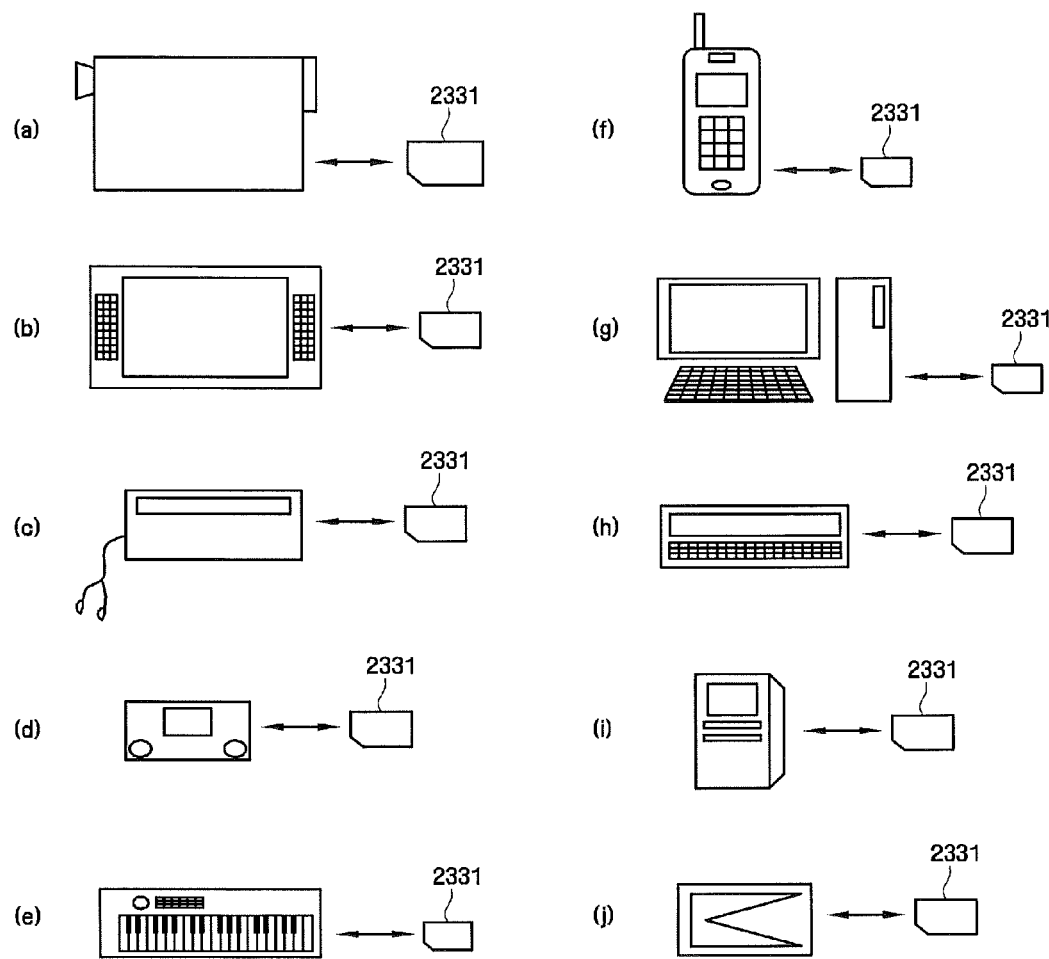

FIG. 30 is a diagram illustrating various systems that use the memory card of FIG. 28.

Referring to FIG. 30, a memory card 2331 may be used in (a) a video camera, (b) a television, (c) an audio device, (d) a game device, (e) an electronic music device, (f) a mobile phone, (g) a computer, (h) a personal digital assistant (PDA), (i) a voice recorder, and (j) a personal computer (PC) card.

Figure 31:
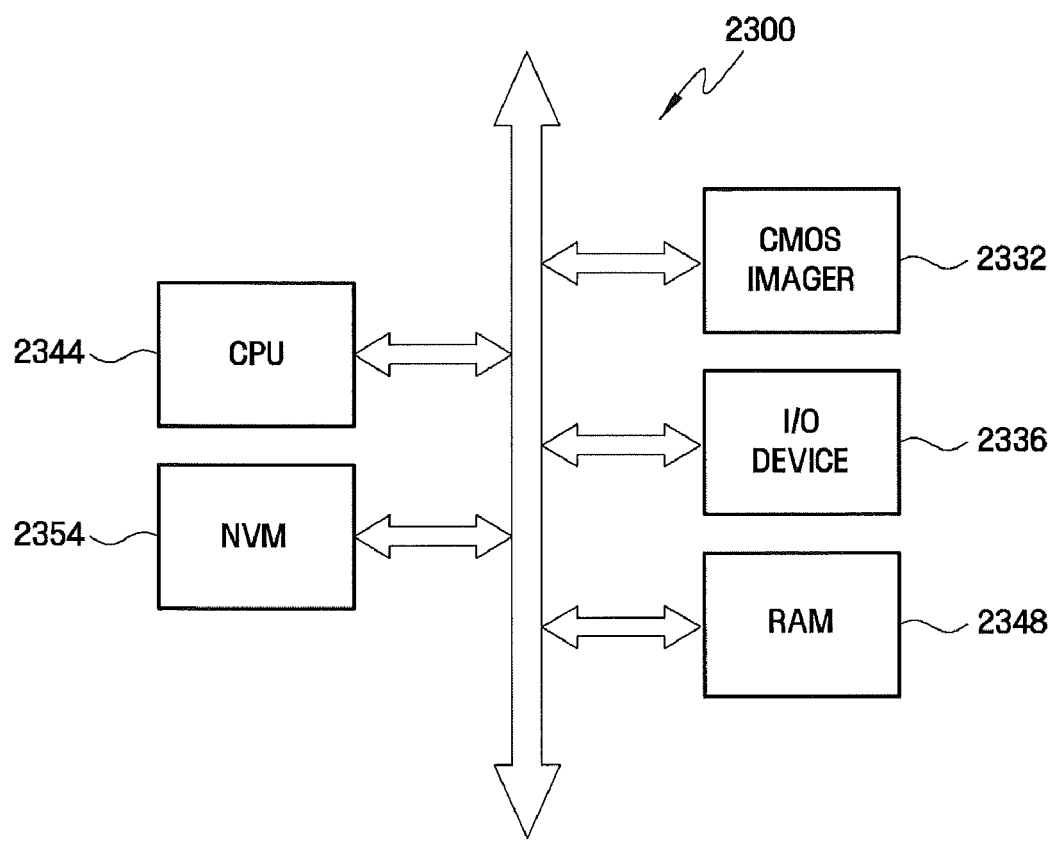

FIG. 31 is a diagram illustrating an image sensor system that uses nonvolatile memory devices according to embodiments of the present invention.

Referring to FIG. 31, the image sensor system may include an imager 2332, an input/output device 2336, a random access memory (RAM) 2348, a central processing unit (CPU) 2344, and a nonvolatile memory device 2354 according to embodiments of the present invention. These components, i.e., the imager 2332, the input/output device 2336, the RAM 2348, the CPU 2344, and the nonvolatile memory device 2354 communicate with each other using a bus 2352. The imager 2332 may include a photo sensing element such as a photogate or a photodiode. Each of the above components and a processor may be implemented as a single chip or separate chips.

Figure 32:
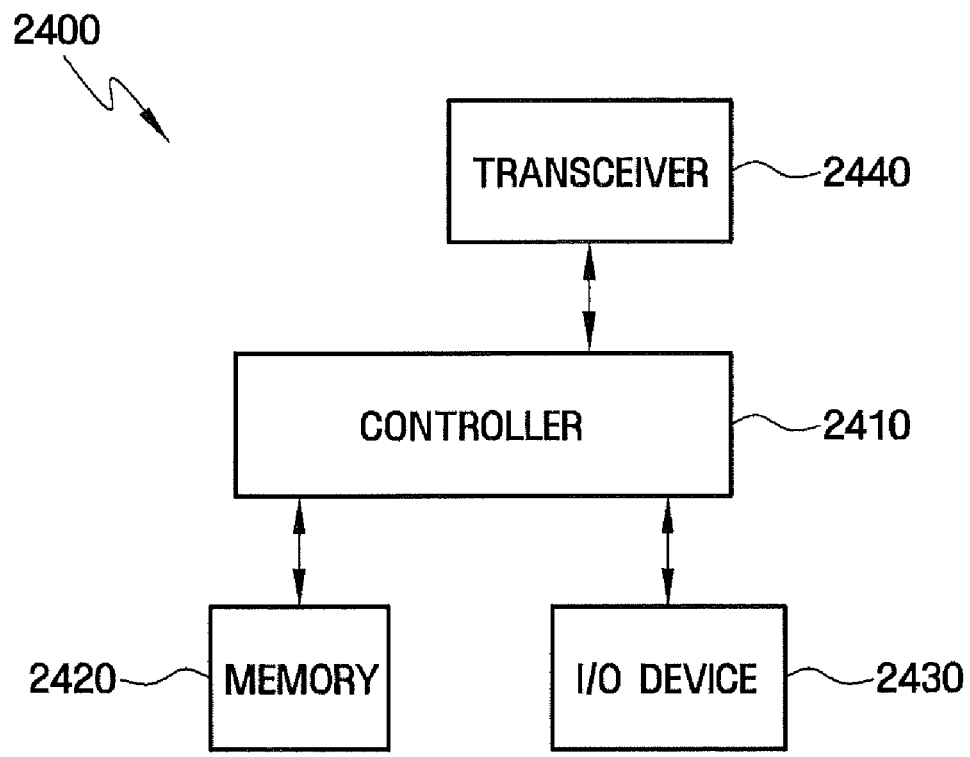
FIG. 32 is a schematic block diagram of a portable media system including phase-change random access memory device according to embodiments of the present invention.

FIG. 32 is a schematic block diagram of a portable media system including phase-change random access memory device according to embodiments of the present invention. In an embodiment of the present invention, a mobile phone as the portable media system is described by way of example, but the invention is not limited thereto. Rather, the invention may also be applied to a two-way communications system, a one-way pager, a two-way pager, a personal communications system, a portable computer, a personal data assistance (PDA), an MPEG audio layer-3 (MP3) player, a digital camera, and other electronic devices.

Referring to FIG. 32, the portable media system 2400 includes a controller 2410, a memory unit 2420, an I/O device 2430, and a transceiver 2440.

The controller 2410 may, for example, include microprocessors, digital signal processors, microcontrollers, and the like.

The memory 2420 stores messages transmitted to the portable media system 400 or an external device. That is to say, the memory 2420 stores data or instructions executed by the controller while the portable media system 2400 is operating. The memory 2420 is composed of one or more different kinds of memories. For example, the memory 2420 may be a volatile memory device, or a nonvolatile memory device such as a flash memory device and/or a phase-change memory device. Here, usable examples of the phase-change memory device include PRAMs according to preferred embodiments of the present invention.

In particular, the most challenging task of the portable media system 2400 is to minimize the amount of current consumed. As described in the foregoing embodiments of the present invention, the current and power consumption can be minimized by decreasing resistance of a column select transistor in a phase-change memory cell far away from a write and/or read circuit, thereby improving reliability during write and/or read operation.

The portable media system 2400 may transmit or receive messages in a wireless manner through the transceiver 2440 connected to an antenna (not shown). Here, the portable media system 2400 may transmit or receive messages using protocols such as CDMA (Code Division Multiple Access), GSM (Global System for Mobile communication), NADC (North 20 American Digital Cellular), TDMA (Time Division Multiple Access), ETDMA (Extended TDMA), third-generation WCDMA (Wideband CDMA), CDMA-2000, etc.

The I/O device 2430 generates a message by user's manipulation. The I/O device 2430 may comprise a keypad, a monitor, and the like.

A phase-change random access memory device of the present invention provides at least one of the following advantages. First, the phase-change random access memory device of the present invention can prevent failures during write and/or read operations. Second, the phase-change random access memory device provides a phase-change memory cell in which a reset state can be written surely, and whereby the resistance margin of the phase-change memory cells increase by reducing a distribution of set resistance, which improves the reliability of phase-change memory cells. Third, the phase-change random access memory device can decrease the level of write current and/or read current, thereby reducing current consumption.

Figure 33:
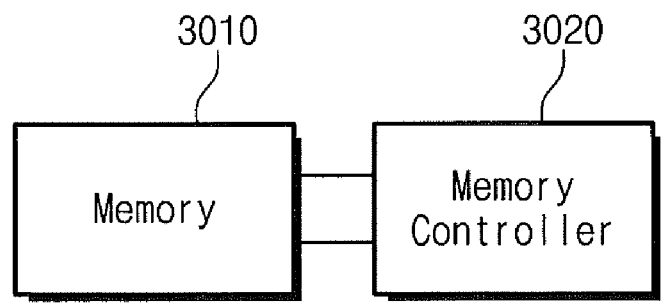
FIG. 33 through FIG. 40 illustrate an example embodiment of an application of the semiconductor device.

FIG. 33 illustrates an example embodiment of an application of the semiconductor device. As shown, this embodiment includes a memory 3010 connected to a memory controller 3020. The memory 3010 may be any of the semiconductor device embodiments described above. The memory controller 3020 supplies the input signals for controlling operation of the memory 3010. For example, the memory controller 3020 supplies the command CMD and address signals. The memory controller 3020 may include a memory interface, a host interface, an ECC circuit, a central processing unit (CPU), and a buffer memory. The memory interface provides data transmitted from the buffer memory to the memory 3010 or transmits data read out of the memory 3010 to the buffer memory. Also the memory interface may provide a command or an address transmitted from an external host to the memory 3010.

The host interface may communicate with an external host through USB (Universal Serial Bus), SCSI (Small Computer System Interface), PCI express, ATA, PATA (Parallel ATA), SATA (Serial ATA), SAS (Serial Attached SCSI).

A memory system according to embodiments of the present invention may include an ECC circuit, which generates a parity bit using data transmitted to a memory 3010. The generated parity bit may be stored in a specific area of the memory 3010, together with data. The ECC circuit detects an error of data read out of the memory 3010. If the detected error is within a correction range, the ECC circuit corrects the detected error.

The CPU processes a signal input from the external host after analyzing the input signal. The CPU controls the external host or the memory 3010 through the host interface or the memory interface. The CPU may control write, read, and erase operations depending on firmware for driving a memory.

The buffer memory temporarily stores write data provided from the external host or data read out of the memory 3010. Also the buffer memory may store meta data or cache data to stored in the memory 3010. During a sudden power-off operation, meta data or cache data stored in the buffer memory may be stored in the memory 3010. The buffer memory may include a DRAM and an SRAM.

Figure 34:
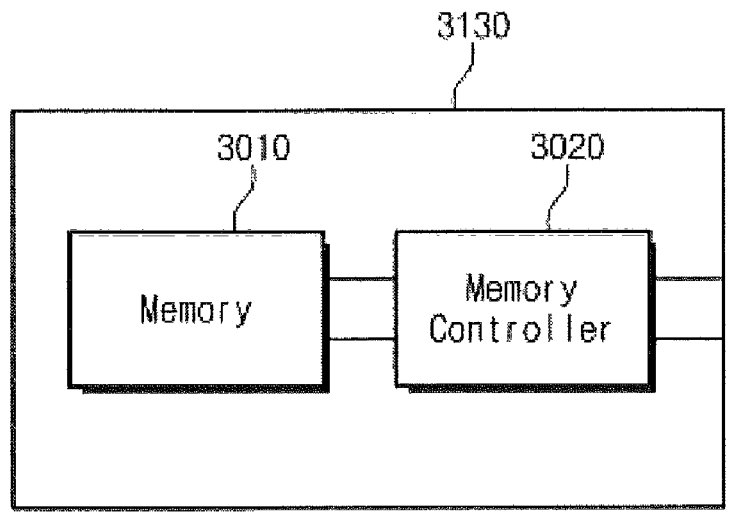

FIG. 34 illustrates yet another embodiment. This embodiment is the same as the embodiment of FIG. 33, except that the memory 3010 and memory controller 3020 have been embodied as a card 3130. For example, the card 3130 may be a memory card such as a flash memory card. Namely, the card 3130 may be a card meeting any industry standard for use with a consumer electronics device such as a digital camera, personal computer, etc. It will be appreciated that the memory controller 3020 may control the memory 3010 based on controls signals received by the card 3130 from another (e.g., external) device.

Figure 35:
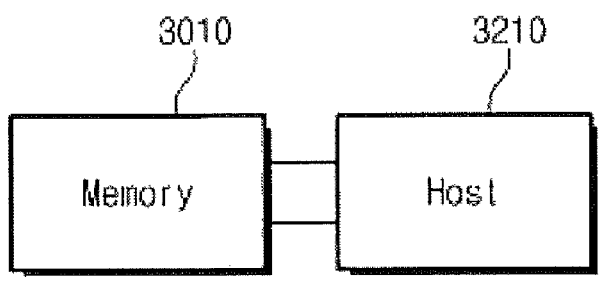

FIG. 35 illustrates a still further embodiment of the present invention. As shown, the memory 3010 may be connected with a host system 3210. The host system 3210 may be a processing system such as a personal computer, digital camera, etc. The host system 3210 may use the memory 3010 as a removable storage medium. As will be appreciated, the host system 3210 supplies the input signals for controlling operation of the memory 3010. For example, the host system 3210 supplies the command CMD and address signals.

Figure 36:
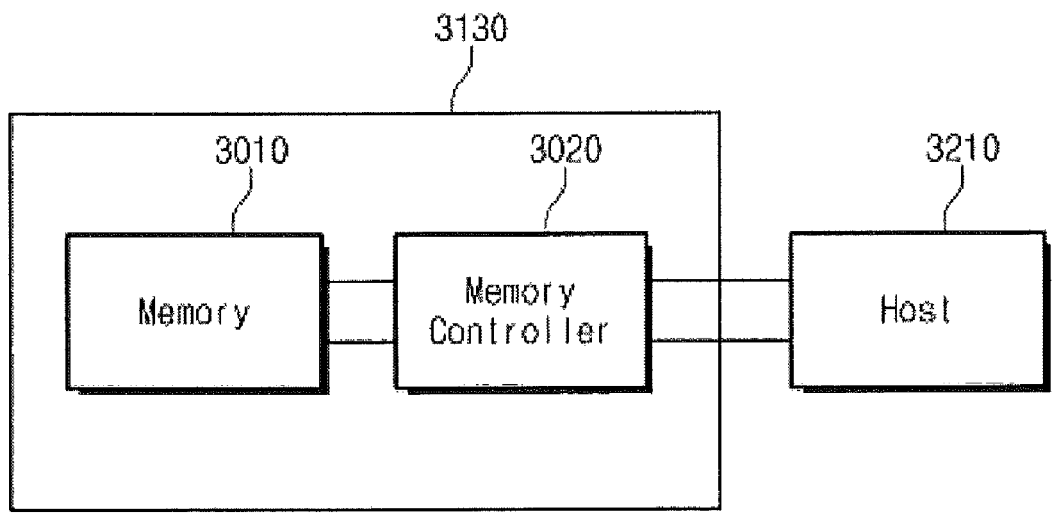

FIG. 36 illustrates an embodiment of the present invention in which the host system 3210 is connected to the card 3130. In this embodiment, the host system 3210 applies control signals to the card 3130 such that the memory controller 3020 controls operation of the memory 3010.

Figure 37:
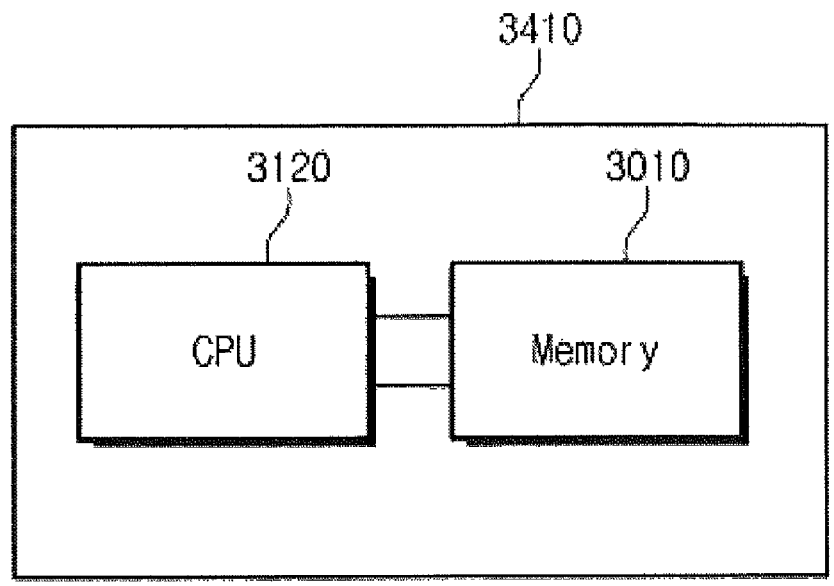

FIG. 37 illustrates a further embodiment of the present invention. As shown, the memory 3010 may be connected to a central processing unit (CPU) 3420 within a computer system 3410. For example, the computer system 3410 may be a personal computer, personal data assistant, etc. The memory 3010 may be directly connected with the CPU 3420, connected via a bus, etc. It will be appreciated, that FIG. 42 does not illustrate the full complement of components that may be included within a computer system 3410 for the sake of clarity.

A semiconductor device according to some embodiments of the present invention may be used as a storage class memory (SCM), which is the general concept of memories capable of simultaneously providing nonvolatile characteristics and access characteristics. The storage class memory may be utilized as not only a data storage space but also a program performing space.

The above-described PRAM, FeRAM, and MRAM may be appropriate examples of a storage class memory. Such a storage class memory may be used as not only a data storage memory instead of a flash memory but also a main memory instead of an SRAM. Moreover, one storage class memory may be used instead of a flash memory and an SRAM.

Figure 38:
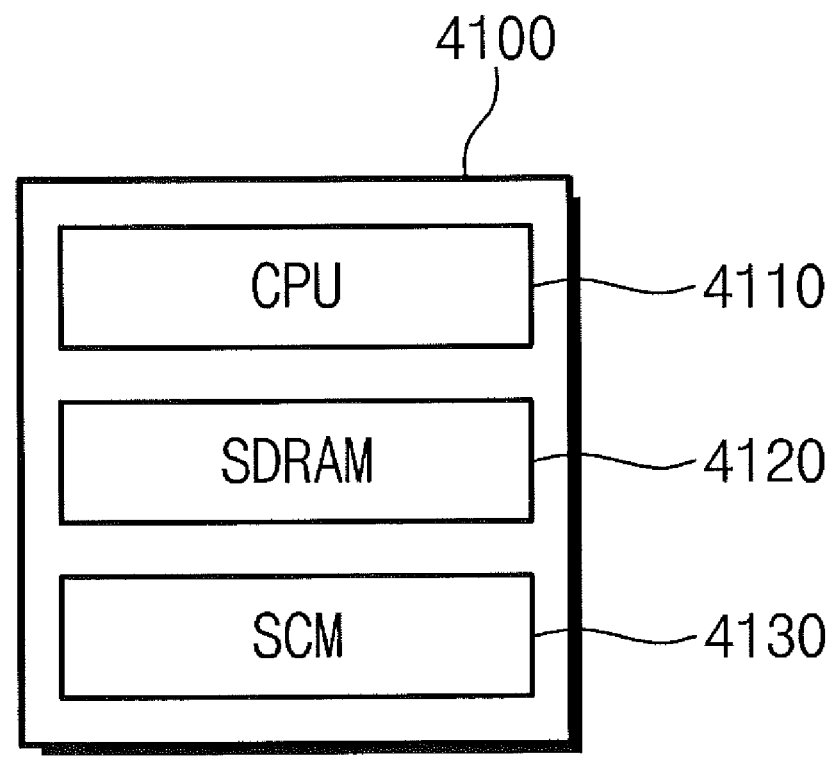

FIG. 38 illustrates an exemplary configuration of a memory system 4100 in which a storage class memory (SCM) is used instead of a storage class memory. As illustrated, the memory system 4100 includes a CPU 4110, an SDRAM 4120, and an SCM 4130 used instead of a flash memory.

In the memory system 4100, data access speed of the SCM 4130 is higher than that of a flash memory. For example, under a PC environment where the CPU 4110 runs at 4 GHz, data access speed of a PRAM which is a kind of the SCM 4130 is about 32 times higher than that of a flash memory. Thus, the memory system 4100 equipped with the SCM 4130 may attain higher-speed access gain than a memory system equipped with a flash memory.

Figure 39:
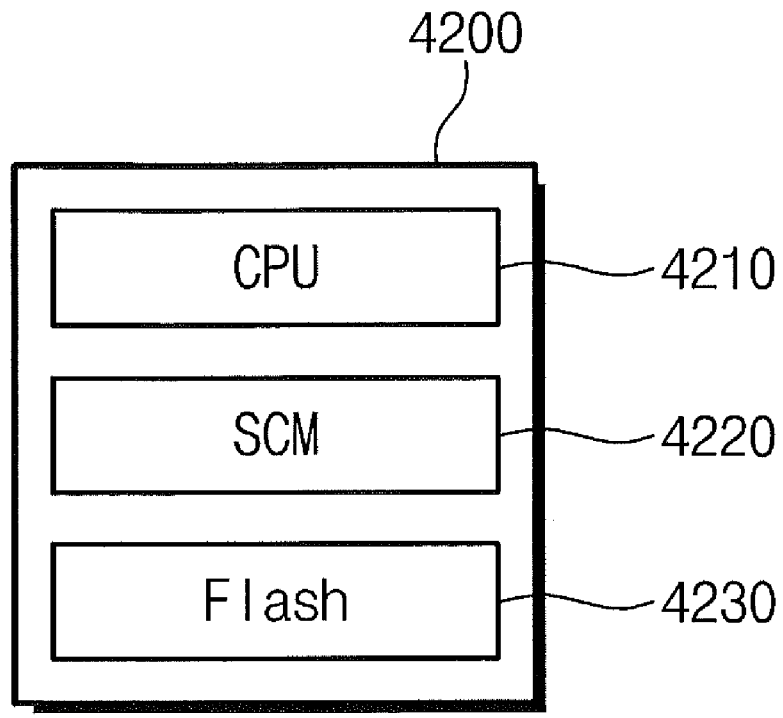

FIG. 39 illustrates an exemplary configuration of a memory system 4200 in which an SCM is used instead of an SDRAM. As illustrated, the memory system 4200 includes a CPU 4210, an SCM 4220, and a flash memory 4230. The SCM 4130 is used as a main memory instead of an SDRAM.

In the memory system 4200, power dissipation of the SCM 4220 is lower than that of an SDRAM. Energy dissipated by a main memory of a computer system amounts to about 40 percent of total energy. Therefore, many efforts have been intensively made to reduce power dissipation of a main memory. An SCM may reduce dynamic energy dissipation to an average of about 53 percent and reduce energy dissipation caused by power leakage to an average of about 73 percent. As a result, the memory system 4200 equipped with the SCM 4220 may allow power dissipation to be reduced more than a memory system equipped with an SDRAM.

Figure 40:
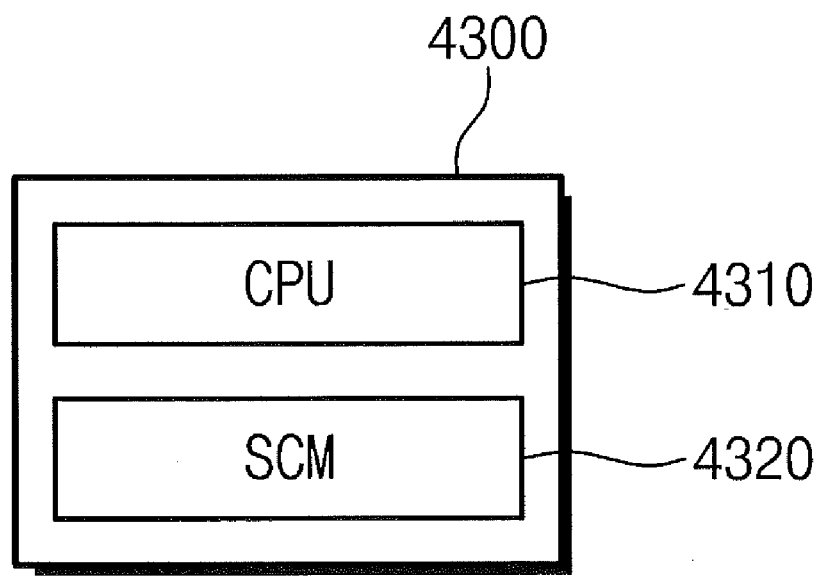

FIG. 40 illustrates an exemplary configuration of a memory system 4300 in which an SCM is substituted for an SDRAM as well as a flash memory. As illustrated, the memory system 4300 includes a CPU 4310 and an SCM 4320. The SCM 4320 is used as a main memory instated of an SDRAM and as a data storage memory instead of a flash memory. This memory system 4300 is advantageous in data access speed, low power, space utilization, and costs.

A variable resistance memory device according to an embodiment of the present invention can be applied to a server SSD. U.S Patent Publication Nos. 2008/0256292, 2008/0256183, and 2008/0168304 disclose in FIG. 1A and the corresponding detailed description thereof that a solid-state storage 110 includes a PRAM, a flash, an MRAM, an NRAM, and a DRAM and that a solid-state storage device 102 includes a solid-state storage controller 104 and a solid-state storage 110. In addition, U.S Patent Publication Nos. 2008/0256292, 2008/0256183, and 2008/0168304 disclose a solid-state memory and a controller, which process the speed of a high-speed interface, and a redundant array of independent drives (RAIDs) in a solid-state device, and are incorporated by reference herein in their entirety.

Meanwhile, U.S. Pat. No. 7,245,605 (relating to write verify), U.S. Pat. No. 6,982,913 (relating to 2-step precharge) and U.S. Pat. No. 7,215,592 (relating to global bitline), U.S. Patent Publication Nos. 2007/0236987 and 2008/0123389, and U.S. patent application Ser. No. 12/461,036, and U.S. patent application No. 2010/0027326 (which claims priority from Korean Patent Application No. 2009-0066990) are incorporated and combined in the present specification.

While the present invention has been particularly shown and described with reference to exemplary embodiments thereof, it will be understood by those of ordinary skill in the art that various changes in form and detail may be made therein without departing from the spirit and scope of the present invention as defined by the following claims. Therefore, it is to be understood that the above-described embodiments have been provided only in a descriptive sense, and should not be construed as placing any limitation on the scope of the invention.

What is claimed is:

1. A nonvolatile memory device comprising:
    a plurality of memory banks, each of which operates independently and includes a plurality of resistance memory cells, each cell including a variable resistive element having a resistance varying depending on stored data;
    a plurality of global bit lines, each global bit line being shared by the plurality of memory banks;
    a temperature compensation circuit including one or more reference cells; and
    a data read circuit which is electrically connected to the plurality of global bit lines and performs a read operation by supplying at least one of the resistance memory cells with a current varying according to resistances of the reference cells.

2. The device of claim 1, wherein the resistance memory cells are m bit-level cells ("m" is a natural number), and each of the reference cells has a resistance corresponding to any one of $2^m-1$ second resistance distributions.

3. The device of claim 2, wherein the number of the one or more reference cells is $2^m-1$,
    the $2^m-1$ reference cells form a reference set, and the $2^m-1$ reference cells included in the same reference set have resistances corresponding to different resistance distributions, respectively.

4. The device of claim 3, wherein each of the memory banks is divided into a plurality of memory blocks and the reference set is arranged in each of the memory banks or each of the memory blocks.

5. The device of claim 1, wherein the temperature compensation circuit includes a reference write driver for supplying a write current to the reference cells to determine resistances of the reference cells, and a reference read circuit for supplying a read current to the reference cells to read resistances of the reference cells.

6. The device of claim 5, further comprising a write driver which determines resistances of the resistance memory cells by supplying a write current to the resistance memory cells,
wherein the reference write driver is a replica circuit of the write driver, and the reference read circuit is a replica circuit of the data read circuit.

7. The device of claim 5, wherein the temperature compensation circuit includes:
an output node for outputting a compensation control signal;
the reference cells connected to the output node;
the reference write driver connected to the output node; and
the reference read circuit connected to the output node.

8. The device of claim 7, wherein the reference read circuit includes:
first and second transistors connected in series between a step-up voltage source and the output node; and
a resistor string connected in series between the step-up voltage source and a ground voltage source to generate a first voltage that is applied to a gate of the first transistor and a second voltage that is applied to a gate of the second transistor.

9. The device of claim 5, wherein each of the reference cells includes a variable resistance element and an access element,
the write current passes through both the variable resistance element and the access element, and
the read current passes through the variable resistance element and selectively passes through the access element.

10. A memory system comprising the nonvolatile memory device of claim 1.

11. A nonvolatile memory device comprising:
first and second memory banks, each including first and second resistance memory cells, each having a variable resistive element having a resistance varying depending on stored data;
write bit lines which are electrically connected to the first and second resistance memory cells and used in a write operation;
read bit lines which are electrically connected to the first and second resistance memory cells and used in a read operation;
a data write circuit which is electrically connected to the write bit lines and performs a write operation by supplying the first resistance memory cell with a current;
a temperature compensation circuit including one or more reference cells; and
a data read circuit which is electrically connected to the read bit lines and performs a read operation by supplying the second resistance memory cell with a current varying according to resistances of the reference cells while data are written in the first resistance memory cell.

12. The device of claim 11, wherein each of the memory banks is divided into a plurality of memory blocks and the reference cells are arranged in each of the memory banks or each of the memory blocks.

13. The device of claim 11, wherein the temperature compensation circuit includes a reference write driver for supplying a write current to the reference cells to determine resistances of the reference cells, and a reference read circuit for supplying a read current to the reference cells to read resistances of the reference cells.

14. The device of claim 13, further comprising a write driver which determines resistances of the resistance memory cells by supplying a write current to the resistance memory cells,
wherein the reference write driver is a replica circuit of the write driver, and the reference read circuit is a replica circuit of the data read circuit.

15. The device of claim 13, wherein the temperature compensation circuit includes:
an output node for outputting a compensation control signal;
the reference cells connected to the output node;
the reference write driver connected to the output node; and
the reference read circuit connected to the output node.

16. A nonvolatile memory device comprising:
a memory cell array including a plurality of resistance memory cells, each cell having a variable resistive element having a resistance varying depending on stored data;
a plurality of local bit lines connected to the plurality of resistance memory cells;
a read global bit line and a write global bit line formed across the memory cell array;
first and second read column select circuits respectively arranged at both sides of the memory cell array to selectively connect the read global bit line with the local bit lines;
first and second write column select circuits respectively arranged at both sides of the memory cell array to selectively connect the write global bit line with the local bit lines;
a temperature compensation circuit including one or more reference cells; and
a data read circuit which is electrically connected to the read global bit line and performs a read operation by supplying at least one of the resistance memory cells with a current varying according to resistances of the reference cells.

17. The device of claim 16, wherein the first read column select circuit is arranged at one side of the memory cell array to selectively connect any one of odd numbered lines of the local bit lines with the read global bit line, and
the second read column select circuit is arranged at the other side of the memory cell array to selectively connect any one of even numbered lines of the plurality of local bit lines with the read global bit line.

18. The device of claim 16, wherein the first write column select circuit is arranged at one side of the memory cell array to selectively connect any one of odd numbered lines of the plurality of local bit lines with the write global bit line, and
the second write column select circuit is arranged at the other side of the memory cell array to selectively connect any one of even numbered lines of the local bit lines with the write global bit line.

19. The device of claim 16, wherein the write global bit line and the read global bit line are shared by the memory banks.

* * * * *